(12) United States Patent
Yamazaki

(10) Patent No.: US 10,019,025 B2
(45) Date of Patent: Jul. 10, 2018

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/219,453

(22) Filed: Jul. 26, 2016

(65) Prior Publication Data

US 2017/0033109 A1    Feb. 2, 2017

(30) Foreign Application Priority Data

Jul. 30, 2015 (JP) ................. 2015-150339

(51) Int. Cl.
*H01L 27/105* (2006.01)
*G05F 3/16* (2006.01)
(Continued)

(52) U.S. Cl.
CPC ............ *G05F 3/16* (2013.01); *G11C 11/24* (2013.01); *H01L 27/1082* (2013.01);
(Continued)

(58) Field of Classification Search
CPC ............ H01L 27/1052; H01L 27/1207; H01L 27/1225; H01L 27/124; H01L 27/1255; H01L 27/127; H01L 29/24; H01L 29/7869
(Continued)

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Cuong Q Nguyen
*Assistant Examiner* — Tong-Ho Kim
(74) *Attorney, Agent, or Firm* — Fish & Richardson P.C.

(57) ABSTRACT

A semiconductor device or a memory device with low power consumption and a small area is provided. The semiconductor device includes a sense amplifier and a memory cell. The memory cell is provided over the sense amplifier. The sense amplifier includes a first transistor and a second transistor. The memory cell includes a third transistor and a capacitor. The first transistor is a p-channel transistor. The second transistor and the third transistor each include an oxide semiconductor in a channel formation region. The third transistor is preferably provided over the capacitor.

20 Claims, 33 Drawing Sheets

(51) Int. Cl.
*H01L 29/24* (2006.01)
*H01L 27/12* (2006.01)
*H01L 29/786* (2006.01)
*G11C 11/24* (2006.01)
*H01L 27/108* (2006.01)

(52) U.S. Cl.
CPC .. *H01L 27/10858* (2013.01); *H01L 27/10873* (2013.01); *H01L 27/124* (2013.01); *H01L 27/127* (2013.01); *H01L 27/1225* (2013.01); *H01L 27/1255* (2013.01); *H01L 29/7869* (2013.01)

(58) Field of Classification Search
USPC .................................................. 257/43, 296
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,455,868 B2 | 6/2013 | Yamazaki et al. |
| 8,927,351 B2 | 1/2015 | Ichijo et al. |
| 9,230,615 B2 | 1/2016 | Takemura |
| 9,281,410 B2 | 3/2016 | Okazaki et al. |
| 9,349,735 B2 | 5/2016 | Yamazaki et al. |
| 9,384,976 B2 | 7/2016 | Ichijo et al. |
| 9,478,276 B2 | 10/2016 | Onuki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0114945 A1* | 5/2011 | Yamazaki ........... H01L 21/8221 257/43 |
| 2012/0001243 A1* | 1/2012 | Kato ................... H01L 27/0688 257/296 |
| 2012/0313152 A1* | 12/2012 | Yokoi ............... H01L 21/02554 257/288 |
| 2013/0155790 A1 | 6/2013 | Atsumi |
| 2015/0108470 A1* | 4/2015 | Yamazaki ......... H01L 29/42384 257/43 |
| 2015/0294693 A1 | 10/2015 | Onuki et al. |
| 2015/0325282 A1 | 11/2015 | Kato et al. |
| 2016/0104521 A1 | 4/2016 | Onuki et al. |
| 2016/0260718 A1 | 9/2016 | Yamazaki et al. |
| 2016/0276487 A1 | 9/2016 | Yamazaki et al. |
| 2016/0336055 A1* | 11/2016 | Kato ....................... G11C 11/24 |
| 2017/0033111 A1 | 2/2017 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |

(56) References Cited

FOREIGN PATENT DOCUMENTS

| JP | 2002-289859 A | 10/2002 |
|---|---|---|
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-151383 A | 8/2011 |
| JP | 2013-171895 A | 9/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Matrerials), 2006, vol. 18, No. 3, pp. 339-342.

Kikuchi.H et al., "39.1:Invited Paper:Optically Isotropic Nano-Structured Liquid Crystal Composited for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in The In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW'06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielecrtric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184- 187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium of Technical Papers, May 20, 2009, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

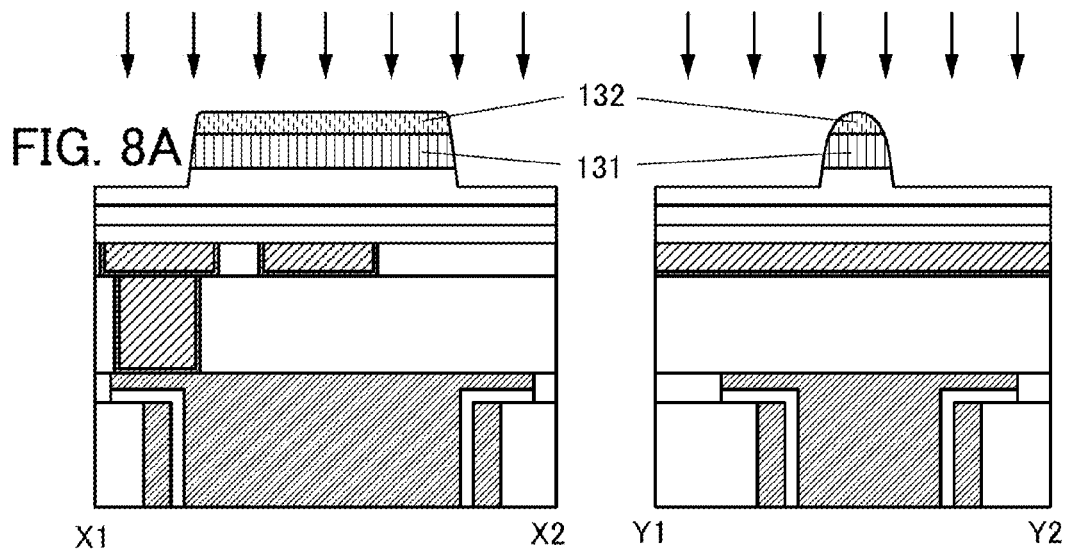
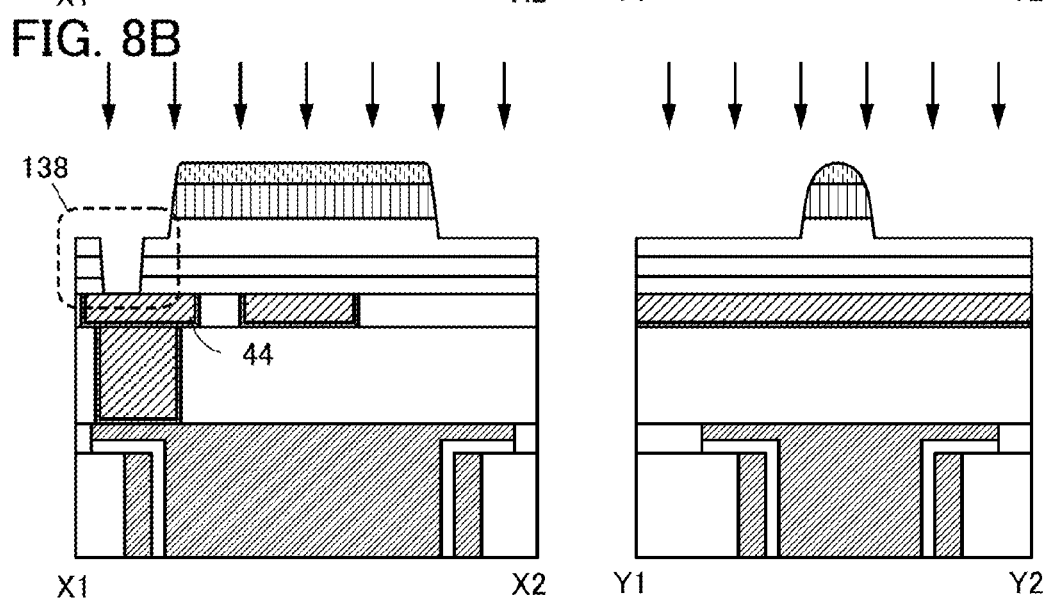
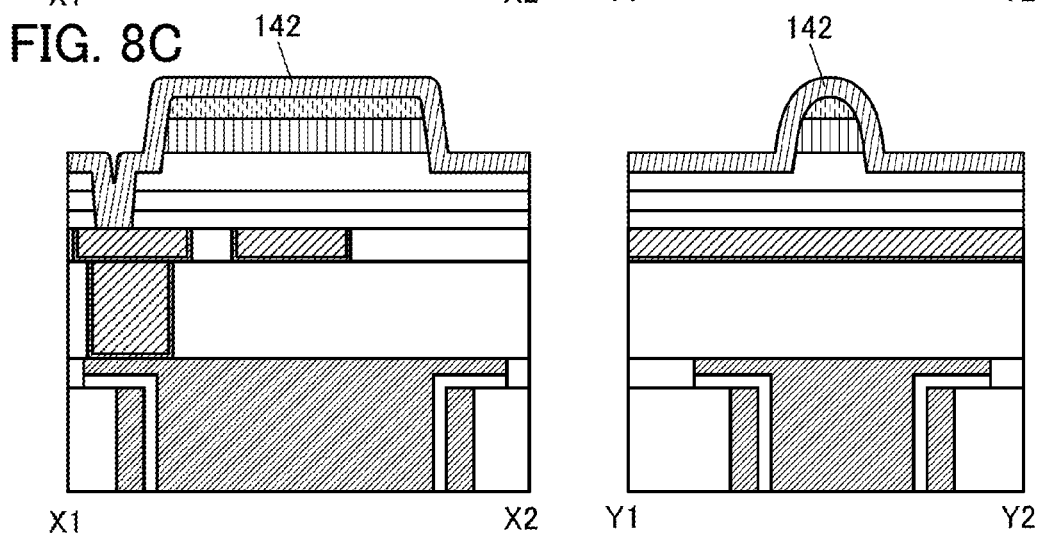

FIG. 28A  out-of-plane method CAAC-OS
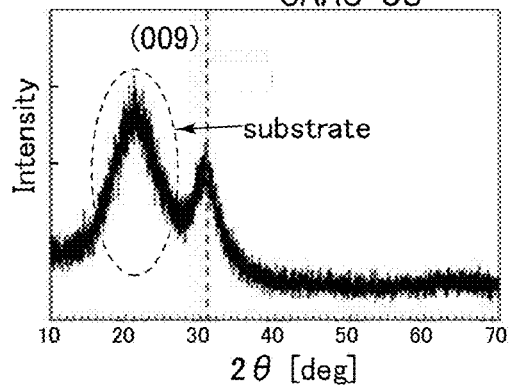
FIG. 28B
in-plane method φ scan
CAAC-OS
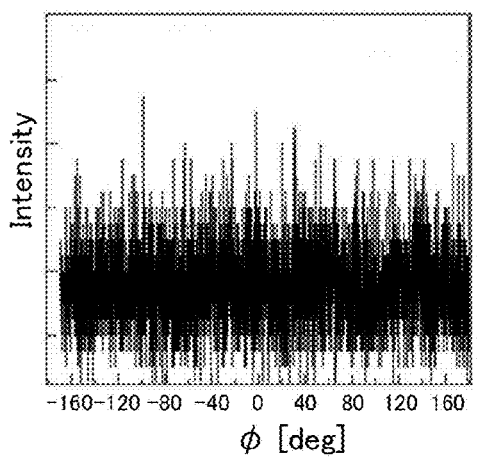
FIG. 28C
in-plane method φ scan
single crystal OS
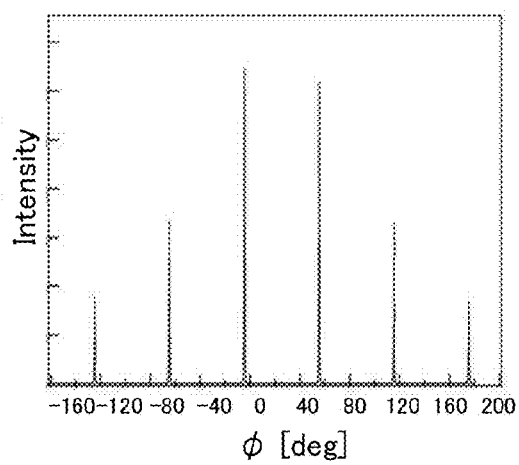
FIG. 28D
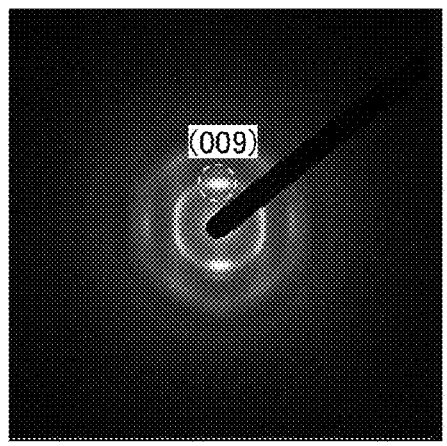
FIG. 28E
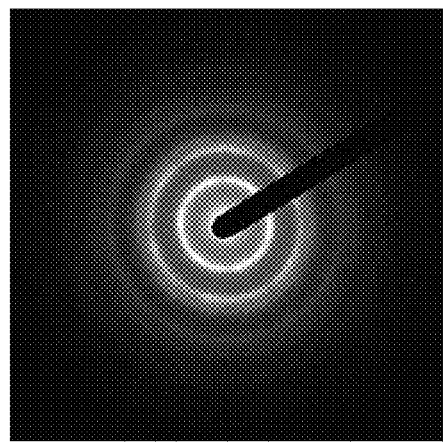

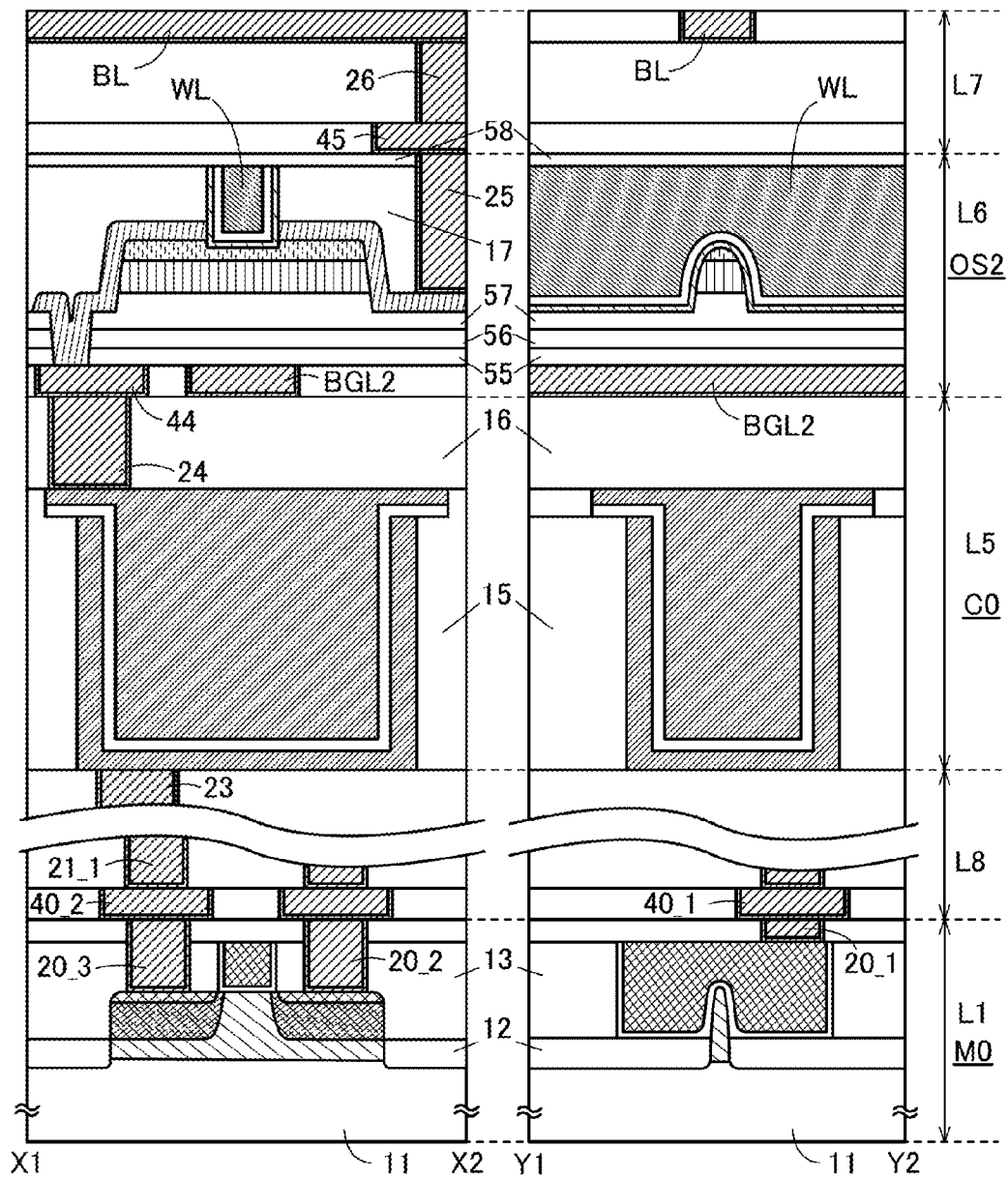

SEMICONDUCTOR DEVICE AND ELECTRONIC DEVICE

BACKGROUND OF THE INVENTION

1. Field of the Invention

One embodiment of the present invention relates to a semiconductor device or a memory device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. One embodiment of the present invention relates to a semiconductor device, a display device, a light-emitting device, a power storage device, a memory device, a circuit board, an electronic device, a driving method thereof, or a manufacturing method thereof.

2. Description of the Related Art

A dynamic random access memory (DRAM) stores data by supply of electric charge to a capacitor. Thus, the off-state current of a transistor for controlling the supply of electric charge to the capacitor is preferably small. This is because the smaller the off-state current of the transistor is, the longer the data holding period can be; thus, the frequency of refresh operations can be reduced. Patent Document 1 discloses a semiconductor device that can hold stored content for a long time by using a transistor including an oxide semiconductor film and having extremely small off-state current.

REFERENCE

Patent Document

[Patent Document 1] Japanese Published Patent Application No. 2011-151383

SUMMARY OF THE INVENTION

An object of one embodiment of the present invention is to provide a memory device with low power consumption. Another object of one embodiment of the present invention is to provide a memory device with a small area. Another object of one embodiment of the present invention is to provide a novel memory device.

Another object of one embodiment of the present invention is to provide a semiconductor device with low power consumption. Another object of one embodiment of the present invention is to provide a semiconductor device with a small area. Another object of one embodiment of the present invention is to provide a novel semiconductor device.

Note that the description of a plurality of objects does not mutually preclude the existence. One embodiment of the present invention does not necessarily achieve all the objects listed above. Objects other than those listed above are apparent from the description of the specification, drawings, claims, and the like, and such objects could be an object of one embodiment of the present invention.

One embodiment of the present invention is a semiconductor device including a first circuit and a second circuit. The first circuit is configured to store data. The second circuit is configured to amplify a potential of the data. The first circuit is over the second circuit. The second circuit includes a first transistor and a second transistor. The first circuit includes a third transistor and a capacitor. The first transistor is preferably a p-channel transistor. The second transistor and the third transistor preferably each include an oxide semiconductor in a channel formation region. The third transistor is preferably over the capacitor.

Another embodiment of the present invention is an electronic device including the semiconductor device of the above embodiment and at least one of a microphone, a speaker, a display portion, and an operation key.

Another embodiment of the present invention is a method for manufacturing a memory cell including a transistor and a capacitor. The method includes the steps of forming a wiring electrically connected to the capacitor; forming an insulator over the wiring; forming an oxide semiconductor over the insulator; performing high-density plasma treatment on the oxide semiconductor; forming an opening in the insulator so as to expose the wiring; and forming a conductor in contact with the oxide semiconductor and in contact with the wiring in the opening. The oxide semiconductor serves as a semiconductor layer of the transistor. The conductor serves as a source electrode or a drain electrode of the transistor.

Another embodiment of the present invention is a method for manufacturing a memory cell including a transistor and a capacitor. The method includes the steps of forming a wiring electrically connected to the capacitor; forming an insulator over the wiring; forming an oxide semiconductor over the insulator; forming an opening in the insulator so as to expose the wiring; performing high-density plasma treatment on the oxide semiconductor; and forming a conductor in contact with the oxide semiconductor and in contact with the wiring in the opening. The oxide semiconductor serves as a semiconductor layer of the transistor. The conductor serves as a source electrode or a drain electrode of the transistor.

Another embodiment of the present invention is a method for manufacturing a semiconductor device including a sense amplifier and a memory cell. The sense amplifier includes a first transistor and a second transistor. The memory cell includes a third transistor and a capacitor. The method includes the steps of forming the second transistor over the first transistor; forming the capacitor over the second transistor; forming a wiring electrically connected to the capacitor; forming an insulator over the wiring; forming an oxide semiconductor over the insulator; performing high-density plasma treatment on the oxide semiconductor; forming an opening in the insulator so as to expose the wiring; and forming a conductor in contact with the oxide semiconductor and in contact with the wiring in the opening. The oxide semiconductor serves as a semiconductor layer of the third transistor. The conductor serves as a source electrode or a drain electrode of the third transistor.

In the above embodiment, the first transistor is preferably a p-channel transistor. A semiconductor layer of the second transistor preferably includes an oxide semiconductor.

Another embodiment of the present invention is a method for manufacturing a semiconductor device including a sense amplifier and a memory cell. The sense amplifier includes a first transistor and a second transistor. The memory cell includes a third transistor and a capacitor. The method includes the steps of forming the second transistor over the first transistor; forming the capacitor over the second transistor; forming a wiring electrically connected to the capacitor; forming an insulator over the wiring; forming an oxide semiconductor over the insulator; forming an opening in the insulator so as to expose the wiring; performing high-density plasma treatment on the oxide semiconductor; and forming a conductor in contact with the oxide semiconductor and in contact with the wiring in the opening. The oxide semiconductor serves as a semiconductor layer of the third transistor. The conductor serves as a source electrode or a drain electrode of the third transistor.

In the above embodiment, the first transistor is preferably a p-channel transistor. A semiconductor layer of the second transistor preferably includes an oxide semiconductor.

According to one embodiment of the present invention, a memory device with low power consumption can be provided. According to one embodiment of the present invention, a memory device with a small area can be provided. According to one embodiment of the present invention, a novel memory device can be provided.

According to one embodiment of the present invention, a semiconductor device with low power consumption can be provided. According to one embodiment of the present invention, a semiconductor device with a small area can be provided. According to one embodiment of the present invention, a novel semiconductor device can be provided.

Note that the description of these effects does not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

FIGS. 8A to 8C show cross-sectional views illustrating a method for manufacturing a semiconductor device.

FIGS. 28A to 28E show structural analysis of a CAAC-OS and a single crystal oxide semiconductor by XRD and selected-area electron diffraction patterns of a CAAC-OS.

FIG. 33 shows cross-sectional views illustrating a structure example of a semiconductor device.

DETAILED DESCRIPTION OF THE INVENTION

Figure 1:
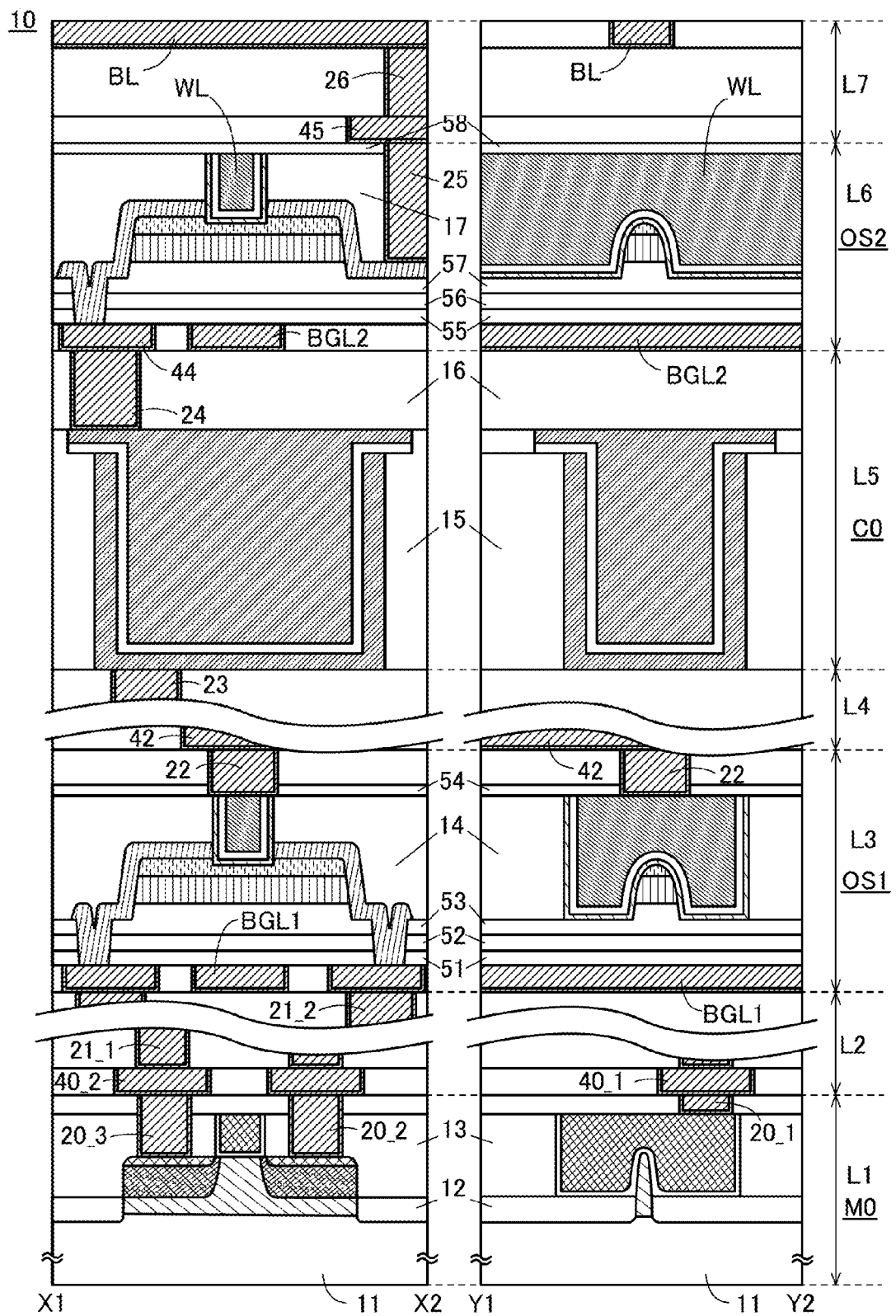
FIG. 1 shows cross-sectional views illustrating a structure example of a semiconductor device.

Embodiments will be described below with reference to drawings. The embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

Furthermore, in the present specification, any of the embodiments below can be combined as appropriate. In the case where some structural examples are given in one embodiment, any of the structure examples can be combined as appropriate.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Unless otherwise specified, an on-state current in this specification refers to a drain current of a transistor in the on state. Unless otherwise specified, the on state of an n-channel transistor means that the voltage difference between its gate and source ($V_{gs}$) is higher than or equal to the threshold voltage ($V_{th}$), and the on state of a p-channel transistor means that $V_{gs}$ is lower than or equal to $V_{th}$. For example, the on-state current of an n-channel transistor refers to a drain current that flows when $V_{gs}$ is higher than or equal to $V_{th}$. The on-state current of a transistor depends on voltage ($V_{ds}$) between its drain and source in some cases.

Unless otherwise specified, the off-state current in this specification refers to a drain current of a transistor in the off state. Unless otherwise specified, the off state of an n-channel transistor means that $V_{gs}$ is lower than $V_{th}$, and the off state of a p-channel transistor means that $V_{gs}$ is higher than $V_{th}$. For example, the off-state current of an n-channel transistor refers to a drain current that flows when $V_{gs}$ is lower than $V_{th}$. The off-state current of a transistor depends on $V_{gs}$ in some cases. Thus, "the off-state current of a transistor is lower than $10^{-21}$ A" may mean there is $V_{gs}$ at which the off-state current of the transistor is lower than $10^{-21}$ A.

The off-state current of a transistor depends on $V_{ds}$ in some cases. Unless otherwise specified, the off-state current in this specification may be an off-state current at $V_{ds}$ whose absolute value is 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ used in a semiconductor device or the like including the transistor.

Embodiment 1

In this embodiment, structure examples of a semiconductor device of one embodiment of the present invention will be described with reference to FIG. 1, FIGS. 2A to 2C, FIG. 3, FIGS. 4A and 4B, FIGS. 5A and 5B, FIG. 6, FIGS. 7A to 7C, FIGS. 8A to 8C, FIGS. 9A and 9B, FIGS. 10A and 10B, FIGS. 11A and 11B, and FIG. 12.

<<Structure Example 1 of Semiconductor Device>>

In FIG. 1, cross-sectional views of a semiconductor device 10 of one embodiment of the present invention are illustrated. The semiconductor device 10 illustrated in FIG. 1 includes a transistor M0, a transistor OS1, a capacitor C0, and a transistor OS2. A cross-sectional view of the semiconductor device 10 in the channel length direction of the transistors M0, OS1, and OS2 is illustrated on the left side of FIG. 1, and a cross-sectional view of the semiconductor device 10 in the channel width direction of the transistors M0, OS1, and OS2 is illustrated on the right side of FIG. 1.

Figure 13A:
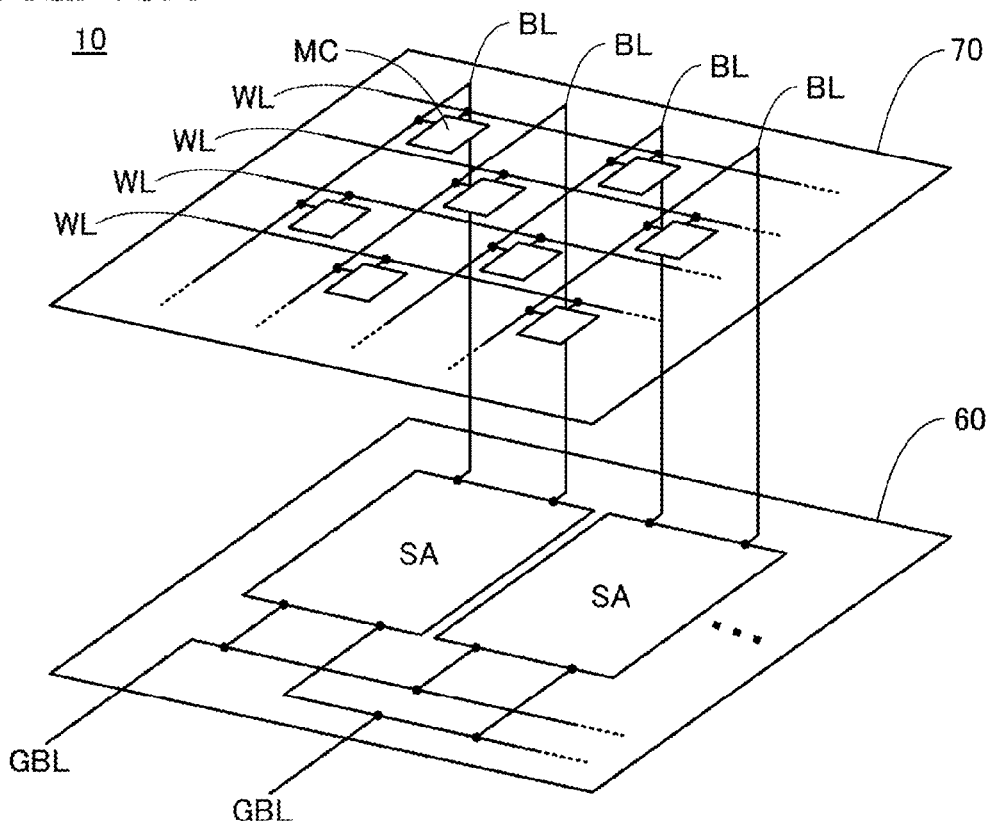
FIGS. 13A to 13C are circuit diagrams illustrating a structure example of a semiconductor device.

The semiconductor device 10 includes a plurality of memory cells MC and sense amplifiers SA electrically connected to the plurality of memory cells MC (see FIG. 13A).

Figure 13B:
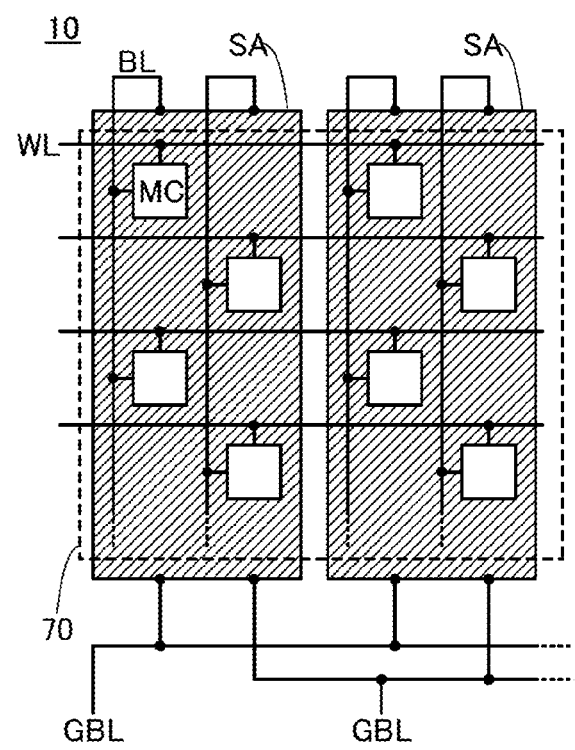
Figure 13C:
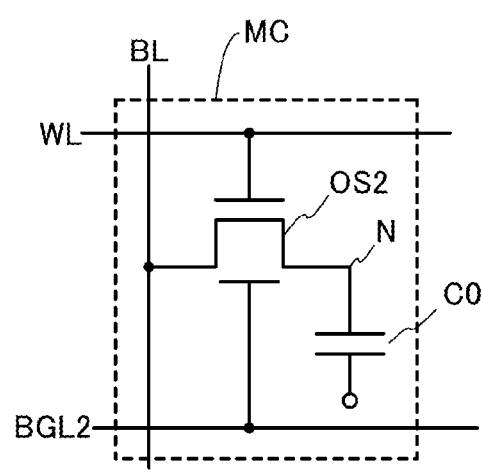

The memory cell MC includes the transistor OS2 and the capacitor C0 (see FIG. 13C). The memory cell MC is a volatile memory that can store data by holding charge in the capacitor C0.

A wirings WL has a function of supplying a signal for controlling the on/off state of the transistor OS2. That is, the wiring WL serves as a word line of the memory cell MC. A wiring BL has a function of writing charge to the capacitor C0 through the transistor OS2. That is, the wiring BL serves as a bit line of the memory cell MC. By turning off the transistor OS2 after charge is written to the capacitor C0, the charge can be held in the memory cell MC.

A wiring BGL2 has a function of applying a voltage to a second gate of the transistor OS2. The threshold voltage of the transistor OS2 can be controlled by the voltage applied to the second gate.

The memory cell MC is electrically connected to the sense amplifier SA through the wiring BL. The sense amplifier SA has a function of amplifying the potential of data stored in the memory cell MC and outputting the amplified potential. Even in the case where a potential read from the memory cell MC is extremely low, the read potential is amplified by the sense amplifier SA; thus, data reading of the semiconductor device 10 can be surely performed.

The memory cells MC and the sense amplifiers SA are preferably formed in different layers (see FIG. 13A). In particular, the memory cells MC are preferably formed in a layer over the sense amplifiers SA. At least one memory cell MC is preferably positioned so as to overlap with the sense amplifier SA, in which case the area of the semiconductor device 10 can be smaller than that when the memory cells MC and the sense amplifiers SA are positioned in the same layer. Accordingly, the storage capacity per unit area of the semiconductor device 10 can be increased. Note that the details of the circuit configuration of the semiconductor device 10 will be described later in Embodiment 2.

With reference to FIG. 1 again, the semiconductor device 10 will be described.

The semiconductor device 10 illustrated in FIG. 1 includes a layer L1, a layer L2, a layer L3, a layer L4, a layer L5, a layer L6, and a layer L7 which are stacked in this order from the bottom.

The layer L1 includes the transistor M0, a substrate 11, an element isolation layer 12, an insulator 13, a plug 20_1, a plug 20_2, a plug 20_3, and the like.

The layer L2 includes a wiring 40_1, a wiring 40_2, a plug 21_1, a plug 21_2, and the like.

The layer L3 includes the transistor OS1, a wiring BGL1, an insulator 51, an insulator 52, an insulator 53, an insulator 14, an insulator 54, a plug 22, and the like.

The layer L4 includes a wiring 42, a plug 23, and the like.

The layer L5 includes the capacitor C0, an insulator 15, an insulator 16, a plug 24, and the like The layer L6 includes the transistor OS2, an insulator 55, an insulator 56, an insulator 57, an insulator 17, an insulator 58, the wiring WL, the wiring BGL2, a wiring 44, a plug 25, and the like.

The layer L7 includes a wiring 45, the wiring BL, a plug 26, and the like.

The wirings and the plugs illustrated in FIG. 1 each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the wirings and the plugs are preferably formed using a low-resistance conductive material such as aluminum or copper. The wirings and the plugs are more preferably formed using a Cu—Mn alloy, in which case manganese oxide formed at the interface with an insulator containing oxygen has a function of preventing Cu diffusion.

Alternatively, the wirings and the plugs illustrated in FIG. 1 may be formed using a transparent conductive material containing indium oxide, tin oxide, or zinc oxide. As the transparent conductive material, for example, indium oxide, indium tin oxide, indium zinc oxide, zinc oxide, zinc oxide to which gallium is added, or the like can be used.

Alternatively, the wirings and the plugs illustrated in FIG. 1 may have a layered structure of any of the above metals and any of the above transparent conductive materials.

The sense amplifier SA is preferably formed using the transistor M0 and the transistor OS1. For example, in the sense amplifier SA, one of the transistor M0 and the transistor OS1 may be a p-channel transistor, and the other of the transistor M0 and the transistor OS1 may be an n-channel transistor. By forming the sense amplifier SA using two kinds of transistors provided in different layers, the occupied area of the sense amplifier SA can be small.

The memory cell MC is preferably formed using the transistor OS2 and the capacitor C0. The transistor OS2 and the capacitor C0 are preferably provided in different layers. In particular, the transistor OS2 is preferably provided in a layer over the capacitor C0, as illustrated in FIG. 1. With such a structure, the wiring BL serving as the bit line can be positioned apart from the capacitor C0. As a result, the parasitic capacitance generated between the wiring BL and the capacitor C0 can be reduced; thus, the operation speed of the semiconductor device 10 can be improved. Furthermore, noise due to the parasitic capacitance of the wiring BL can be reduced, and thus the malfunction of the semiconductor device 10 due to the noise can be reduced.

As illustrated in FIG. 1, the transistor OS2 and the capacitor C0 are preferably provided in layers different from layers in which the transistor OS1 and the transistor M0 that form the sense amplifier SA are provided. In particular, the transistor OS2 and the capacitor C0 are preferably in layers over the transistor OS1 and the transistor M0. With the above structure, the area of the semiconductor device 10 can be reduced. Accordingly, the storage capacity per unit area of the semiconductor device 10 can be increased.

In each of the transistor OS1 and the transistor OS2, a semiconductor having a wider band gap and lower intrinsic carrier density than silicon or the like is preferably used for a channel formation region. Such a transistor is suitable because off-state current can be extremely small.

As an example of the above transistor, a transistor including an oxide semiconductor in a channel formation region (hereinafter also referred to as OS transistor) can be given. In the case where an OS transistor is used as the transistor OS1, the sense amplifier SA can operate with lower power consumption. In the case where an OS transistor is used as the transistor OS2, charge written to the memory cell MC can be held for a long time and the frequency of refresh operations of the memory cell MC can be low. As a result, the power consumption of the semiconductor device 10 can be reduced.

It is known that an OS transistor favorably operates as an n-channel transistor. Therefore, in the case where an OS transistor is used as the transistor OS1, a p-channel transistor is preferably used as the transistor M0. With such a structure, a CMOS circuit can be formed with the transistor M0 and the transistor OS1.

In the semiconductor device 10, the off-state current of the transistor OS2 should be lower than that of the transistor M0 and that of the transistor OS1. Therefore, the transistor OS2 is preferably formed later than the transistor M0, the transistor OS1, and the capacitor C0. By forming the transistor OS2 later than other elements, process damage accumulated in the transistor OS2 can be little. As a result, an increase in the off-state current of the transistor OS2 due to the process damage can be prevented.

The components of the semiconductor device 10 will be described below with reference to FIGS. 2A to 2C, FIG. 3, FIGS. 4A and 4B, FIGS. 5A and 5B, and FIG. 6.

Figure 2A:
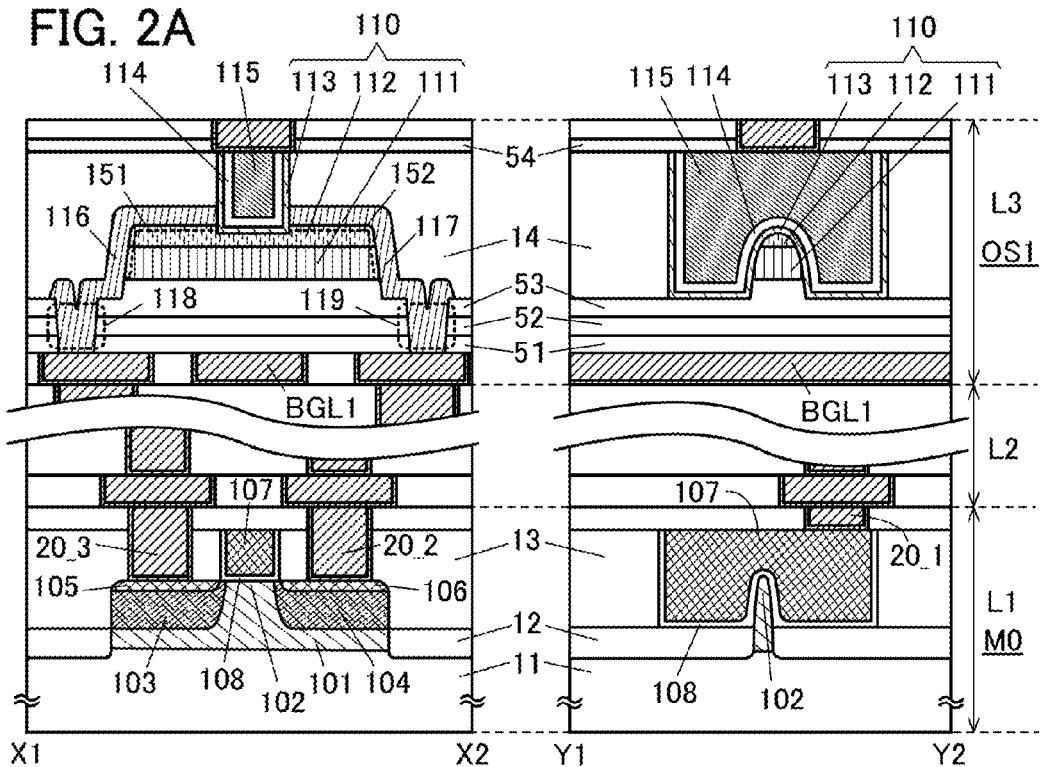
FIGS. 2A to 2C show cross-sectional views and top views illustrating a structure example of a semiconductor device.
Figure 2B:
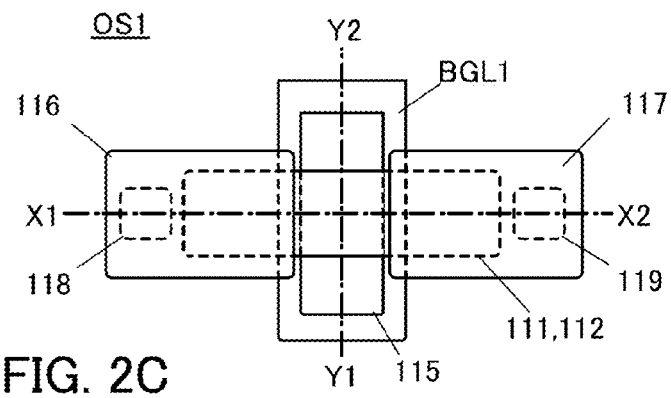
Figure 2C:
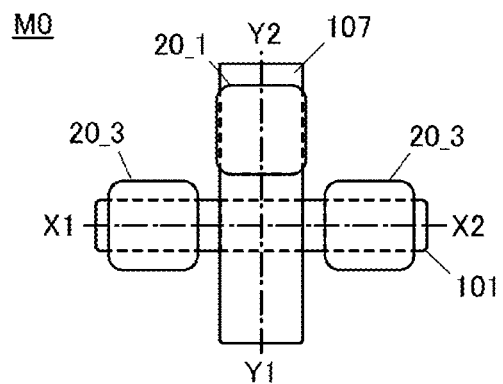

FIG. 2A illustrates the layers L1 to L3 in the cross-sectional views of FIG. 1. FIG. 2B is a top view of the transistor OS1, and FIG. 2C is a top view of the transistor M0. Note that for simplification of the drawings, some components are not illustrated in the top views in FIGS. 2B and 2C. A cross-sectional view taken along the dashed-dotted line X1-X2 in FIGS. 2B and 2C is illustrated on the left side of FIG. 2A, and a cross-sectional view taken along the dashed-dotted line Y1-Y2 in FIGS. 2B and 2C is illustrated on the right side of FIG. 2A. Note that the direction of the dashed-dotted line X1-X2 is also referred to as the channel length direction of the transistor OS1 or the transistor M0, and the direction of the dashed-dotted line Y1-Y2 is also referred to as the channel width direction of the transistor OS1 or the transistor M0.

<<Transistor M0>>

First, components of the transistor M0 will be described below. The transistor M0 is provided over the substrate 11, and is separated from an adjacent transistor by the element isolation layer 12. For the element isolation layer 12, silicon oxide, silicon oxynitride, silicon nitride oxide, silicon nitride, or the like can be used. Note that in this specification, an oxynitride refers to a compound that contains more oxygen than nitrogen, and a nitride oxide refers to a compound that contains more nitrogen than oxygen.

As the substrate 11, a single crystal semiconductor substrate or a polycrystalline semiconductor substrate of silicon or silicon carbide, a compound semiconductor substrate of silicon germanium, a silicon-on-insulator (SOI) substrate, or the like can be used. Alternatively, a glass substrate, a quartz substrate, a plastic substrate, a metal substrate, an attachment film, paper including a fibrous material, or a base film may be used as the substrate 11, for example. Alternatively, a semiconductor element may be formed using one substrate, and then transferred to another substrate.

Alternatively, a flexible substrate may be used as the substrate 11. As a method for providing a transistor over a flexible substrate, there is a method in which the transistor is formed over a non-flexible substrate and then the transistor is separated and transferred to the substrate 11 which is a flexible substrate. In that case, a separation layer is preferably provided between the non-flexible substrate and the transistor. As the substrate 11, a sheet, a film, or a foil containing a fiber may be used. The substrate 11 may have elasticity. The substrate 11 may have a property of returning to its original shape when bending or pulling is stopped. Alternatively, the substrate 11 may have a property of not returning to its original shape. The thickness of the substrate 11 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 11 has a small thickness, the weight of the semiconductor device can be reduced. When the substrate 11 has a small thickness, even in the case of using glass or the like, the substrate 11 may have elasticity or a property of returning to its original shape when bending or pulling is stopped. Therefore, an impact applied to the semiconductor device over the substrate 11, which is caused by dropping or the like, can be reduced. That is, a durable semiconductor device can be provided. For the substrate 11 which is a flexible substrate, for example, metal, an alloy, resin, glass, or fiber thereof can be used. The flexible substrate 11 preferably has a lower coefficient of linear expansion because deformation due to an environment is suppressed. The flexible substrate 11 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 11 because of its low coefficient of linear expansion.

In the example illustrated in FIG. 2A, a single crystal silicon wafer is used as the substrate 11.

The transistor M0 includes a channel formation region 102 and impurity regions 103 and 104 provided in a well 101; conductive regions 105 and 106 provided in contact with the impurity regions 103 and 104; a gate insulator 108 provided over the channel formation region 102; and a gate electrode 107 provided over the gate insulator 108. For the conductive regions 105 and 106, metal silicide or the like may be used.

In the transistor M0 in FIG. 2A, the channel formation region 102 has a projecting portion, and the gate insulator 108 and the gate electrode 107 are provided along side and top surfaces of the channel formation region 102. The transistor with such a shape is referred to as a FIN-type transistor. Although the projecting portion is formed by processing part of the semiconductor substrate in this embodiment, it may be formed by processing an SOI substrate.

In the example illustrated in FIG. 2A, a Si transistor is used as the transistor M0. The transistor M0 may be either an n-channel transistor or a p-channel transistor; an appropriate transistor is used depending on a circuit.

In the case where an OS transistor is used as the transistor OS1, a p-channel transistor is preferably used as the transistor M0. With such a structure, a CMOS circuit can be formed with the transistor M0 and the transistor OS1.

The insulator 13 serves as an interlayer insulator. In the case where a Si transistor is used as the transistor M0, the insulator 13 preferably contains hydrogen. When the insulator 13 contains hydrogen, dangling bonds of silicon can be terminated and thus the reliability of the transistor M0 can be improved. For the insulator 13, silicon oxide, silicon oxynitride, silicon nitride oxide, silicon nitride, or the like is preferably used.

Figure 3:
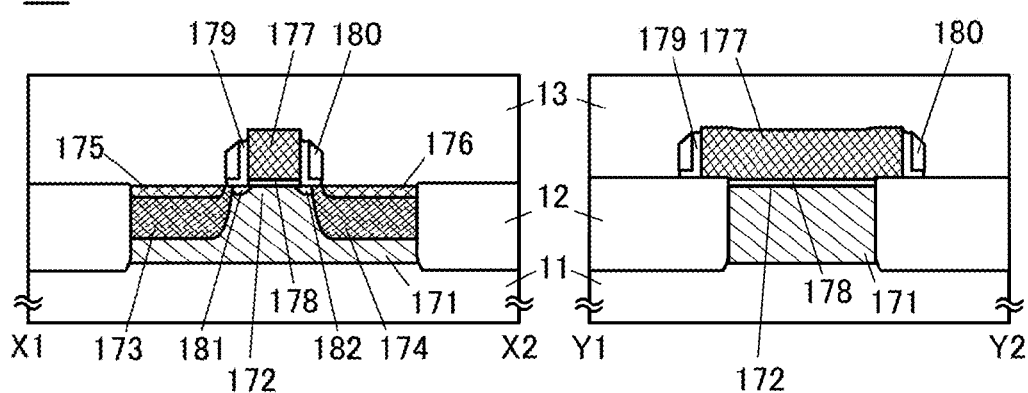
FIG. 3 shows cross-sectional views illustrating a structure example of a transistor.

Note that the transistor M0 may be a planar transistor. An example of such a case is illustrated in FIG. 3. The transistor M0 illustrated in FIG. 3 includes a channel formation region 172, low-concentration impurity regions 181 and 182, and high-concentration impurity regions 173 and 174 provided in a well 171; conductive regions 175 and 176 provided in contact with the impurity regions 173 and 174; a gate insulator 178 provided over the channel formation region 172; a gate electrode 177 provided over the gate insulator 178; and sidewall insulating layers 179 and 180 provided on sidewalls of the gate electrode 177. For the conductive regions 175 and 176, metal silicide or the like may be used.

<<Transistor OS1>>

With reference to FIGS. 2A to 2C again, the transistor OS1 will be described. In the following example, an OS transistor is used as the transistor OS1.

The transistor OS1 includes the wiring BGL1; the insulator 51 formed so as to cover the wiring BGL1; the insulator 52 over the insulator 51; the insulator 53 over the insulator 52; a stack in which an oxide semiconductor 111 and an oxide semiconductor 112 are stacked in this order over the insulator 53; a conductor 116 in contact with top and side surfaces of the oxide semiconductor 112; a conductor 117 in contact with top and side surfaces of the oxide semiconductor 112; the insulator 14 over the conductors 116 and 117; an oxide semiconductor 113 in contact with the oxide semiconductors 111 and 112, the conductors 116 and 117, and the insulator 14; an insulator 114 over the oxide semiconductor 113; a conductor 115 over the insulator 114; and the insulator 54 formed so as to cover the conductor 115. The oxide semiconductor 111, the oxide semiconductor 112, and the oxide semiconductor 113 are collectively called an oxide semiconductor 110.

The oxide semiconductor 112 serves as a channel of the transistor OS1.

In the transistor OS1, the oxide semiconductor 111 or the oxide semiconductor 113 includes a region through which electrons do not pass (a region which does not serve as a channel). For that reason, in the transistor OS1, the oxide semiconductor 111 or the oxide semiconductor 113 is also referred to as an insulator.

The oxide semiconductor 111 and the oxide semiconductor 112 include regions 151 and 152. The region 151 is formed in the vicinity of a region where the oxide semiconductors 111 and 112 are in contact with the conductor 116. The region 152 is formed in the vicinity of a region where the oxide semiconductors 111 and 112 are in contact with the conductor 117.

The regions 151 and 152 serve as low-resistance regions. Since the oxide semiconductors 111 and the 112 include the region 151, the contact resistance between the conductor 116 and the oxide semiconductor 111 and 112 can be reduced. Similarly, since the oxide semiconductors 111 and 112 include the region 152, the contact resistance between the conductor 117 and the oxide semiconductors 111 and 112 can be reduced.

The conductor 116 serves as one of a source electrode and a drain electrode of the transistor OS1. The conductor 117 serves as the other of the source electrode and the drain electrode of the transistor OS1.

The conductor 116 is connected to a wiring provided thereunder through an opening 118 provided in the insulators 51 to 53. The conductor 117 is connected to a wiring provided thereunder through an opening 119 provided in the insulators 51 to 53.

The conductor 115 serves as a first gate electrode of the transistor OS1.

The insulator 114 serves as a first gate insulator of the transistor OS1.

The wiring BGL1 serves as a second gate electrode of the transistor OS1. Note that in this specification, a second gate electrode is also referred to as a back gate.

The conductor 115 and the wiring BGL1 may be supplied with the same potential or different potentials. Note that the wiring BGL1 may be omitted in some cases.

The insulators 51 to 53 serve as a base insulator of the transistor OS1 and a second gate insulator of the transistor OS1.

The insulators 14 and 54 serve as a protective insulator or an interlayer insulator of the transistor OS1.

As illustrated in FIG. 2A, the side surface of the oxide semiconductor 112 is surrounded by the conductor 115. With this structure, the oxide semiconductor 112 can be electrically surrounded by an electric field of the conductor 115. Such a structure of a transistor in which a semiconductor is electrically surrounded by an electric field of a gate electrode is referred to as a surrounded channel (s-channel) structure. Therefore, a channel is formed in the entire oxide semiconductor 112 (bulk). In the s-channel structure, a large amount of current can flow between a source and a drain of a transistor, increasing the on-state current of the transistor.

The s-channel structure, because of its high on-state current, is suitable for a semiconductor device which requires a miniaturized transistor, such as a large-scale integrated (LSI) circuit. A semiconductor device including the miniaturized transistor can have a high integration degree and high density.

The conductor 115 serving as the gate electrode is formed in a self-aligned manner so as to fill an opening formed in the insulator 14. As illustrated in FIG. 2A, the conductor 115 and the conductor 116 preferably do not overlap with each other. Furthermore, the conductor 115 and the conductor 117 preferably do not overlap with each other. With such a structure, the parasitic capacitance generated between the conductor 115 and the conductor 116 or between the conductor 115 and the conductor 117 can be lower, and thus a reduction in the operation speed of the transistors OS1 can be prevented.

Figure 4A:
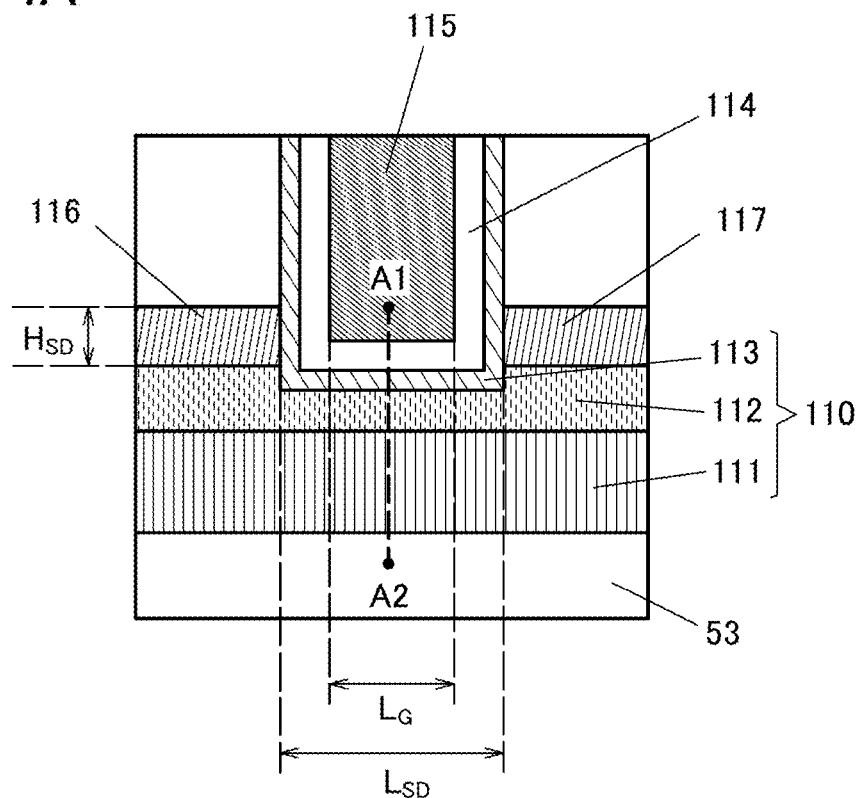
FIGS. 4A and 4B are a cross-sectional view of a transistor and an energy band diagram of the transistor.

FIG. 4A is an enlarged view of the center portion of the transistor OS1. In FIG. 4A, a width $L_G$ denotes the length of the bottom surface of the conductor 115, which faces and lies parallel to the top surface of the oxide semiconductor 112 with the insulator 114 and the oxide semiconductor 113 positioned therebetween. The width $L_G$ is the line width of the gate electrode. In FIG. 4A, a width $L_{SD}$ denotes the length between the conductors 116 and 117, i.e., the length between the source electrode and the drain electrode.

The width $L_{SD}$ is generally determined by the minimum feature size. As illustrated in FIG. 4A, the width $L_G$ is narrower than the width $L_{SD}$. This means that in the transistor OS1, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 4A, a height $H_{SD}$ denotes the thickness of the conductor 116 or the thickness of the conductor 117.

The thickness of the insulator 114 is preferably less than or equal to the height $H_{SD}$, in which case the electric field of the gate electrode can be applied to the entire channel formation region. The thickness of the insulator 114 is less than or equal to 30 nm, preferably less than or equal to 10 nm.

Components of the transistor OS1 will be described below.

<Oxide Semiconductor>

First, an oxide semiconductor that can be used as the oxide semiconductors 111 to 113 will be described.

The oxide semiconductor 112 is an oxide semiconductor containing indium (In), for example. The oxide semiconductor 112 can have high carrier mobility (electron mobility) by containing indium, for example. The oxide semiconductor 112 preferably contains an element M. The element M is preferably aluminum (Al), gallium (Ga), tin (Sn), or the like. Other elements that can be used as the element M are, for example, boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the oxide semiconductor 112 preferably contains zinc (Zn). When containing zinc, the oxide semiconductor is easily crystallized in some cases.

Note that the oxide semiconductor 112 is not limited to the oxide semiconductor containing indium. The oxide semiconductor 112 may be an oxide semiconductor that does not contain indium and contains at least one of zinc, gallium, and tin (e.g., a zinc tin oxide or a gallium tin oxide).

For the oxide semiconductor 112, an oxide semiconductor with a wide energy gap is used, for example. The energy gap of the oxide semiconductor 112 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide semiconductor 112 is preferably a CAAC-OS film which is described later.

The oxide semiconductors 111 and 113 include, for example, one or more, or two or more elements other than oxygen included in the oxide semiconductor 112. Since the oxide semiconductors 111 and 113 include one or more, or two or more elements other than oxygen included in the oxide semiconductor 112, an interface state is less likely to be formed at an interface between the oxide semiconductors 111 and 112 and an interface between the oxide semiconductors 112 and 113.

In the case of using an In-M-Zn oxide as the oxide semiconductor 111 or the oxide semiconductor 113, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the oxide semiconductor 111 or the oxide semiconductor 113 is formed by a sputtering method, a sputtering target with the following atomic ratio is preferably used. For example, In:M:Zn is preferably 1:2:4, 1:3:2, 1:3:4, 1:3:6, 1:3:8, 1:4:3, 1:4:4, 1:4:5, 1:4:6, 1:6:3, 1:6:4, 1:6:5, 1:6:6, 1:6:7, 1:6:8, 1:6:9, 1:10:1, or 1:5:6.

The oxide semiconductor 111 or the oxide semiconductor 113 does not necessarily contain indium in some cases. For example, the oxide semiconductor 111 or the oxide semiconductor 113 may be gallium oxide or an M-Zn oxide. In the case where the M-Zn oxide is formed by a sputtering method, a sputtering target with a composition of M:Zn=10:1 is preferably used.

In the case of using an In-M-Zn oxide as the oxide semiconductor 112, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the oxide semiconductor 112 is formed by a sputtering method, a sputtering target with the following atomic ratio is preferably used. For example, In:M:Zn is preferably 1:1:1, 1:1:1.2, 2:1:1.5, 2:1:2.3, 2:1:3, 3:1:2, 4:2:4.1, or 5:1:7. In particular, when a sputtering target with an atomic ratio of In to Ga and Zn of 4:2:4.1 is used, the atomic ratio of In to Ga and Zn in the oxide semiconductor 112 may be 4:2:3 or in the neighborhood of 4:2:3.

Figure 4B:
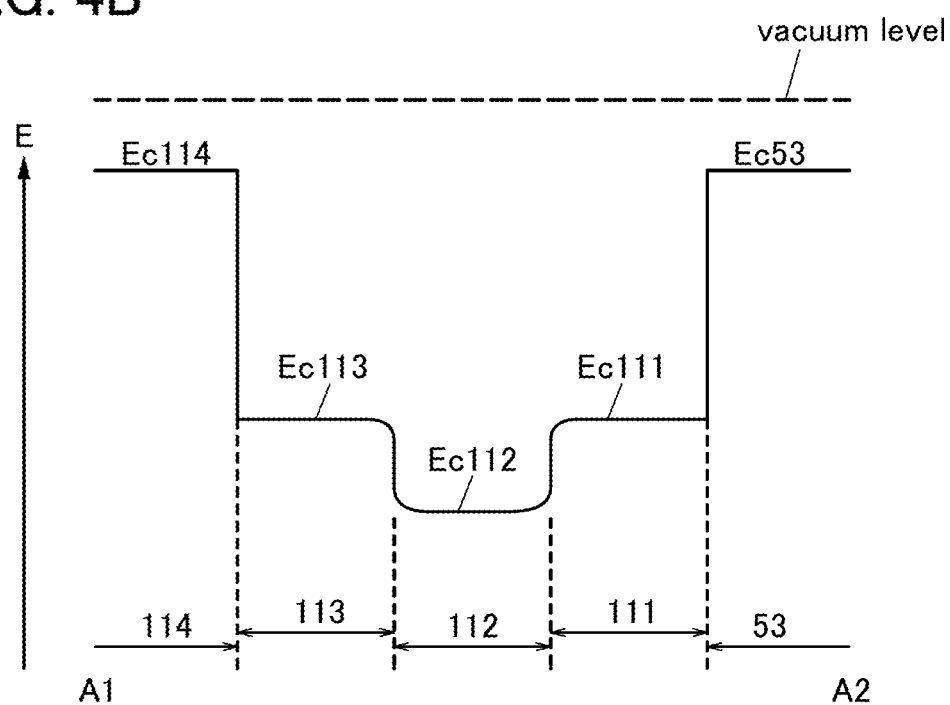

The function and effect of the oxide semiconductor 110, which includes a stack of the oxide semiconductors 111 to 113, are described with reference to the energy band diagram of FIG. 4B. FIG. 4B shows an energy band structure of a portion taken along dashed line A1-A2 in FIG. 4A.

In FIG. 4B, Ec53, Ec111, Ec112, Ec113, and Ec114 indicate the energies at the bottoms of the conduction bands of the insulator 53, the oxide semiconductor 111, the oxide semiconductor 112, the oxide semiconductor 113, and the insulator 114, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulators 53 and 114 are insulators, Ec53 and Ec114 are closer to the vacuum level (i.e., have a lower electron affinity) than Ec111, Ec112, and Ec113.

The oxide semiconductor 112 is an oxide semiconductor having an electron affinity higher than those of the oxide semiconductors 111 and 113. For example, as the oxide semiconductor 112, an oxide semiconductor having an electron affinity higher than those of the oxide semiconductors 111 and 113 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy difference between the vacuum level and the bottom of the conduction band.

Indium gallium oxide has a low electron affinity and a high oxygen-blocking property. Therefore, the oxide semiconductor 113 preferably contains indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the oxide semiconductor 112 having the highest electron affinity among the oxide semiconductors 111 to 113.

At this time, electrons move mainly in the oxide semiconductor 112, not in the oxide semiconductors 111 and 113. Hence, the on-state current of the transistor hardly varies even when the density of interface states, which inhibit electron movement, is high at the interface between the oxide semiconductor 111 and the insulator 53 or at the interface between the oxide semiconductor 113 and the insulator 114. The oxide semiconductors 111 and 113 function as an insulator.

In some cases, there is a mixed region of the oxide semiconductors 111 and 112 between the oxide semiconductors 111 and 112. Furthermore, in some cases, there is a mixed region of the oxide semiconductors 112 and 113 between the oxide semiconductors 112 and 113. Because the mixed region has a low interface state density, a stack of the oxide semiconductors 111 to 113 has a band structure where energy at each interface and in the vicinity of the interface is changed continuously (continuous junction).

As described above, the interface between the oxide semiconductors 111 and 112 or the interface between the oxide semiconductors 112 and 113 has a low interface state density. Hence, electron movement in the oxide semiconductor 112 is less likely to be inhibited and the on-state current of the transistor can be increased.

Electron movement in the transistor is inhibited, for example, in the case where physical surface unevenness in a channel formation region is large. To increase the on-state current of the transistor, for example, the root mean square (RMS) roughness in a measurement area of 1 μm×1 μm of a top surface or a bottom surface of the oxide semiconductor 112 (a formation surface; here, the top surface of the oxide semiconductor 111) is less than 1 nm, preferably less than 0.6 nm, more preferably less than 0.5 nm, still more preferably less than 0.4 nm. The average surface roughness (Ra) in the measurement area of 1 μm×1 μm is less than 1 nm, preferably less than 0.6 nm, more preferably less than 0.5 nm, still more preferably less than 0.4 nm. The maximum peak-to-valley height (P-V) in the measurement area of 1 μm×1 μm is less than 10 nm, preferably less than 9 nm, more preferably less than 8 nm, still more preferably less than 7 nm. The RMS roughness, Ra, and P-V can be measured with, for example, a scanning probe microscope SPA-500 manufactured by SII Nano Technology Inc.

The electron movement is also inhibited in the case where the density of defect states is high in the channel formation region. For example, in the case where the oxide semiconductor 112 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the oxide semiconductor 112, the on-state current of the transistor can be increased in some cases.

For example, at a certain depth in the oxide semiconductor 112 or in a certain region of the oxide semiconductor 112, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the oxide semiconductor 112, for example, there is a method in which excess oxygen contained in the insulator 53 is moved to the oxide semiconductor 112 through the oxide semiconductor 111. In that case, the oxide semiconductor 111 is preferably a layer having oxygen permeability (a layer through which oxygen can pass or permeate).

Note that in the case where the transistor has an s-channel structure, a channel is formed in the entire oxide semiconductor 112. Therefore, as the oxide semiconductor 112 has a larger thickness, a channel region becomes larger. In other words, the thicker the oxide semiconductor 112 is, the larger the on-state current of the transistor is.

Moreover, the thickness of the oxide semiconductor 113 is preferably as small as possible to increase the on-state current of the transistor. For example, the oxide semiconductor 113 has a region with a thickness of less than 10 nm, preferably less than or equal to 5 nm, more preferably less than or equal to 3 nm. Meanwhile, the oxide semiconductor 113 has a function of blocking entry of elements other than oxygen (such as hydrogen and silicon) included in the adjacent insulator into the oxide semiconductor 112 where a channel is formed. Thus, the oxide semiconductor 113 preferably has a certain thickness. For example, the oxide semiconductor 113 may have a region with a thickness of greater than or equal to 0.3 nm, preferably greater than or equal to 1 nm, more preferably greater than or equal to 2 nm. The oxide semiconductor 113 preferably has an oxygen blocking property to inhibit outward diffusion of oxygen released from the insulator 53 and the like.

To improve reliability, preferably, the thickness of the oxide semiconductor 111 is large and the thickness of the oxide semiconductor 113 is small. For example, the oxide semiconductor 111 has a region with a thickness of greater than or equal to 10 nm, preferably greater than or equal to 20 nm, more preferably greater than or equal to 40 nm, still more preferably greater than or equal to 60 nm. An increase in the thickness of the oxide semiconductor 111 can increase the distance from the interface between the adjacent insulator and the oxide semiconductor 111 to the oxide semiconductor 112 where a channel is formed. Note that the oxide semiconductor 111 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1 \times 10^{16}$ atoms/cm$^3$ and lower than $1 \times 10^{19}$ atoms/cm$^3$ is provided between the oxide semiconductors 112 and 111. The concentration of silicon is preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than $2 \times 10^{18}$ atoms/cm$^3$. A region in which the concentration of silicon is higher than or equal to $1 \times 10^{16}$ atoms/cm$^3$ and lower than $1 \times 10^{19}$ atoms/cm$^3$ is provided between the oxide semiconductors 112 and 113. The concentration of silicon is preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than $2 \times 10^{18}$ atoms/cm$^3$. The concentration of silicon can be measured by SIMS.

It is preferable to reduce the concentration of hydrogen in the oxide semiconductors 111 and 113 in order to reduce the concentration of hydrogen in the oxide semiconductor 112. The oxide semiconductors 111 and 113 each have a region in which the concentration of hydrogen is higher than or equal to $1 \times 10^{16}$ atoms/cm$^3$ and lower than or equal to $2 \times 10^{20}$ atoms/cm$^3$. The concentration of hydrogen is preferably higher than or equal to $1 \times 10^{16}$ atoms/cm$^3$ and lower than or equal to $5 \times 10^{19}$ atoms/cm$^3$, more preferably higher than or equal to $1 \times 10^{16}$ atoms/cm$^3$ and lower than or equal to $1 \times 10^{19}$ atoms/cm$^3$, still more preferably higher than or equal to $1 \times 10^{16}$ atoms/cm$^3$ and lower than or equal to $5 \times 10^{18}$ atoms/cm$^3$. The concentration of hydrogen can be measured by SIMS. It is also preferable to reduce the concentration of nitrogen in the oxide semiconductors 111 and 113 in order to reduce the concentration of nitrogen in the oxide semiconductor 112. The oxide semiconductors 111 and 113 each have a region in which the concentration of nitrogen is higher than or equal to $1 \times 10^{16}$ atoms/cm$^3$ and lower than $5 \times 10^{19}$ atoms/cm$^3$. The concentration of nitrogen is preferably higher than or equal to $1 \times 10^{16}$ atoms/cm$^3$ and lower than $5 \times 10^{18}$ atoms/cm$^3$, more preferably higher than or equal to $1 \times 10^{16}$ atoms/cm$^3$ and lower than or equal to $1 \times 10^{18}$ atoms/cm$^3$, still more preferably higher than or equal to $1 \times 10^{16}$ atoms/cm$^3$ and lower than or equal to $5 \times 10^{17}$ atoms/cm$^3$. The concentration of nitrogen can be measured by SIMS.

The above three-layer structure is an example. For example, a two-layer structure without the oxide semiconductor 111 or 113 may be employed. Alternatively, a four-layer structure may be employed in which one of the semiconductors given as examples of the oxide semiconductors 111 to 113 is provided over or under the oxide semiconductor 111 or over or under the oxide semiconductor 113. Further alternatively, an n-layer structure (n is an integer of 5 or more) may be employed in which one of the semiconductors given as examples of the oxide semiconductors 111 to 113 is provided at two or more of the following positions: over the oxide semiconductor 111, under the oxide semiconductor 111, over the oxide semiconductor 113, and under the oxide semiconductor 113.

<Base Insulator>

Examples of the material of the insulator 51 include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulator 51 may be formed using silicon oxide with high step coverage which is formed by reacting tetraethyl orthosilicate (TEOS), silane, or the like with oxygen, nitrous oxide, or the like.

The insulator 53 preferably contains an oxide material from which part of oxygen is released by heating. The insulator 53 preferably contains an oxide containing oxygen more than that in the stoichiometric composition. Part of oxygen is released by heating from an oxide film containing oxygen more than that in the stoichiometric composition. Oxygen released from the insulator 53 is supplied to the oxide semiconductor 110, so that oxygen vacancies in the oxide semiconductor 110 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulator 53 preferably contains an oxide that can supply oxygen to the oxide semiconductor 110. For example, for the insulator 53, a material containing silicon oxide or silicon oxynitride is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulator 53.

To make the insulator 53 contain excess oxygen, the insulator 53 is formed in an oxygen atmosphere, for example. Alternatively, a region containing excess oxygen may be formed by introducing oxygen into the insulator 53 that has been formed. Both the methods may be combined.

For example, oxygen (at least including any of oxygen radicals, oxygen atoms, and oxygen ions) may be introduced into the insulator 53 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Furthermore, hydrogen or the like may be included. For example, a mixed gas of carbon dioxide, hydrogen, and argon may be used.

After the insulator 53 is formed, the insulator 53 may be subjected to planarization treatment using a chemical mechanical polishing (CMP) method or the like to improve the planarity of the top surface thereof.

The insulator 52 has a passivation function of preventing oxygen contained in the insulator 53 from decreasing by bonding to metal contained in the wiring BGL1.

The insulator 52 has a function of blocking oxygen, hydrogen, water, alkali metal, alkaline earth metal, and the like. Providing the insulator 52 can prevent outward diffusion of oxygen from the oxide semiconductor 110 and entry of hydrogen, water, or the like into the oxide semiconductor 110 from the outside.

The insulator 52 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

The threshold voltage of the transistor OS1 can be controlled by injecting electrons into a charge trap layer. The charge trap layer is preferably provided in the insulator 51 or the insulator 52. For example, when the insulator 52 is formed using hafnium oxide, aluminum oxide, tantalum oxide, aluminum silicate, or the like, the insulator 52 can function as a charge trap layer.

<Gate Electrode, Source Electrode, and Drain Electrode>

The conductors 115 to 117 each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductor is preferably formed using a low-resistance conductive material such as aluminum or copper. The conductor is more preferably formed using a Cu—Mn alloy, in which case manganese oxide formed at the interface with an insulator containing oxygen has a function of preventing Cu diffusion.

For the conductors 115 to 117, a transparent conductive material containing indium oxide, tin oxide, or zinc oxide can also be used. Examples of the transparent conductive material include indium oxide, indium tin oxide (ITO), indium zinc oxide, zinc oxide, and zinc oxide to which gallium is added.

Alternatively, a stack of any of the above metals and any of the above transparent conductive materials may be used for the conductors 115 to 117.

The conductors 115 to 117 are preferably formed using a conductive oxide containing noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<Low-Resistance Region>

The regions 151 and 152 are formed when, for example, the conductors 116 and 117 extract oxygen from the oxide semiconductors 111 and 112. Oxygen is more likely to be extracted at higher temperatures. Oxygen vacancies are formed in the regions 151 and 152 through several heating steps in the manufacturing process of the transistor. In addition, hydrogen enters sites of the oxygen vacancies by heating, increasing the carrier concentration in the regions 151 and 152. As a result, the resistance of the regions 151 and 152 is reduced.

<Gate Insulator>

The insulator 114 preferably contains an insulator with a high relative dielectric constant. For example, the insulator 114 preferably contains silicon oxide, silicon oxynitride, silicon nitride, silicon nitride oxide, gallium oxide, hafnium oxide, an oxide containing aluminum and hafnium, oxynitride containing aluminum and hafnium, an oxide containing silicon and hafnium, oxynitride containing silicon and hafnium, or the like.

The insulator 114 preferably has a layered structure containing silicon oxide or silicon oxynitride and an insulator with a high relative dielectric constant. Because silicon oxide and silicon oxynitride have thermal stability, a combination of silicon oxide or silicon oxynitride with an insulator with a high relative dielectric constant allows the layered structure to be thermally stable and have a high relative dielectric constant. For example, when aluminum oxide, gallium oxide, or hafnium oxide is on the oxide semiconductor 113 side and silicon oxide or silicon oxynitride is on the conductor 115 side, entry of silicon from silicon oxide or silicon oxynitride into the oxide semiconductor 112 can be prevented.

<Interlayer Insulator and Protective Insulator>

The insulator 14 preferably contains an insulator with a low relative dielectric constant. For example, the insulator 14 preferably contains silicon oxide, silicon oxynitride, silicon nitride oxide, silicon nitride, or a resin. Alternatively, the insulator 14 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulator 54 has a function of blocking oxygen, hydrogen, water, alkali metal, alkaline earth metal, and the like. Providing the insulator 54 can prevent outward diffusion of oxygen from the oxide semiconductor 110 and entry of hydrogen, water, or the like into the oxide semiconductor 110 from the outside.

The insulator 54 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

An aluminum oxide film is preferably used as the insulator 54 because it is highly effective in preventing permeation of both oxygen and impurities such as hydrogen and moisture.

Figure 5A:
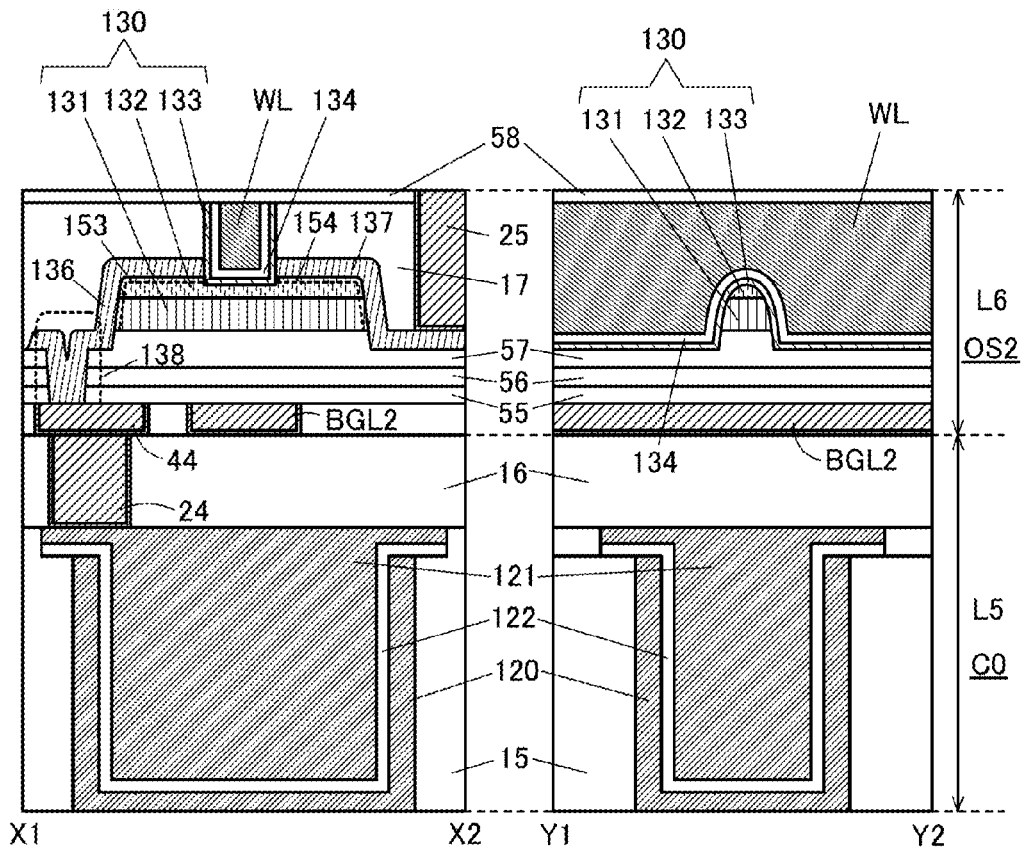
FIGS. 5A and 5B show cross-sectional views and a top view illustrating a structure example of a semiconductor device.
Figure 5B:
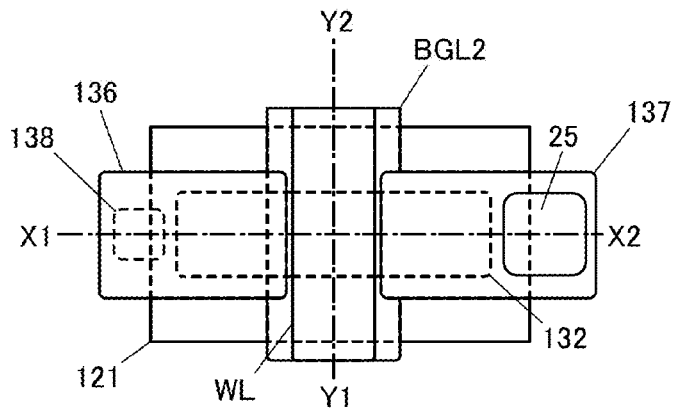

FIG. 5A illustrates the layers L5 and L6 in the cross-sectional views of FIG. 1. FIG. 5B is a top view of the capacitor C0 and the transistor OS2. Note that for simplification of the drawing, some components are not illustrated in the top view in FIG. 5B. A cross-sectional view taken along the dashed-dotted line X1-X2 in FIG. 5B is illustrated on the left side of FIG. 5A, and a cross-sectional view taken along the dashed-dotted line Y1-Y2 in FIG. 5B is illustrated on the right side of FIG. 5A. Note that the direction of the dashed-dotted line X1-X2 is also referred to as the channel length direction of the transistor OS2, and the direction of the dashed-dotted line Y1-Y2 is also referred to as the channel width direction of the transistor OS2.

<<Capacitor C0>>

The capacitor C0 includes a conductor 120, a conductor 121, and an insulator 122. The conductors 120 and 121 serve as electrodes of the capacitor C0. The insulator 122 serves as a capacitor insulator of the capacitor C0.

The insulator 122 preferably contains an insulator with a high relative dielectric constant. For example, the insulator 122 preferably contains silicon oxide, silicon oxynitride, silicon nitride, silicon nitride oxide, gallium oxide, hafnium oxide, an oxide containing aluminum and hafnium, oxynitride containing aluminum and hafnium, an oxide containing silicon and hafnium, or oxynitride containing silicon and hafnium.

The conductors 120 and 121 each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductor is preferably formed using a low-resistance conductive material such as aluminum or copper.

In particular, in the case where the insulator 122 contains a metal oxide, the conductors 120 and 121 preferably contain noble metal such as iridium, ruthenium, platinum, or strontium ruthenate. Such noble metal hardly takes oxygen from the insulator 122 even when in contact with the metal oxide contained in the insulator 122, and hardly generates defects due to oxygen vacancies in the insulator 122.

The insulators 15 and 16 preferably contain an insulator with a low relative dielectric constant. For example, the insulators 15 and 16 preferably contain silicon oxide, silicon oxynitride, silicon nitride oxide, silicon nitride, or a resin. Alternatively, the insulators 15 and 16 preferably have a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

<<Transistor OS2>>

Next, the transistor OS2 will be described. In the following example, an OS transistor is used as the transistor OS2.

The transistor OS2 includes the wiring BGL2 and the wiring 44; the insulator 55 formed so as to cover the wiring BGL2 and the wiring 44; the insulator 56 over the insulator 55; the insulator 57 over the insulator 56; a stack in which an oxide semiconductor 131 and an oxide semiconductor 132 are stacked in this order over the insulator 57; a conductor 136 in contact with top and side surfaces of the oxide semiconductor 132; a conductor 137 in contact with top and side surfaces of the oxide semiconductor 132; the insulator 17 over the conductors 136 and 137; an oxide semiconductor 133 in contact with the oxide semiconductors 131 and 132, the conductors 136 and 137, and the insulator 17; an insulator 134 over the oxide semiconductor 133; a wiring WL over the insulator 134; and the insulator 58 formed so as to cover the wiring WL. The oxide semiconductor 131, the oxide semiconductor 132, and the oxide semiconductor 133 are collectively called an oxide semiconductor 130.

The oxide semiconductor 132 is a semiconductor and serves as a channel of the transistor OS2.

The oxide semiconductor 131 and the oxide semiconductor 132 include regions 153 and 154. The region 153 is formed in the vicinity of a region where the oxide semiconductors 131 and 132 are in contact with the conductor 136. The region 154 is formed in the vicinity of a region where the oxide semiconductors 131 and 132 are in contact with the conductor 137.

The regions 153 and 154 serve as low-resistance regions. Since the oxide semiconductors 131 and the 132 include the region 153, the contact resistance between the conductor 136 and the oxide semiconductor 131 and 132 can be reduced. Similarly, since the oxide semiconductors 131 and 132 include the region 154, the contact resistance between the conductor 137 and the oxide semiconductors 131 and 132 can be reduced.

The conductor 136 serves as one of a source electrode and a drain electrode of the transistor OS2. The conductor 137 serves as the other of the source electrode and the drain electrode of the transistor OS2.

The conductor 136 is connected to the wiring 44 through an opening 138 provided in the insulators 55 to 57.

The transistor OS2 is electrically connected to the capacitor C0 through the conductor 136, the wiring 44, and the plug 24.

The wiring WL serves as a word line of the memory cell MC and a first gate electrode of the transistor OS2.

The insulator 134 serves as a first gate insulator of the transistor OS2.

The wiring BGL2 serves as a second gate electrode of the transistor OS2.

The wiring WL and the wiring BGL2 may be supplied with the same potential or different potentials. Note that the wiring BGL2 may be omitted in some cases.

The insulators 55 to 57 serve as a base insulator of the transistor OS2 and a second gate insulator of the transistor OS2.

The insulators 17 and 58 serve as a protective insulator or an interlayer insulator of the transistor OS2.

For the details of the oxide semiconductors 131, 132, and 133, refer to the descriptions of the oxide semiconductors 111, 112, and 113 of the transistors OS1, respectively.

For the details of the insulators 55, 56, 57, 17, and 58, refer to the descriptions of the insulators 51, 52, 53, 14, and 54 of the transistors OS1, respectively.

For the details of the wiring WL, the conductor 136, and the conductor 137, refer to the descriptions of the conductor 115, the conductor 116, and the conductor 117 of the transistors OS1, respectively.

For the details of the insulator 134, refer to the description of the insulator 114 of the transistors OS1.

For the details of the regions 153 and 154, refer to the descriptions of the regions 151 and 152 of the transistors OS1, respectively.

In FIG. 1, FIGS. 2A to 2C, FIG. 3, FIGS. 4A and 4B, and FIGS. 5A and 5B, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used.

Alternatively, in the regions, an organic resin such as a polyimide resin, a polyamide resin, an acrylic resin, a siloxane resin, an epoxy resin, or a phenol resin can be used.

Figure 6:
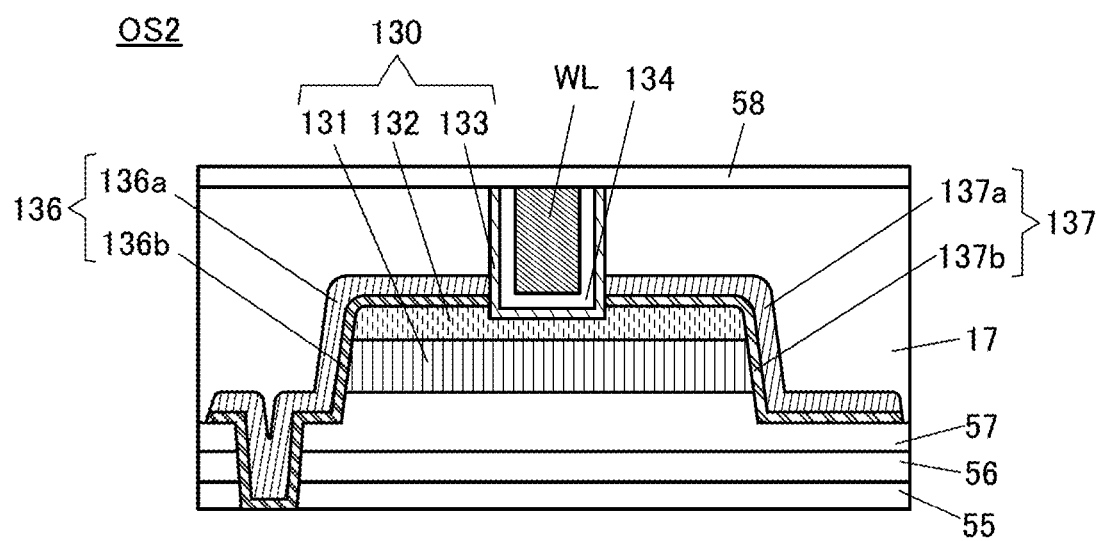
FIG. 6 is a cross-sectional view illustrating a structure example of a transistor.

In the transistor OS2, the conductors serving as the source electrode and the drain electrode may have a layered structure. An example of such a case is illustrated in FIG. 6. In the transistor OS2 illustrated in FIG. 6, the conductor 136 has a layered structure of a conductor 136a and a conductor 136b, and the conductor 137 has a layered structure of a conductor 137a and a conductor 137b.

It is preferred that the conductor 136a be less likely to allow oxygen to pass through than the conductor 136b. It is thus possible to prevent a decrease in the conductivity of the conductor 136b due to oxidation. Similarly, it is preferred that the conductor 137a be less likely to allow oxygen to pass through than the conductor 137b. It is thus possible to prevent a decrease in the conductivity of the conductor 137b due to oxidation.

Note that the above structure can also be applied to the conductor 116 and the conductor 117 in the transistor OS1.

<<Method for Manufacturing Semiconductor Device>>

Next, a method for manufacturing the transistor OS2 will be described with reference to FIGS. 7A to 7C, FIGS. 8A to 8C, FIGS. 9A and 9B, FIGS. 10A and 10B, and FIGS. 11A and 11B. Note that the transistor M0, the transistor OS1, and part of the capacitor C0 are not shown in FIGS. 7A to 7C, FIGS. 8A to 8C, FIGS. 9A and 9B, FIGS. 10A and 10B, and FIGS. 11A and 11B.

Figure 7A:
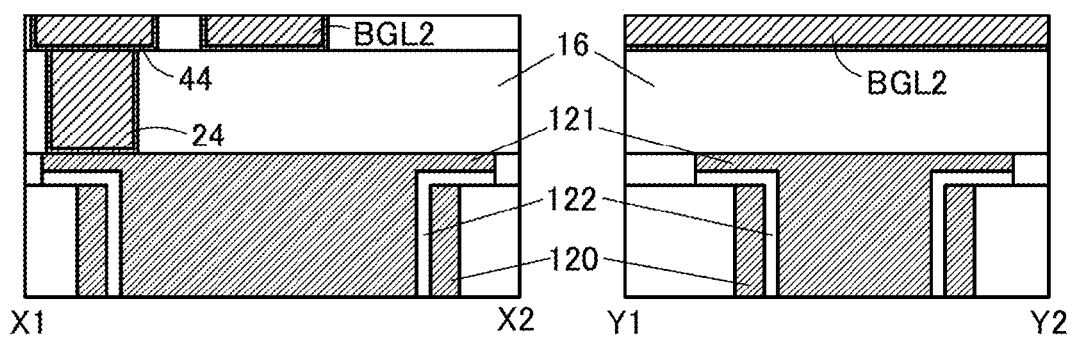
FIGS. 7A to 7C show cross-sectional views illustrating a method for manufacturing a semiconductor device.

First, the transistor M0, the transistor OS1, and the capacitor C0 are formed over the substrate 11, and the plug 24, the wiring BGL2, and the wiring 44 are formed over the capacitor C0 (FIG. 7A). The transistor M0 and the capacitor C0 can each be formed through a general semiconductor manufacturing process. For a method for manufacturing the transistor OS1, refer to the method for manufacturing the transistor OS2 described below.

Figure 7B:
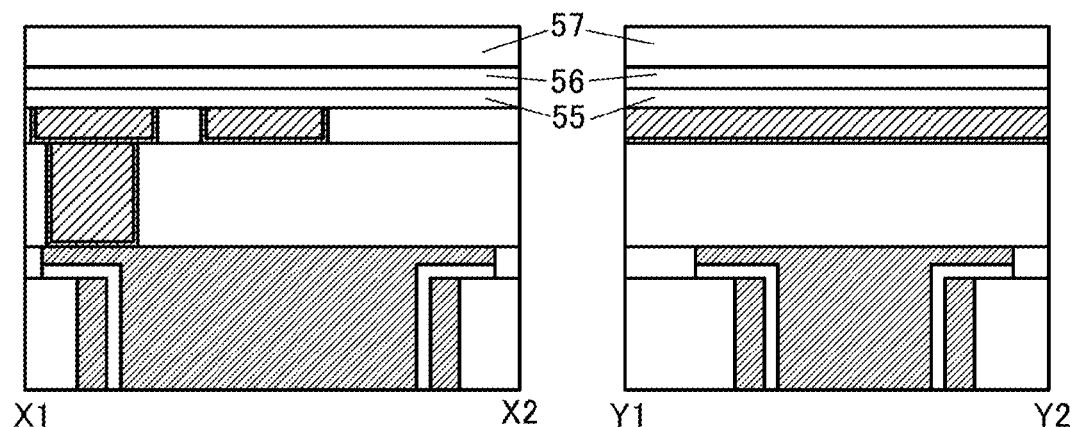

Then, the insulators 55 to 57 are formed (FIG. 7B). The insulators 55 to 57 may be formed by a sputtering method, a chemical vapor deposition (CVD) method, a molecular beam epitaxy (MBE) method, an atomic layer deposition (ALD) method, a pulsed laser deposition (PLD) method, or the like.

Note that CVD methods can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas.

For example, oxygen (at least including any of oxygen radicals, oxygen atoms, and oxygen ions) may be introduced into the insulator 57 that has been formed, so that a region containing excess oxygen is formed. Oxygen can be introduced by, for example, an ion implantation method, an ion doping method, a plasma immersion ion implantation method, plasma treatment, or the like. A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulator 57 is formed, the insulator 57 is preferably subjected to planarization treatment using a CMP method or the like to improve the planarity of the top surface thereof.

Figure 7C:
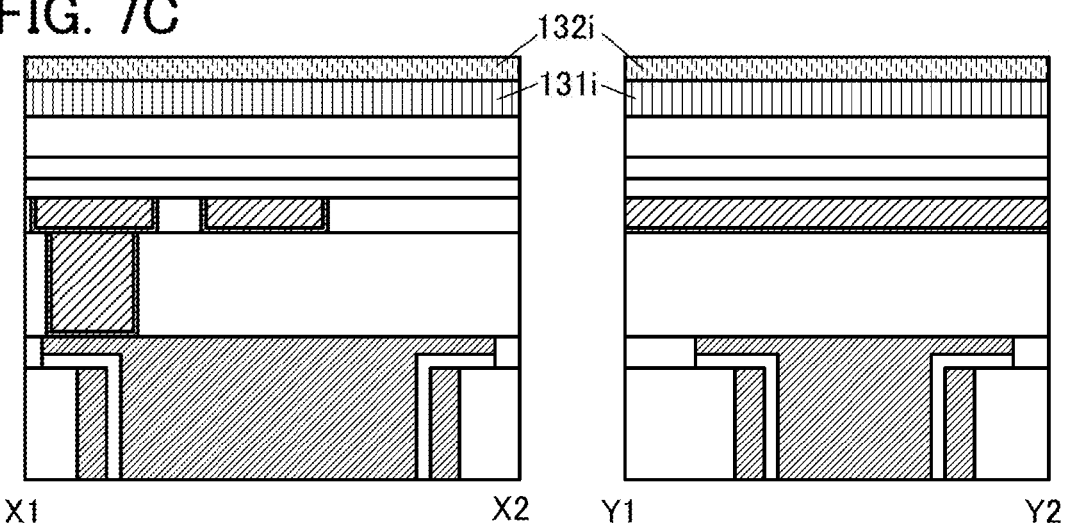

Next, an oxide semiconductor 131i and an oxide semiconductor 132i are formed (FIG. 7C). The oxide semiconductor 131i and the oxide semiconductor 132i can be formed by a sputtering method, a CVD method (including a thermal CVD method, an MOCVD method, a PECVD method, and the like), an MBE method, a PLD method, an ALD method, or the like. It is particularly preferable to use a facing-target sputtering apparatus. When the oxide semiconductor 131i and the oxide semiconductor 132i are deposited using a facing-target sputtering apparatus, plasma damage to the oxide semiconductor 131i and the oxide semiconductor 132i at the time of deposition can be reduced. Thus, oxygen vacancies in the oxide semiconductor 131i and the oxide semiconductor 132i can be reduced. In addition, the use of the facing-target sputtering apparatus allows deposition in high vacuum. Accordingly, the concentration of impurities (e.g., hydrogen, a rare gas (e.g., argon), and water) in a deposited oxide semiconductor can be lowered. Alternatively, a sputtering apparatus including an inductively coupled antenna conducting plate may be used. In that case, a film with a large area and high uniformity can be deposited with a high deposition rate.

Note that in the case where In—Ga—Zn oxide layers formed by an MOCVD method are used as the oxide semiconductors 131i and 132i, trimethylindium, trimethylgallium, dimethylzinc, and the like may be used as source gases. The source gases are not limited to the above combination, and triethylindium or the like may be used instead of trimethylindium. Alternatively, triethylgallium or the like may be used instead of trimethylgallium. Still alternatively, diethylzinc or the like may be used instead of dimethylzinc.

After the oxide semiconductors 131i and 132i are formed, heat treatment is preferably performed. The heat treatment may be performed at a temperature higher than or equal to 250° C. and lower than or equal to 650° C., preferably higher than or equal to 450° C. and lower than or equal to 600° C., in an inert gas atmosphere, an atmosphere containing an oxidizing gas at 10 ppm or more, 1% or more, or 10% or more, or under reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more, in order to compensate for released oxygen. The heat treatment can increase the crystallinity of the semiconductor and can remove impurities such as hydrogen and water, for example.

Then, the oxide semiconductors 131i and 132i are processed into the island-shaped oxide semiconductors 131 and 132 by lithography and dry etching (FIG. 8A). After the oxide semiconductors 131 and 132 are formed, high-density plasma treatment is preferably performed as indicated by arrows in the drawing. The high-density plasma treatment is preferably performed in an oxygen atmosphere. The oxygen atmosphere is a gas atmosphere containing an oxygen atom and refers to atmospheres of oxygen, ozone, and nitrogen oxide (e.g., nitrogen monoxide, nitrogen dioxide, dinitrogen monoxide, dinitrogen trioxide, dinitrogen tetroxide, or dinitrogen pentoxide). In an oxygen atmosphere, an inert gas such as nitrogen or a rare gas (e.g., helium or argon) may be contained. With this high-density plasma treatment performed in an oxygen atmosphere, oxygen vacancies in the oxide semiconductors 131 and 132 can be filled. Furthermore, from the oxide semiconductors 131 and 132, impurities such as hydrogen, carbon, and moisture can be removed, for example. That is, through the high-density plasma treatment, damage to or impurities in the oxide semiconductors 131 and 132 which are generated due to the lithography and dry etching can be repaired or removed.

The high-density plasma treatment is performed using a microwave generated with a high-frequency generator that generates a wave having a frequency of, for example, more than or equal to 0.3 GHz and less than or equal to 3.0 GHz, more than or equal to 0.7 GHz and less than or equal to 1.1 GHz, or more than or equal to 2.2 GHz and less than or equal to 2.8 GHz (typically, 2.45 GHz). The treatment pressure can be higher than or equal to 10 Pa and lower than or equal to 5000 Pa, preferably higher than or equal to 200 Pa and lower than or equal to 1500 Pa, further preferably higher than or equal to 300 Pa and lower than or equal to 1000 Pa. The substrate temperature can be higher than or equal to 100° C. and lower than or equal to 600° C. (typically 400° C.). Furthermore, a mixed gas of oxygen and argon can be used.

For example, the high-density plasma is generated using a 2.45 GHz microwave and preferably has an electron density of higher than or equal to $1\times10^{11}/cm^3$ and lower than or equal to $1\times10^{13}/cm^3$, an electron temperature of 2 eV or lower, or an ion energy of 5 eV or lower. Such high-density plasma treatment produces radicals with low kinetic energy and causes little plasma damage, compared with conventional plasma treatment. Thus, formation of a film with few defects is possible. The distance between an antenna that generates the microwave and the treated object is longer than or equal to 5 mm and shorter than or equal to 120 mm, preferably longer than or equal to 20 mm and shorter than or equal to 60 mm.

Alternatively, a plasma power source that applies a radio frequency (RF) bias to a substrate may be provided. The frequency of the RF bias may be 13.56 MHz, 27.12 MHz, or the like, for example. The use of high-density plasma enables high-density oxygen ions to be produced, and application of the RF bias to the substrate allows oxygen ions generated by the high-density plasma to be efficiently introduced into the treated object. Therefore, it is preferable to perform the high-density plasma treatment while a bias is applied to the substrate.

Following the high-density plasma treatment, heat treatment may be successively performed without an exposure to the air. Following heat treatment, the high-density plasma treatment may be successively performed without an exposure to the air. By performing high-density plasma treatment and heat treatment in succession, entry of impurities during the treatment can be suppressed. Moreover, by performing heat treatment after the high-density plasma treatment in an oxygen atmosphere, unnecessary oxygen that is added into the treated object but is not used to fill oxygen vacancies can be eliminated. The heat treatment may be performed by lamp annealing or the like, for example.

The treatment time of the high-density plasma treatment is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

The treatment time of the heat treatment at a temperature of higher than or equal to 250° C. and lower than or equal to 800° C., higher than or equal to 300° C. and lower than or equal to 700° C., or higher than or equal to 400° C. and lower than or equal to 600° C. is preferably longer than or equal to 30 seconds and shorter than or equal to 120 minutes, longer than or equal to 1 minute and shorter than or equal to 90 minutes, longer than or equal to 2 minutes and shorter than or equal to 30 minutes, or longer than or equal to 3 minutes and shorter than or equal to 15 minutes.

Next, the opening 138 is formed in the insulators 55 to 57 through lithography and dry etching (FIG. 8B). After the opening 138 is formed, the above high-density plasma treatment may be further performed as indicated by arrows in the drawing. By the high-density plasma treatment, damage to the oxide semiconductors 131 and 132 which is caused due to the formation of the opening 138 can be repaired, and impurities therein can be removed.

When the high-density plasma treatment is performed in an oxygen atmosphere after the opening 138 is formed, an exposed portion of the wiring 44 is oxidized. For such a reason, the wiring 44 is preferably formed using a material that is less likely to be oxidized or that maintains its conductivity even when oxidized. As such a material, a transparent conductive material containing indium oxide, tin oxide, or zinc oxide can be used. Furthermore, a material containing iridium, gold, platinum, ruthenium, copper, strontium ruthenate, or the like can also be used.

Then, a conductor 142 is formed (FIG. 8C). The conductor 142 can be formed by a sputtering method, a CVD method (including a thermal CVD method, an MOCVD method, a PECVD method, and the like), an MBE method, a PLD method, an ALD method, or the like. Note that the conductor 142 covers the oxide semiconductors 131 and 132. Due to the partial damage to the side surface of the oxide semiconductor 131 and the top and side surfaces of the oxide semiconductor 132 caused during the deposition of the conductor 142, low-resistance regions (the regions 153 and 154 in FIG. 5A) might be formed. These low-resistance regions can reduce contact resistance between the conductor 142 and the oxide semiconductors 131 and 132.

Figure 9A:
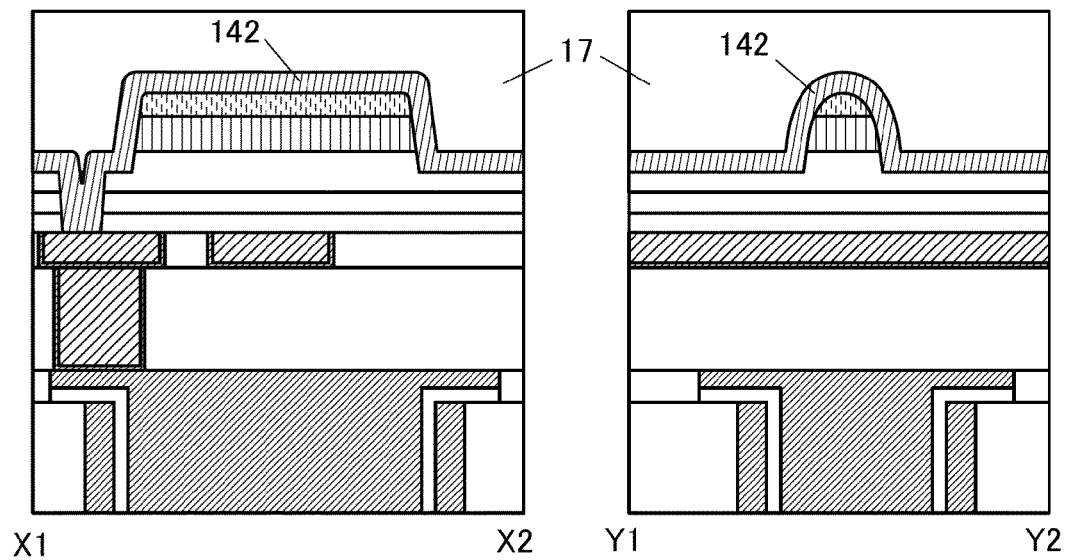
FIGS. 9A and 9B show cross-sectional views illustrating a method for manufacturing a semiconductor device.

Next, the insulator 17 is formed (FIG. 9A). The insulator 17 can be formed by a sputtering method, a CVD method, an MBE method, a PLD method, an ALD method, or the like. The insulator 17 is preferably formed using a TEOS gas. The insulator 17 may be formed to have a flat top surface. For example, the top surface of the insulator 17 may have flatness immediately after the film formation. Alternatively, for example, the insulator 17 may be subjected to planarization treatment so that the top surface becomes parallel to a reference surface such as a rear surface of the substrate. As the planarization treatment, there are chemical mechanical polishing treatment, dry etching treatment, and the like. However, the top surface of the insulator 17 is not necessarily flat.

Next, a resist mask is formed over the insulator 17 by lithography. Here, an organic coating film may be provided between the insulator 17 and the resist mask in order to improve the adhesion between the top surface of the insulator 17 and the resist mask.

Then, the insulator 17 is subjected to first processing by dry etching until an opening reaches a top surface of the conductor 142.

Figure 9B:
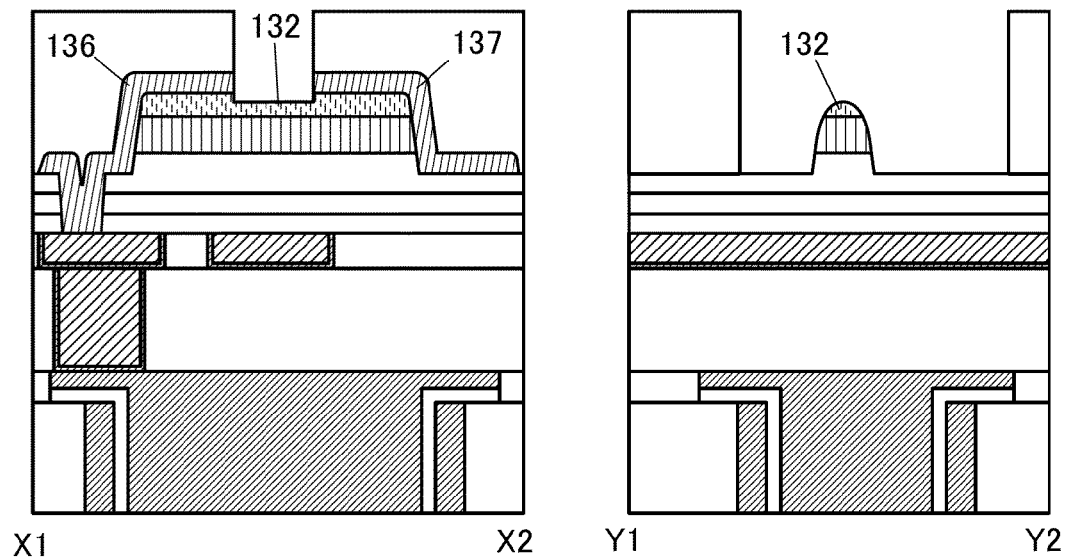

Then, the conductor 142 is separated into the conductor 136 and the conductor 137 by second processing using dry etching (FIG. 9B). Note that the first processing and the second processing may be performed through the same lithography process or different lithography processes.

At this time, the oxide semiconductor 132 has a region that is exposed. Part of the exposed region of the oxide semiconductor 132 is removed by the second processing in some cases. Furthermore, impurity elements such as residual components of the etching gas are attached to the exposed surface of the oxide semiconductor 132 in some cases. In order to remove the impurity elements attached to the surface of the oxide semiconductor 132, for example, cleaning treatment using a dilute hydrofluoric acid or the like, cleaning treatment using ozone or the like, or cleaning treatment using ultraviolet light or the like may be performed. Note that a plurality of types of cleaning treatments may be used in combination. Accordingly, the exposed surface of the oxide semiconductor 132 (channel formation region) has high resistance.

After the second processing, the above-described high-density plasma treatment may be performed. With the high-density plasma treatment, a reaction product (also referred to as "rabbit ear") which is formed on the side surface of the insulator 17 or the like at the time of the first processing and the second processing can be removed.

Figure 10A:
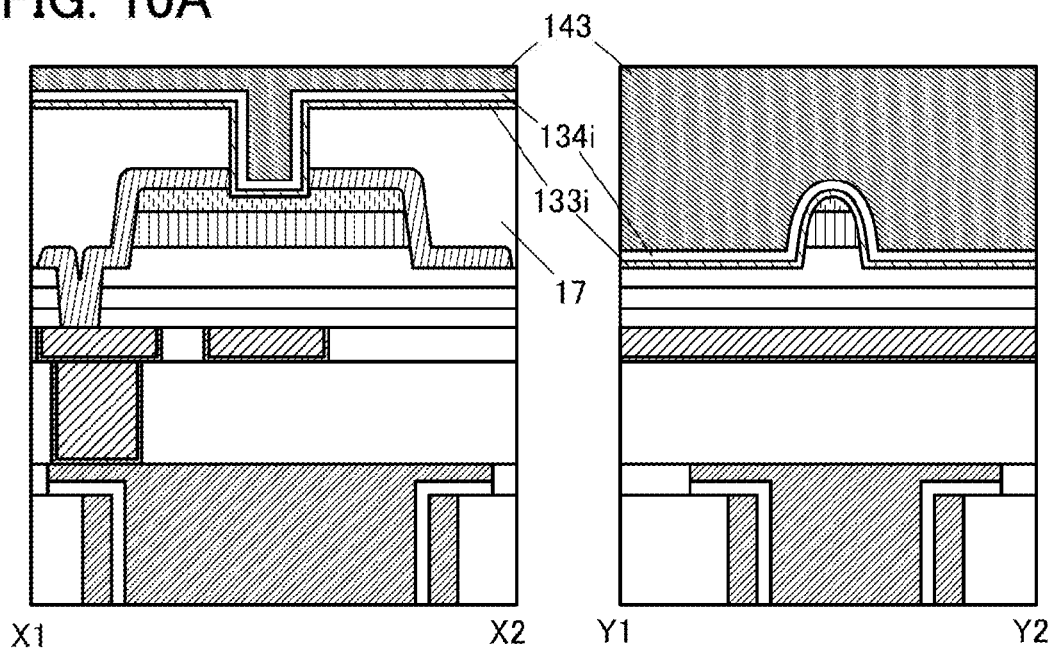
FIGS. 10A and 10B show cross-sectional views illustrating a method for manufacturing a semiconductor device.

Then, an oxide semiconductor 133$i$, an insulator 134$i$, and a conductor 143 are formed (FIG. 10A). The oxide semiconductor 133$i$, the insulator 134$i$, and the conductor 143 can be formed by a sputtering method, a CVD method, an MBE method, a PLD method, an ALD method, or the like. In particular, the insulator 134$i$ is preferably formed using a TEOS gas. The conductor 143 is preferably formed so as to fill an opening provided in the insulator 17. Therefore, the conductor 143 is preferably formed by a CVD method (in particular, an MCVD method).

To increase the adhesion of the conductor, the conductor 143 preferably has a layered structure of a conductor deposited by an ALD method or the like and a conductor deposited by a CVD method in some cases. For example, the conductor 143 may have a layered structure in which titanium nitride and tungsten are stacked in this order.

Figure 10B:
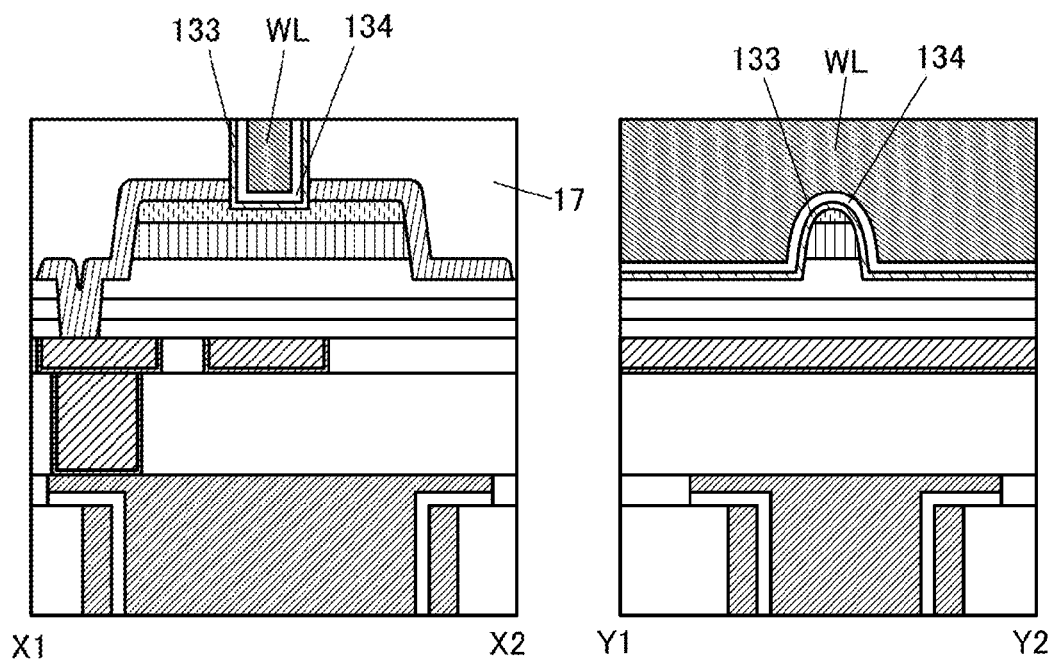

Then, polishing is performed by CMP or the like until a surface of the insulator 17 is exposed, so that the wiring WL, the insulator 134, and the oxide semiconductor 133 are formed (FIG. 10B).

Accordingly, the wiring WL serving as the gate electrode can be formed in a self-aligned manner without using a lithography method. The gate electrode can be formed without considering the alignment accuracy of the wiring WL serving as the gate electrode and the conductors 136 and 137 serving as the source and drain electrodes; as a result, the area of the semiconductor device 10 can be reduced. Furthermore, because the lithography process is not necessary, an improvement in productivity due to simplification of the process is expected.

Polishing is not necessarily performed until the surface of the insulator 17 is exposed. The wiring WL may be formed by performing polishing until a surface of the insulator 134 is exposed. The wiring WL may be formed by performing polishing until a surface of the oxide semiconductor 133 is exposed. The insulator 17, the insulator 134, or the oxide semiconductor 133 preferably includes an insulator functioning as a CMP stopper.

Figure 11A:
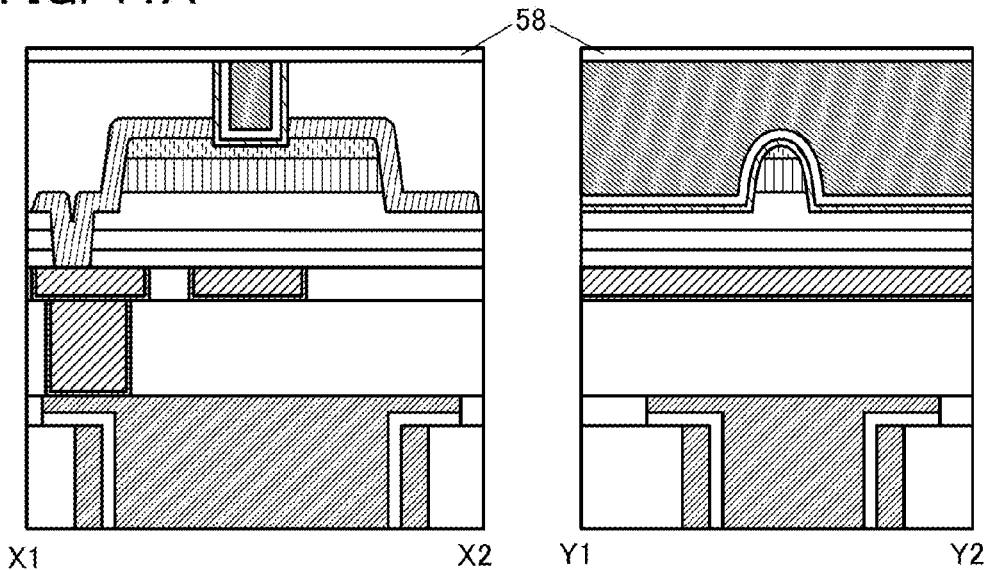
FIGS. 11A and 11B show cross-sectional views illustrating a method for manufacturing a semiconductor device.

Next, the insulator 58 is formed (FIG. 11A). The insulator 58 can be formed by a sputtering method, a CVD method, an MBE method, a PLD method, an ALD method, or the like. The insulator 58 may be formed to have a flat top surface.

After the insulator 58 is formed, heat treatment may be performed. The heat treatment may be performed at a temperature higher than or equal to 250° C. and lower than or equal to 650° C., preferably higher than or equal to 450° C. and lower than or equal to 600° C., in an inert gas atmosphere or an atmosphere containing an oxidizing gas at 10 ppm or more, 1% or more, or 10% or more. Through this heat treatment, oxygen can be supplied to the oxide semiconductors 131 to 133 from the insulator 57 or the like; thus, oxygen vacancies in the oxide semiconductors 131 to 133 can be reduced. Because oxygen released from the insulator 57 is blocked by the insulator 58 at this time, the oxygen can be effectively confined.

Figure 11B:
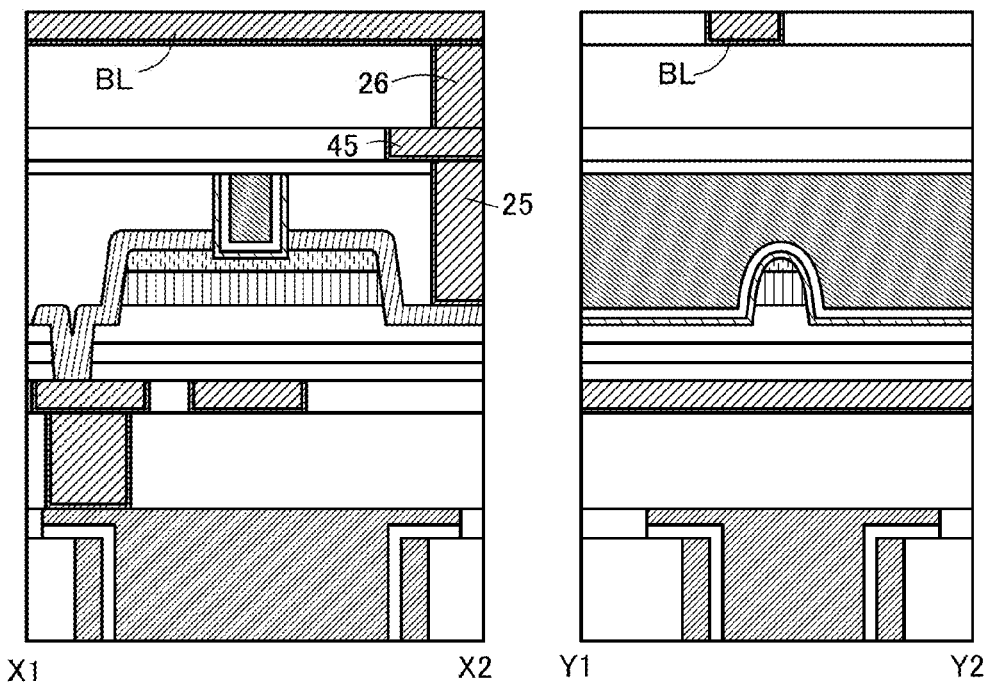

Lastly, the plug 25, the wiring 45, the plug 26, the wiring BL, and the like are formed (FIG. 11B). The plugs, the wirings, and the like can be formed by general semiconductor manufacturing methods, and thus the detailed description is omitted here.

In the above manner, the semiconductor device 10 is manufactured.

<<Structure Example 2 of Semiconductor Device>>

Figure 12:
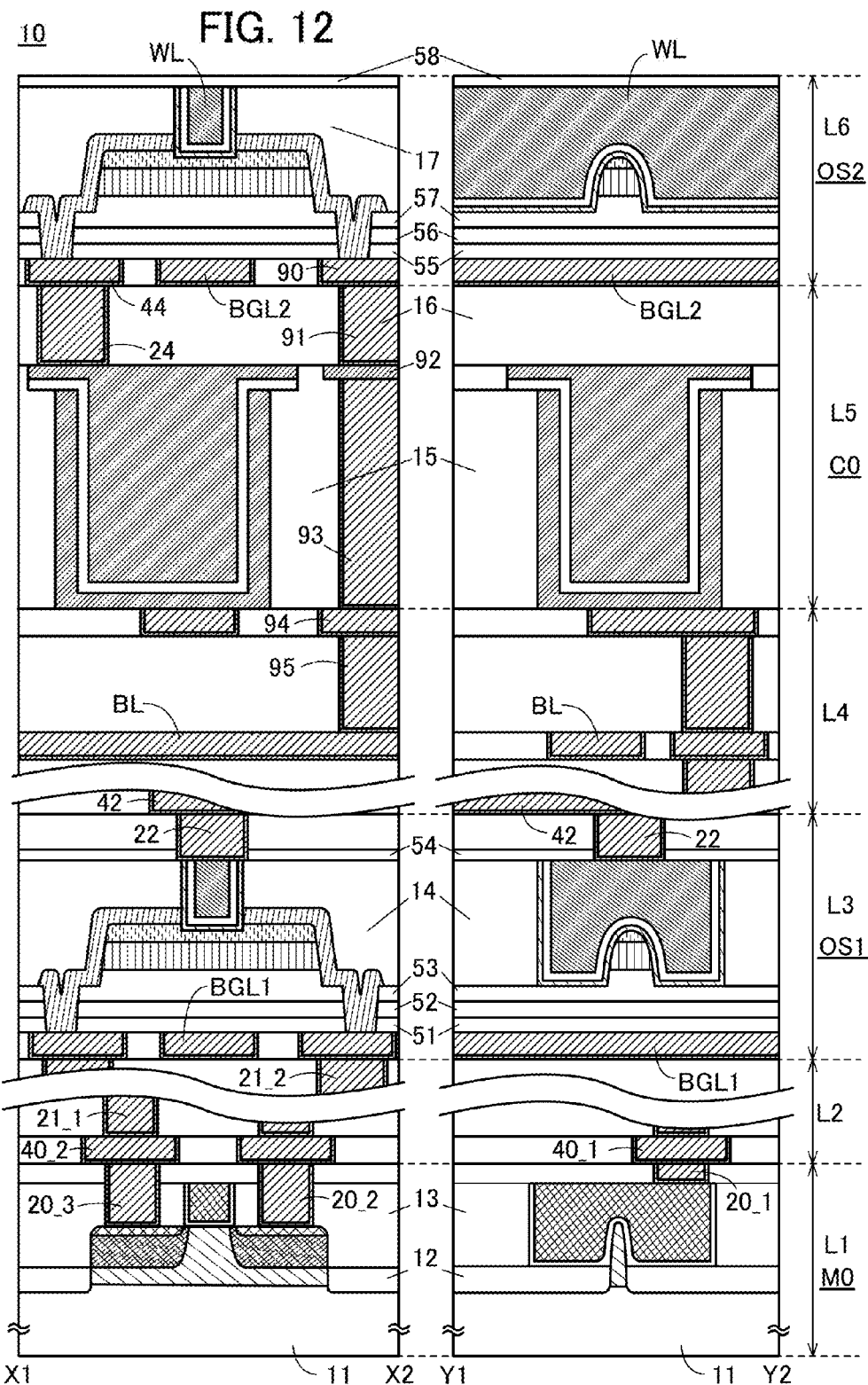
FIG. 12 shows cross-sectional views illustrating a structure example of a semiconductor device.

Other structure examples of the semiconductor device 10 will be described below. In the example of FIG. 12, the wiring BL in FIG. 1 is provided between the transistor OS1 and the capacitor C0. The transistor OS2 is electrically connected to the wiring BL through a wiring 90, a plug 91, a wiring 92, a plug 93, a wiring 94, and a plug 95.

When the semiconductor device 10 has the structure illustrated in FIG. 12, the frequency of exposing the transistor OS2 to process damage can be reduced because the transistor OS2 can be formed last.

<<Structure Example 3 of Semiconductor Device>>

In the example of FIG. 33, the transistor OS1 in FIG. 1 is not provided and the sense amplifier SA is formed using a plurality of transistors M0. A layer L8 is provided between the layer L1 and the layer L5. The layer L8 includes the wiring 40_1, the wiring 40_2, the plug 21_1, the plug 23, and the like.

When the semiconductor device 10 has the structure illustrated in FIG. 33, the manufacturing process can be simplified.

Embodiment 2

In this embodiment, structure examples of a semiconductor device of one embodiment of the present invention will be described with reference to FIGS. 13A to 13C, FIG. 14, FIG. 15, FIG. 16, FIG. 17, and FIG. 18.

<<Structure Example 1 of Semiconductor Device>>

FIG. 13A illustrates an example of a circuit configuration of the semiconductor device 10. FIG. 13B is a top view of the semiconductor device 10 illustrated in FIG. 13A.

The semiconductor device 10 includes a cell array 70 and a sense amplifier circuit 60. The cell array 70 includes a plurality of memory cells MC. Each of the memory cells MC is connected to the wiring WL and the wiring BL. The memory cells MC are selected according to a potential supplied to the wiring WL, and a potential corresponding to data to be written to the memory cells MC is supplied to the wiring BL (hereinafter, the potential is also referred to as writing potential); in this manner, data is written to the memory cells MC. Here, the case where the cell array 70 includes the memory cells MC arranged in a matrix of i rows and j columns (i and j are natural numbers of 2 or more) is shown. Therefore, in the cell array 70, i wirings WL and j wirings BL are provided.

The sense amplifier circuit 60 is connected to the plurality of wirings BL and a plurality of wirings GBL. The sense amplifier circuit 60 has a function of amplifying a signal that is input and controlling output of the amplified signal. Specifically, the sense amplifier circuit 60 has a function of amplifying the potentials of the wirings BL (hereinafter, the potentials are also referred to as reading potentials), which correspond to data stored in the memory cells MC, and outputting them to the wirings GBL at a predetermined timing. Since the reading potentials are amplified by the sense amplifier circuit 60, data can be surely read even in the case where a potential read from the memory cell MC is extremely low. Furthermore, since output of the amplified potentials to the wirings GBL is controlled, each of the wirings GBL can be shared.

In one embodiment of the present invention, as a layout type of the cell array 70, a folded-type layout, an open-type layout, or the like can be used. In the case of a folded-type layout, noise generated in a reading potential which is output to the wiring BL can be reduced owing to a change in the potential of the wiring WL. On the other hand, in the case of an open-type layout, the density of the memory cells MC can be higher than that in the case of a folded-type layout, and thus the area of the cell array 70 can be reduced. FIGS. 13A and 13B illustrate a structure example of the cell array 70 in the case of a folded-type layout. In the cell array 70 illustrated in FIGS. 13A and 13B, the memory cell MC connected to one wiring BL and the memory cell MC connected to a wiring BL adjacent to the one wiring BL are not connected to the same wiring WL.

The sense amplifier SA has a function of amplifying a difference between a reference potential and a reading potential that is supplied to the wiring BL and holding the amplified potential difference. Furthermore, the sense amplifier SA has a function of controlling the output of the amplified potential to the wiring GBL. Here, the sense amplifier SA is connected to two wirings BL and two wirings GBL.

In one embodiment of the present invention, the memory cells MC and the sense amplifiers SA are formed in different layers. In particular, the memory cells MC are preferably formed over the sense amplifiers SA. At least one memory cell MC is preferably positioned so as to overlap with the sense amplifier SA, in which case the area of the semiconductor device 10 can be smaller than that when the memory cells MC and the sense amplifiers SA are positioned in the same layer. Accordingly, the storage capacity per unit area of the semiconductor device 10 can be increased. When all the memory cells MC are positioned so as to overlap with the sense amplifier SA, the area of the semiconductor device 10 can be further reduced. The memory cells MC may be positioned so as to overlap with one sense amplifier SA; alternatively, the memory cells MC may be positioned so as to overlap with the plurality of sense amplifiers SA. Note that there is no particular limitation on the number of the memory cells MC in the cell array 70. For example, the number thereof can be larger than or equal to 128 and smaller than or equal to 512.

In addition, because the memory cells MC and the sense amplifiers SA are stacked, the length of the wirings BL electrically connecting the memory cells MC to the sense amplifiers SA can be reduced. Consequently, the wiring resistance of the wirings BL can be low, and a reduction in the power consumption and an increase in the operation speed of the semiconductor device 10 can be achieved. Furthermore, the areas of the capacitors provided in the memory cells MC can be small; thus the sizes of the memory cells MC can be small.

FIG. 13C illustrates a configuration example of the memory cell MC. The memory cell MC includes the transistor OS2 and the capacitor C0. A gate of the transistor OS2 is connected to the wiring WL, one of a source and a drain thereof is connected to one electrode of the capacitor C0, and the other of the source and the drain thereof is connected to the wiring BL. The other electrode of the capacitor C0 is connected to a wiring or a terminal to which a predetermined potential (such as a ground potential) is supplied. Here, a node at which the one of the source and the drain of the transistor OS2 and the one electrode of the capacitor C0 are connected to each other is referred to as a node N.

Here, the transistor OS2 has a function of holding charge accumulated in the node N by being turned off. For that reason, the off-state current of the transistor OS2 is preferably small. When the off-state current of the transistor OS2 is small, leakage of charge held in the node N can be reduced. Consequently, data stored in the memory cell MC can be held for a long time.

Here, the OS transistor described in Embodiment 1 can have extremely small off-state current and thus is preferably used as the transistor OS2. With the use of the OS transistor for the memory cell MC, data written in the memory cell MC can be held for an extremely long time and the interval between refresh operations can be long. Specifically, the interval between refresh operations can be an hour or longer.

The second gate of the transistor OS2 is electrically connected to the wiring BGL2. The threshold voltage of the transistor OS2 can be controlled by the voltage applied to the wiring BGL2. For example, in the case where a negative potential is applied to the wiring BGL2, the threshold voltage of the transistor OS2 shifts in the positive direction. As a result, the transistor OS2 becomes normally off, and the off-state current of the transistor OS2 can be smaller. Note that in FIGS. 13A and 13B and FIG. 14, FIG. 17, and FIG. 18 which will be described below, the wiring BGL2 is not illustrated.

With the use of an OS transistor for the memory cell MC, the semiconductor device 10 can be used as a memory device in which data can be held for a long time. Therefore, in the semiconductor device 10, power supply can be stopped for a long time during which data is not written or read. As a result, the power consumption of the semiconductor device 10 can be reduced.

Next, a more specific configuration example of the semiconductor device 10 will be described with reference to FIG. 14.

Figure 14:
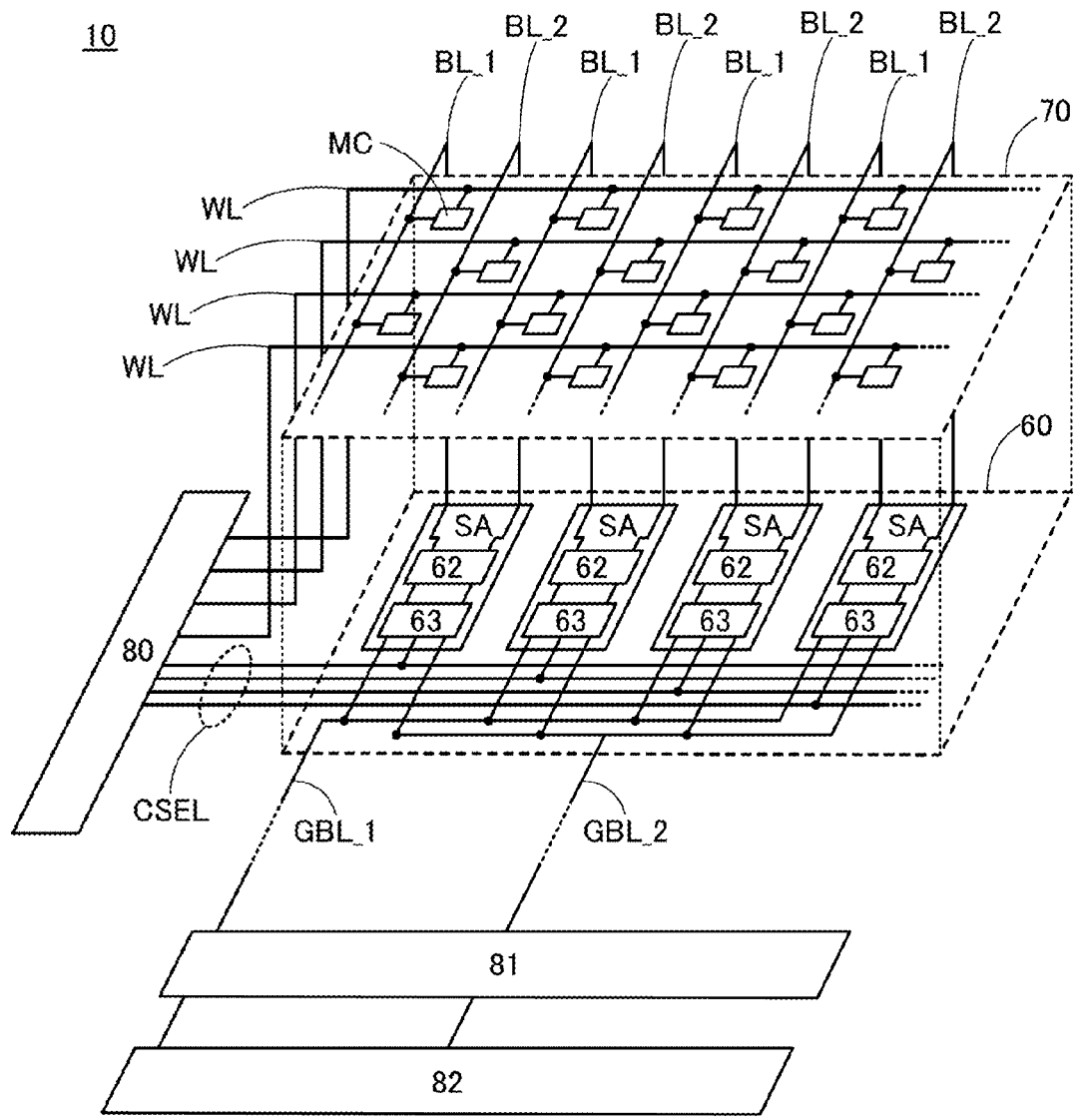
FIG. 14 is a block diagram illustrating a structure example of a semiconductor device.

The semiconductor device 10 illustrated in FIG. 14 has the configuration of the semiconductor device 10 illustrated in FIGS. 13A to 13C, and in addition includes a driver circuit 80, a main amplifier 81, and an input/output circuit 82.

The main amplifier 81 is connected to the sense amplifier circuit 60 and the input/output circuit 82. The main amplifier 81 has a function of amplifying a signal input thereto. Specifically, the main amplifier 81 has a function of amplifying the potentials of the wirings GBL and outputting them to the input/output circuit 82. Note that the main amplifier 81 is not necessarily provided.

The input/output circuit 82 has a function of outputting the potentials of the wirings GBL or the potentials output from the main amplifier 81 as reading data to the outside.

The driver circuit 80 is connected to the memory cells MC through the wirings WL. The driver circuit 80 has a function of supplying a signal for selecting the memory cells MC in which data is written (hereinafter, the signal is also referred to as a write word signal) to the wiring WL. Note that the driver circuit 80 can be formed using a decoder or the like.

The sense amplifiers SA are connected to the memory cells MC through the wirings BL. Here, a structure in which two adjacent wirings BL (a wiring BL_1 and a wiring BL_2) are connected to the same sense amplifier SA is shown. The sense amplifier SA includes an amplifier circuit 62 and a switch circuit 63.

The amplifier circuit 62 has a function of amplifying the potential of the wiring BL. Specifically, the amplifier circuit 62 has a function of amplifying a difference between the potential of the wiring BL and a reference potential and holding the amplified potential difference. For example, in the case where the potential of the wiring BL_1 is amplified, a difference between the potential of the wiring BL_1 and the potential of the wiring BL_2 (i.e., a reference potential) is amplified. In the case where the potential of the wiring BL_2 is amplified, a difference between the potential of the wiring BL_1 (i.e., a reference potential) and the potential of the wiring BL_2 is amplified.

The switch circuit 63 has a function of determining whether the amplified potential of the wiring BL is output to the wiring GBL. In the example shown here, the switch circuit 63 is connected to two wirings GBL (a wiring GBL_1 and a wiring GBL_2). The switch circuit 63 has a function of controlling electrical connection between the wiring BL_1 and the wiring GBL_1 and electrical connection between the wiring BL_2 and the wiring GBL_2. The switch circuit 63 is connected to one of a plurality of wirings CSEL, and the operation of the switch circuit 63 is controlled on the basis of a signal supplied to the wiring CSEL from the driver circuit 80. The semiconductor device 10 is capable of selecting a signal to be output to the outside with the use of the switch circuits 63 and the wirings CSEL. Therefore, the input/output circuit 82 does not need to select a signal with the use of a multiplexer or the like, and thus can have a simple circuit configuration and a small occupied area.

The switch circuits 63 and the wirings CSEL are preferably positioned so as to overlap with the cell array 70 as illustrated in FIG. 14. Specifically, the switch circuits 63 and the wirings CSEL are preferably positioned so as to overlap with the memory cells MC. Accordingly, an increase in the area of the semiconductor device 10 can be reduced, and the sense amplifier circuit 60 can have a function of selecting an output signal.

Note the here, the wirings WL and the wirings CSEL are connected to the driver circuit 80; however, the wirings WL and the wirings CSEL may be connected to different driver circuits. In this case, the potentials of the wirings WL and the wirings CSEL are controlled by different driver circuits.

Note that the number of the wirings GBL is not particularly limited, and may be a given number smaller than the number of the wirings BL (i.e., j) in the cell array 70. For example, in the case where the number of the wirings BL connected to one wiring GBL is k (k is an integer of 2 or more), the number of the wirings GBL is j/k.

<Configuration Example of Sense Amplifier>

Next, a specific configuration example of the sense amplifier SA of one embodiment of the present invention will be described.

Figure 15:
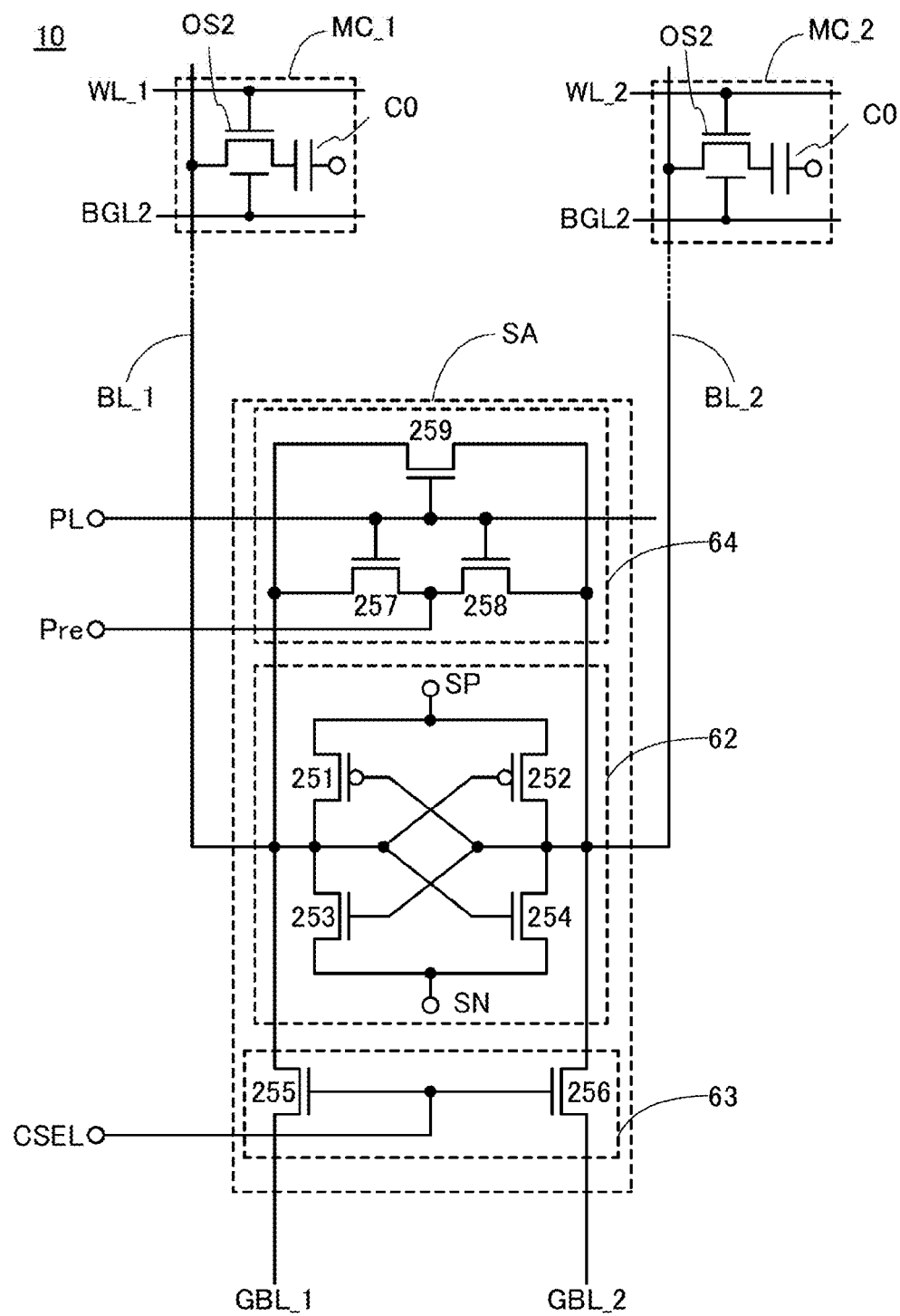
FIG. 15 is a circuit diagram illustrating a configuration example of a sense amplifier circuit.

FIG. 15 illustrates an example of a circuit configuration of the memory cells MC and the sense amplifier SA electrically connected to the memory cells MC. The memory cells MC are connected to the sense amplifier SA through the wirings BL. In the example shown here, a memory cell MC_1 is connected to the sense amplifier SA through the wiring BL_1, and a memory cell MC_2 is connected to the sense amplifier SA through the wiring BL_2.

In the example of FIG. 15, one memory cell MC_1 is connected to the wiring BL_1; however, a plurality of memory cells MC_1 may be connected to the wiring BL_1. In a similar manner, a plurality of memory cells MC_2 may be connected to the wiring BL_2.

The sense amplifier SA includes the amplifier circuit 62, the switch circuit 63, and a precharge circuit 64.

The amplifier circuit 62 includes p-channel transistors 251 and 252 and n-channel transistors 253 and 254. One of a source and a drain of the transistor 251 is connected to a wiring SP, and the other thereof is connected to a gate of the transistor 252, a gate of the transistor 254, and the wiring BL_1. One of a source and a drain of the transistor 253 is connected to the gate of the transistor 252, the gate of the transistor 254, and the wiring BL_1, and the other thereof is connected to a wiring SN. One of a source and a drain of the transistor 252 is connected to the wiring SP, and the other thereof is connected to a gate of the transistor 251, a gate of the transistor 253, and the wiring BL_2. One of a source and a drain of the transistor 254 is connected to the gate of the transistor 251, the gate of the transistor 253, and the wiring BL_2, and the other thereof is connected to the wiring SN. The amplifier circuit 62 has a function of amplifying the potential of the wiring BL_1 and the potential of the wiring BL_2. In FIG. 15, the sense amplifier SA including the amplifier circuit 62 functions as a latch sense amplifier.

The switch circuit 63 includes n-channel transistors 255 and 256. The transistors 255 and 256 may be p-channel transistors. One of a source and a drain of the transistor 255 is connected to the wiring BL_1, and the other thereof is connected to the wiring GBL_1. One of a source and a drain of the transistor 256 is connected to the wiring BL_2, and the other thereof is connected to the wiring GBL_2. Gates of the transistor 255 and the transistor 256 are connected to the wiring CSEL. The switch circuit 63 has a function of controlling electrical connection between the wiring BL_1 and the wiring GBL_1 and electrical connection between the wiring BL_2 and the wiring GBL_2 on the basis of a potential supplied to the wiring CSEL.

The precharge circuit 64 includes n-channel transistors 257, 258, and 259. The transistors 257, 258, and 259 may be p-channel transistors. One of a source and a drain of the transistor 257 is connected to the wiring BL_1, and the other thereof is connected to a wiring Pre. One of a source and a drain of the transistor 258 is connected to the wiring BL_2, and the other thereof is connected to the wiring Pre. One of a source and a drain of the transistor 259 is connected to the wiring BL_1, and the other thereof is connected to the wiring BL_2. A gate of the transistor 257, a gate of the transistor 258, and a gate of the transistor 259 are connected to a wiring PL. The precharge circuit 64 has a function of initializing the potentials of the wiring BL_1 and the wiring BL_2.

The amplifier circuit 62, the switch circuit 63, and the precharge circuit 64 are preferably positioned so as to overlap with the memory cells MC.

<Operation Example of Sense Amplifier>

Next, operation examples of the memory cells MC and the sense amplifier SA illustrated in FIG. 15 in data reading will be described with reference to a timing chart of FIG. 16.

First, in a period T1, the transistors 257 to 259 included in the precharge circuit 64 are turned on, so that the potentials of the wirings BL_1 and BL_2 are initialized. Specifically, a high-level potential VH_PL is supplied to the wiring PL, whereby the transistors 257 to 259 in the precharge circuit 64 are turned on. Accordingly, a potential Vpre of the wiring Pre is supplied to the wirings BL_1 and BL_2. Note that the potential Vpre can be, for example, (VH_SP+VL_SN)/2.

Note that in the period T1, a low-level potential VL_CSEL is supplied to the wiring CSEL, and accordingly, the transistors 255 and 256 in the switch circuit 63 are off. A low-level potential VL_WL is supplied to the wiring WL_1, and accordingly, the transistor OS2 in the memory cell MC_1 is off. The low-level potential VL_WL is also supplied to the wiring WL_2, and accordingly, the transistor OS2 in the memory cell MC_2 is off (not shown in FIG. 16).

The potential Vpre is supplied to the wirings SP and SN, and accordingly, the amplifier circuit 62 is off.

Then, a low-level potential VL_PL is supplied to the wiring PL to turn off the transistors 257 to 259 in the precharge circuit 64. In a period T2, the wiring WL_1 is selected. Specifically, in FIG. 16, a high-level potential VH_WL is supplied to the wiring WL_1 to select the wiring WL_1 and turn on the transistor OS2 in the memory cell MC_1. The wiring BL_1 and the capacitor C0 are thus electrically connected to each other through the transistor OS2. Since the wiring BL_1 and the capacitor C0 are electrically connected to each other, the potential of the wiring BL_1 changes according to the amount of charge held in the capacitor C0.

Figure 16:
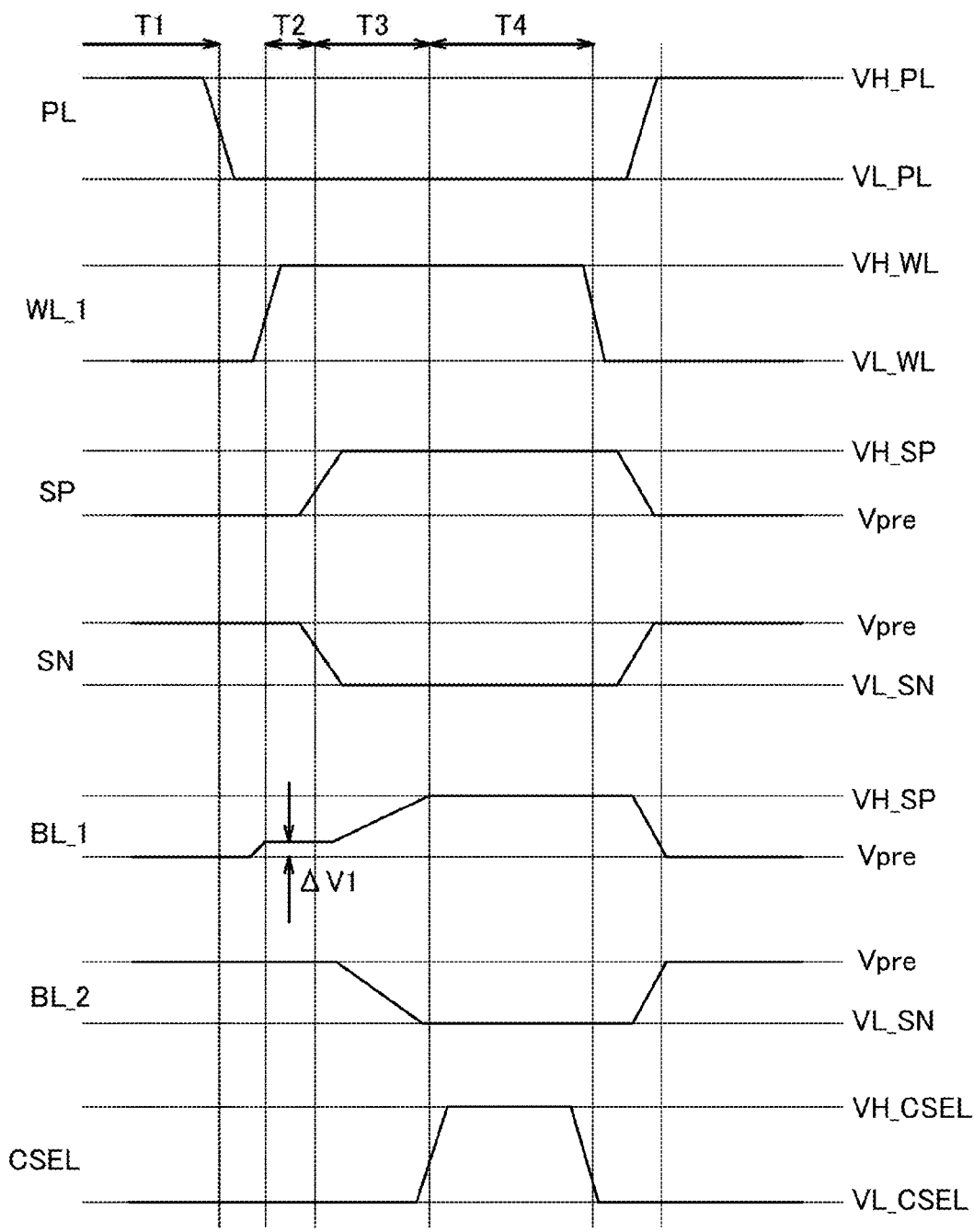
FIG. 16 is a timing chart showing an operation example of a sense amplifier circuit.

The timing chart in FIG. 16 shows, as an example, the case where the amount of charge accumulated in the capacitor C0 is large. Specifically, in the case where the amount of charge accumulated in the capacitor C0 is large, charge is released from the capacitor C0 to the wiring BL_1, so that the potential of the wiring BL_1 rises from the potential Vpre by ΔV1. In the case where the amount of charge accumulated in the capacitor C0 is small, charge flows from the wiring BL_1 into the capacitor C0, so that the potential of the wiring BL_1 falls by AV2.

Note that in the period T2, the low-level potential VL_CSEL is kept supplied to the wiring CSEL, and thus the transistors 255 and 256 in the switch circuit 63 remain off. The potential Vpre is kept supplied to the wirings SP and SN, and thus the sense amplifier SA remains off.

In a period T3, the high-level potential VH_SP is supplied to the wiring SP and the low-level potential VL_SN is supplied to the wiring SN, whereby the amplifier circuit 62 is turned on. The amplifier circuit 62 has a function of amplifying the potential difference between the wirings BL_1 and BL_2 (AV1 in FIG. 16). Accordingly, in the timing chart in FIG. 16, the amplifier circuit 62 is turned on, whereby the potential of the wiring BL_1 rises from the potential Vpre+ΔV1 to approach the potential VH_SP of the wiring SP. The potential of the wiring BL_2 falls from the potential Vpre to approach the potential VL_SN of the wiring SN.

Note that in the case where the potential of the wiring BL_1 is Vpre-ΔV2 at the beginning of the period T3, the amplifier circuit 62 is turned on, whereby the potential of the wiring BL_1 falls from the potential Vpre-ΔV2 to approach the potential VL_SN of the wiring SN. The potential of the wiring BL_2 rises from the potential Vpre to approach the potential VH_SP of the wiring SP.

In the period T3, the low-level potential VL_PL is kept supplied to the wiring PL to keep the transistors 257 to 259 in the precharge circuit 64 off. The low-level potential VL_CSEL is kept supplied to the wiring CSEL, thereby keeping the transistors 255 and 256 in the switch circuit 63 off. The high-level potential VH_WL is kept supplied to the wiring WL_1; thus, the transistor OS2 in the memory cell MC_1 remains on. Consequently, charge corresponding to the potential VH_SP of the wiring BL_1 is accumulated in the capacitor C0 in the memory cell MC_1.

Next, in a period T4, the potential supplied to the wiring CSEL is changed to turn on the switch circuit 63. Specifically, in FIG. 16, a high-level potential VH_CSEL is supplied to the wiring CSEL, so that the transistors 255 and 256 in the switch circuit 63 are turned on. Accordingly, the potential of the wiring BL_1 is supplied to the wiring GBL_1, and the potential of the wiring BL_2 is supplied to the wiring GBL_2.

In the period T4, the low-level potential VL_PL is still supplied to the wiring PL, so that the transistors 257 to 259 in the precharge circuit 64 remain off. The high-level potential VH_WL is kept supplied to the wiring WL_1; thus, the transistor OS2 in the memory cell MC_1 remains on. The high-level potential VH_SP is kept supplied to the wiring SP and the low-level potential VL_SN is kept supplied to the wiring SN; thus, the amplifier circuit 62 remains on. As a result, charge corresponding to the potential VH_SP of the wiring BL_1 is accumulated in the capacitor C0 in the memory cell MC_1.

When the period T4 is over, the potential supplied to the wiring CSEL is changed to turn off the switch circuit 63. Specifically, in FIG. 16, the low-level potential VL_CSEL is supplied to the wiring CSEL, so that the transistors 255 and 256 in the switch circuit 63 are turned off.

Furthermore, when the period T4 is over, the wiring WL_1 is deselected. Specifically, in FIG. 16, the low-level potential VL_WL is supplied to the wiring WL_1, whereby the wiring WL_1 is deselected to turn off the transistor OS2 in the memory cell MC_1. Through the operation, charge corresponding to the potential VH_SP of the wiring BL_1 is held in the capacitor C0; thus, data is held in the memory cell MC_1 even after the data is read out.

Through the operation in the periods T1 to T4, data is read from the memory cell MC_1. Data in the memory cell MC_2 can be read similarly.

Note that data can be written to the memory cell MC on the basis of the above principle. Specifically, as in the case where data is read, first, the transistors 257 to 259 in the precharge circuit 64 are temporarily turned on to initialize the potentials of the wirings BL_1 and BL_2. Then, the wiring WL_1 connected to the memory cell MC_1 to which data is to be written or the wiring WL_2 connected to the memory cell MC_2 to which data is to be written is selected to turn on the transistor OS2 in the memory cell MC_1 or MC_2. The wiring BL_1 or BL_2 and the capacitor C0 are thus electrically connected to each other through the transistor OS2. Then, the high-level potential VH_SP is supplied to the wiring SP and the low-level potential VL_SN is supplied to the wiring SN to turn on the amplifier circuit 62. The potential supplied to the wiring CSEL is then changed to turn on the switch circuit 63. Specifically, the high-level potential VH_CSEL is supplied to the wiring CSEL, so that the transistors 255 and 256 in the switch circuit 63 are turned on. Consequently, the wirings BL_1 and GBL_1 are electrically connected to each other and the wirings BL_2 and GBL_2 are electrically connected to each other. Writing potentials are supplied to the wirings GBL_1 and GBL_2, whereby the writing potentials are supplied to the wirings BL_1 and BL_2 through the switch circuit 63. Consequently, charge is accumulated in the capacitor C0 according to the potential of the wiring BL_1 or BL_2 and thus data is written to the memory cell MC_1 or MC_2.

Note that after the potential of the wiring GBL_1 is supplied to the wiring BL_1 and the potential of the wiring GBL_2 is supplied to the wiring BL_2, the relation in level between the potential of the wiring BL_1 and the potential of the wiring BL_2 is maintained by the amplifier circuit 62 as long as the sense amplifier SA is on even after the transistors 255 and 256 in the switch circuit 63 are turned off. Therefore, the timing of turning off the transistors 255 and 256 in the switch circuit 63 may be either before or after the wiring WL_1 is selected.

<<Structure Example 2 of Semiconductor Device>>

Next, another structure example of a semiconductor device of one embodiment of the present invention will be described.

Figure 17:
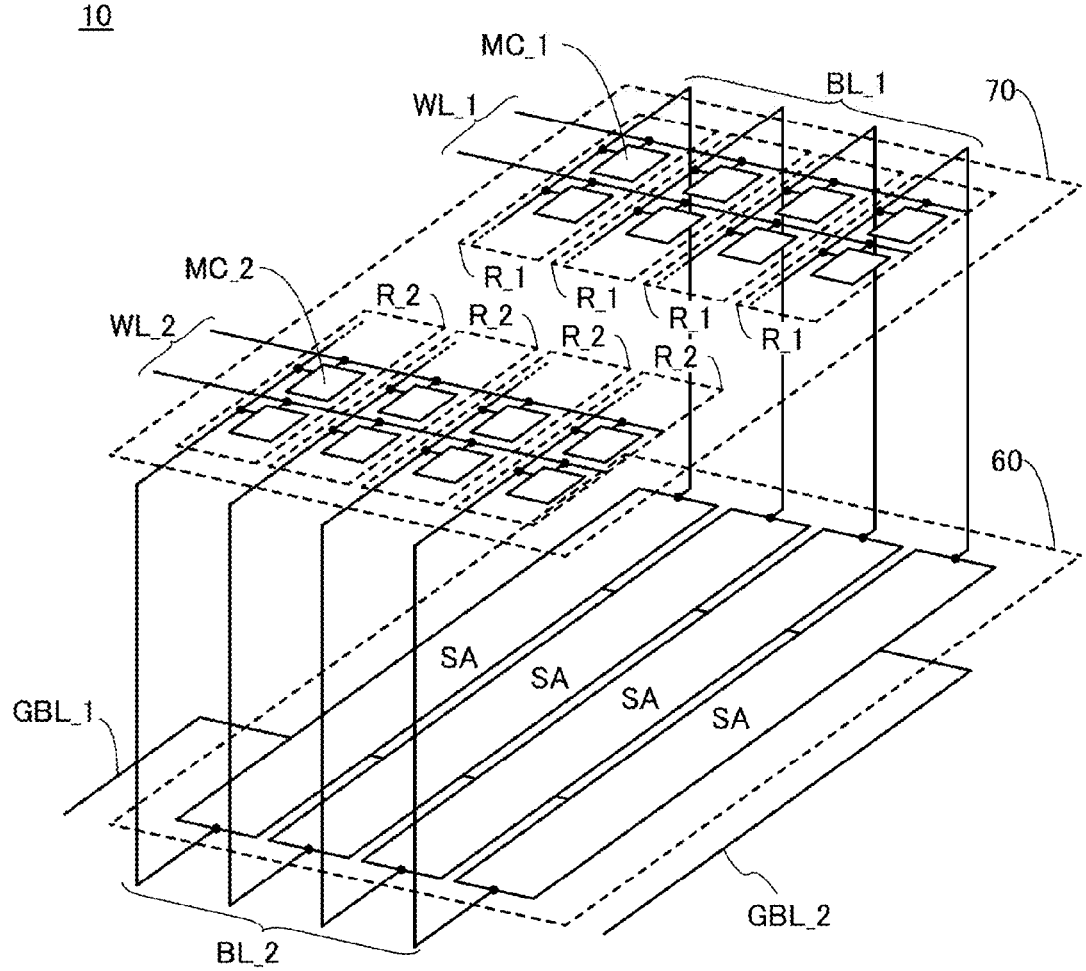
FIG. 17 is a block diagram illustrating a structure example of a semiconductor device.
Figure 18:
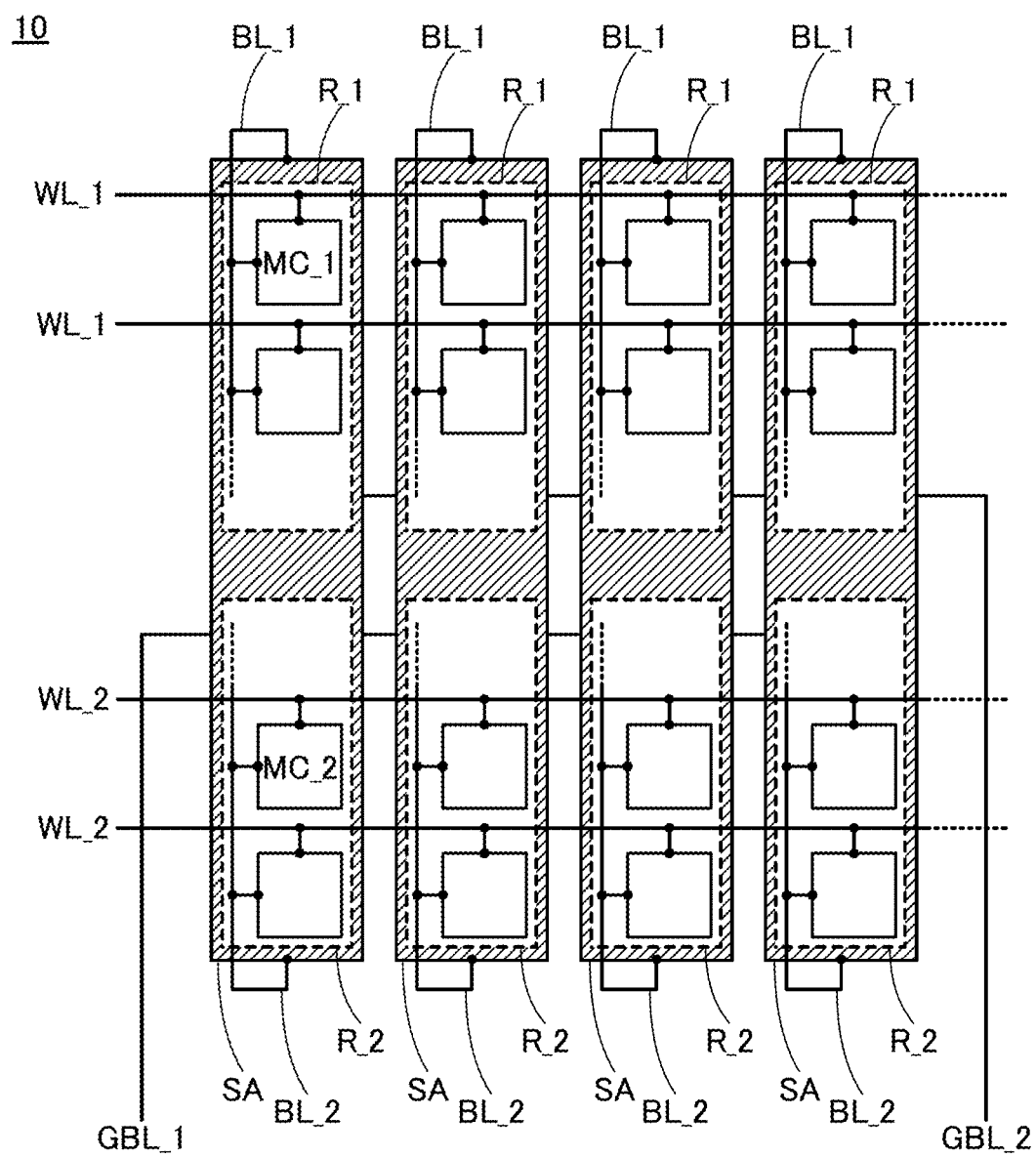
FIG. 18 is a block diagram illustrating a structure example of a semiconductor device.

FIG. 17 illustrates a structure example of the semiconductor device 10. FIG. 18 is a top view of the semiconductor device 10 illustrated in FIG. 17. Like the semiconductor device 10 illustrated in FIG. 13A, the semiconductor device 10 illustrated in FIG. 17 and FIG. 18 has a structure in which the memory cells MC are stacked over the sense amplifiers SA. The semiconductor device 10 includes the cell array 70 having an open-type layout.

The semiconductor device 10 in FIG. 17 and FIG. 18 includes four sets of one sense amplifier SA positioned in a first layer and a plurality of memory cells MC_1 and a plurality of memory cells MC_2 which are connected to the sense amplifier SA and are positioned in a second layer. Note that the number of sets included in the semiconductor device 10 of one embodiment of the present invention may be one, two, three, or more than four.

In FIG. 17 and FIG. 18, a region R_1 including the plurality of memory cells MC_1 and a region R_2 including the plurality of memory cells MC_2 overlap with one sense amplifier SA connected to the plurality of memory cells MC_1 and the plurality of memory cells MC_2.

In FIG. 17 and FIG. 18, the sense amplifier SA is connected to the wiring BL_1 and the wiring BL_2. The plurality of memory cells MC_1 in one region R_1 are connected to the same wiring BL_1. The plurality of memory cells MC_2 in one region R_2 are connected to the same wiring BL_2.

The plurality of wirings WL_1 are shared by four regions R_1, and the plurality of wirings WL_2 are shared by four regions R_2. Specifically, one wiring WL_1 is connected to four memory cells MC_1, and one wiring WL_2 is connected to four memory cells MC_2.

Since the cell array 70 in FIG. 17 and FIG. 18 has an open-type layout, the wirings BL_1 do not intersect with the wirings WL_2, and the wirings BL_2 do not intersect with the wirings WL_1. Each of the sense amplifiers SA is connected to the wiring GBL_1 and the wiring GBL_2.

With such a configuration, the occupied area of the semiconductor device 10 can be reduced, and the storage capacity per unit area of the semiconductor device 10 can be increased.

Embodiment 3

In this embodiment, examples of a voltage generation circuit that can be used in the semiconductor device described in the above embodiment will be described with reference to FIGS. 19A and 19B, FIGS. 20A and 20B, FIGS. 21A and 21B, FIGS. 22A to 22C, FIGS. 23A and 23B, FIGS. 24A to 24C, and FIGS. 25A and 25B.

Figure 19A:
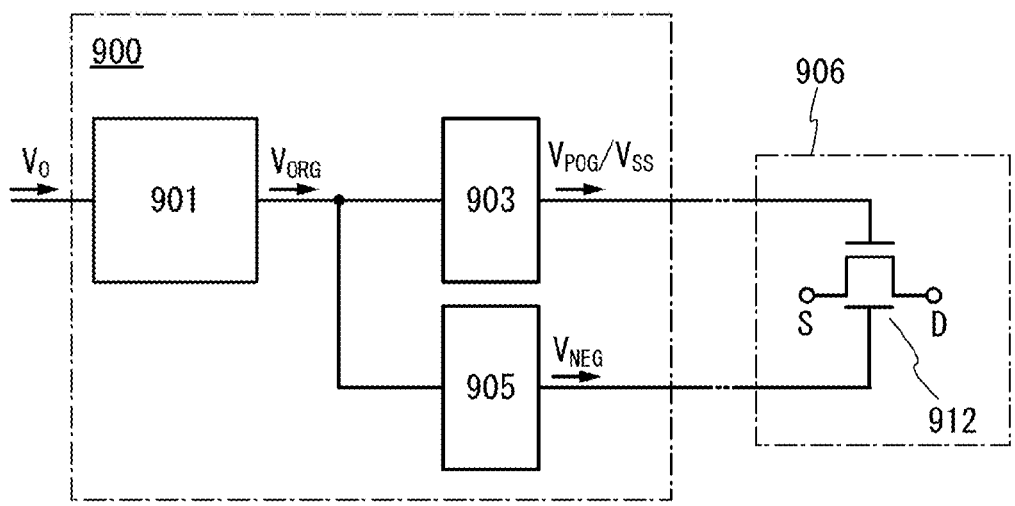
FIGS. 19A and 19B are a circuit diagram and a waveform diagram of a semiconductor device including a voltage generation circuit.

FIG. 19A is a block diagram of a circuit 900. The circuit 900 includes a power supply circuit 901, a voltage generation circuit 903, and a voltage generation circuit 905.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the circuit 900. The circuit 900 can generate the voltage $V_{ORG}$ on the basis of one power supply voltage supplied from the outside. Therefore, the circuit 900 can operate without supply of a plurality of power supply voltages from the outside.

A circuit 906 operates with different power supply voltages. For example, the power supply voltages of the circuit 906 are voltages applied on the basis of the voltage $V_{ORG}$, a voltage $V_{POG}$, a voltage $V_{SS}$, and a voltage $V_{NEG}$ ($V_{POG} > V_{ORG} > V_{SS} > V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901.

Figure 19B:
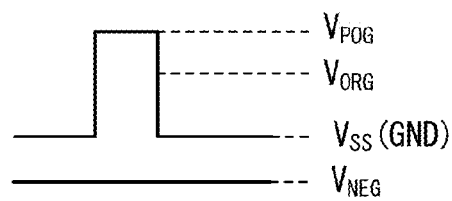

FIG. 19B illustrates an example of a waveform of a signal for operating the circuit 906.

The circuit 906 includes a transistor 912. Note that the OS transistor (the transistor OS1 or the transistor OS2) described in the above embodiment is assumed as the transistor 912.

A signal supplied to a gate of the transistor 912 is generated on the basis of, for example, the voltage $V_{POG}$ and the voltage $V_{SS}$. The signal is generated on the basis of the voltage $V_{POG}$ at a time when the transistor 912 is turned on and on the basis of the voltage $V_{SS}$ at a time when the transistor 912 is turned off. As shown in FIG. 19B, the voltage $V_{POG}$ is higher than the voltage $V_{ORG}$. Therefore, a conduction state between a source (S) and a drain (D) of the transistor 912 can be obtained more surely. As a result, the frequency of malfunction of the circuit 906 can be reduced.

A signal supplied to a back gate of the transistor 912 is generated on the basis of the voltage $V_{NEG}$. As shown in FIG. 19B, the voltage $V_{NEG}$ is lower than the voltage $V_{SS}$ (GND). Therefore, the threshold voltage of the transistor 912 can be controlled so as to shift in the positive direction. Thus, the transistor 912 can be surely turned off and the amount of current flowing between the source (S) and the drain (D) can be small. As a result, the frequency of malfunction of the circuit 906 can be reduced and the power consumption thereof can be reduced.

Figure 20A:
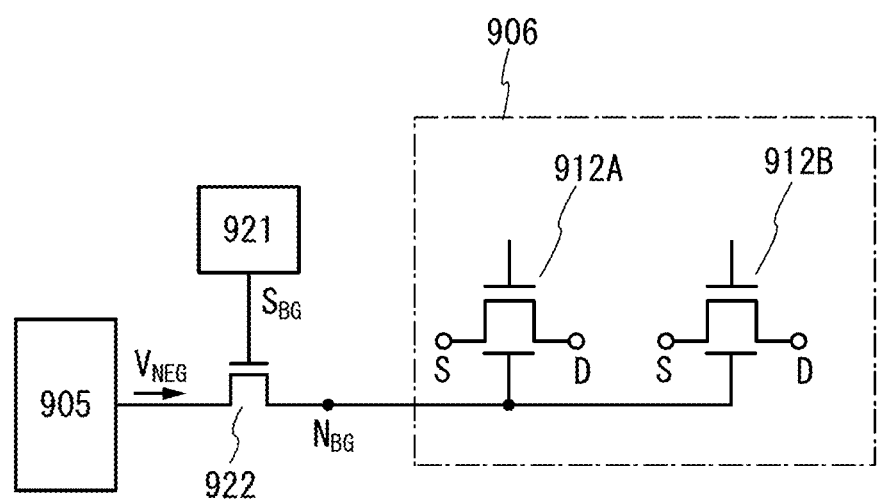
FIGS. 20A and 20B are a circuit diagram and a timing chart of a semiconductor device including a voltage generation circuit.
Figure 20B:
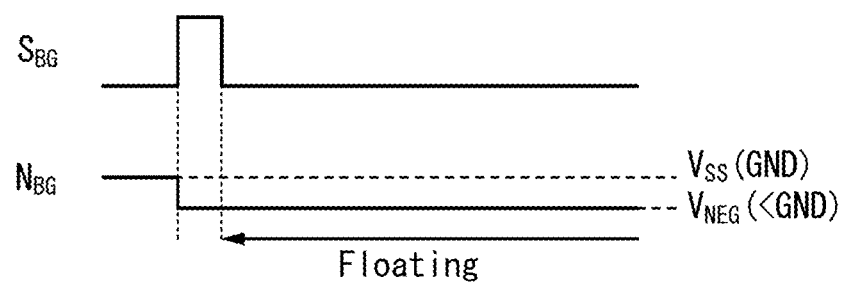

FIGS. 20A and 20B illustrate a modification example of the circuit 900.

In a circuit diagram illustrated in FIG. 20A, a transistor 922 whose conduction state can be controlled by a control circuit 921 is provided between the voltage generation circuit 905 and the circuit 906. The transistor 922 is an n-channel OS transistor. A control signal $S_{BG}$ output from the control circuit 921 is a signal for controlling the conduction state of the transistor 922. Transistors 912A and 912B included in the circuit 906 are OS transistors like the transistor 922.

A timing chart in FIG. 20B shows changes in the potential of the control signal $S_{BG}$ and the potential of a node $N_{BG}$. The potential of the node $N_{BG}$ indicates the states of potentials of back gates of the transistors 912A and 912B. When the control signal $S_{BG}$ is at high level, the transistor 922 is turned on and the voltage of the node $N_{BG}$ becomes the voltage $V_{NEG}$. Then, when the control signal $S_{BG}$ is at low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 21A:
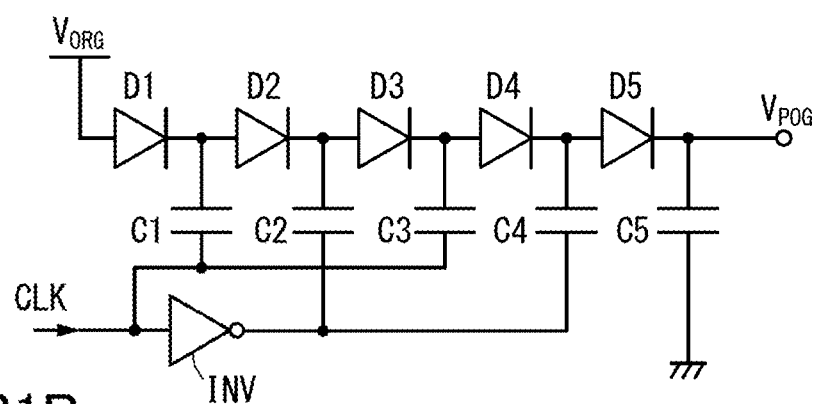
FIGS. 21A and 21B are circuit diagrams each illustrating a configuration example of a voltage generation circuit.

FIG. 21A illustrates an example of a circuit configuration applicable to the voltage generation circuit 903 described above. The voltage generation circuit 903 illustrated in FIG.

21A is a five-stage charge pump including diodes D1 to D5, capacitors C1 to C5, and an inverter INV. A clock signal CLK is supplied to the capacitors C1 to C5 directly or through the inverter INV. When the power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that the forward voltage of the diodes D1 to D5 is 0 V. A desired voltage $V_{POG}$ can be obtained by changing the number of stages of the charge pump.

Figure 21B:
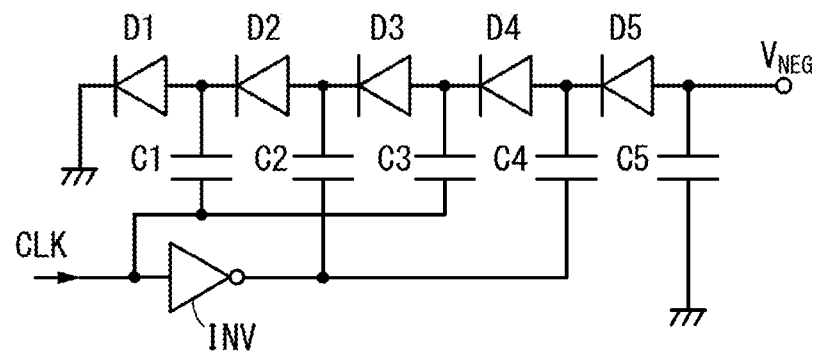

FIG. 21B illustrates an example of a circuit configuration applicable to the voltage generation circuit 905 described above. The voltage generation circuit 905 illustrated in FIG. 21B is a four-stage charge pump including the diodes D1 to D5, the capacitors C1 to C5, and the inverter INV. The clock signal CLK is supplied to the capacitors C1 to C5 directly or through the inverter INV. When the power supply voltage of the inverter INV is a voltage applied on the basis of the voltage $V_{ORG}$ and the voltage $V_{SS}$, the voltage $V_{NEG}$, which has been reduced from the ground voltage, i.e., the voltage $V_{SS}$ to a negative voltage having a negatively quadrupled value of the voltage $V_{ORG}$ by application of the clock signal CLK, can be obtained. Note that the forward voltage of the diodes D1 to D5 is 0 V. A desired voltage $V_{NEG}$ can be obtained by changing the number of stages of the charge pump.

The circuit configuration of the voltage generation circuit 903 is not limited to the configuration of the circuit diagram illustrated in FIG. 21A. Modification examples of the voltage generation circuit 903 are shown in FIGS. 22A to 22C and FIGS. 23A and 23B.

Figure 22A:
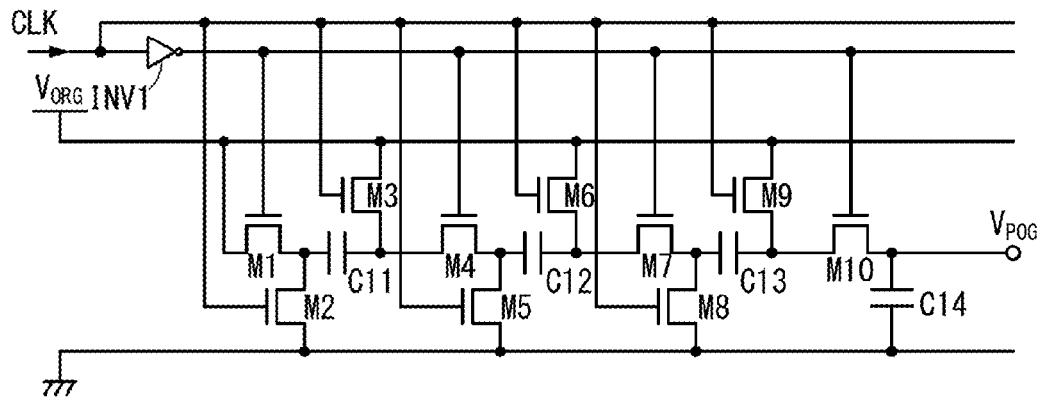
FIGS. 22A to 22C are circuit diagrams each illustrating a configuration example of a voltage generation circuit.

The voltage generation circuit 903A illustrated in FIG. 22A includes transistors M1 to M10, capacitors C11 to C14, and an inverter INV1. The clock signal CLK is supplied to gates of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. A desired voltage $V_{POG}$ can be obtained by changing the number of stages. In the voltage generation circuit 903A in FIG. 22A, the off-state current of each of the transistors M1 to M10 can be small when the transistors M1 to M10 are OS transistors, and the leakage of charge held in the capacitors C11 to C14 can be reduced. Accordingly, an efficient increase in voltage from the voltage $V_{ORG}$ to the voltage $V_{POG}$ can be achieved.

Figure 22B:
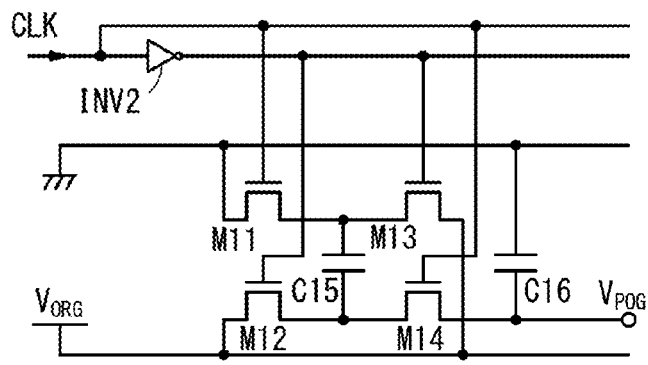

The voltage generation circuit 903B illustrated in FIG. 22B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 903B in FIG. 22B, the off-state current of each of the transistors M11 to M14 can be small when the transistors M11 to M14 are OS transistors, and the leakage of charge held in the capacitors C15 and C16 can be reduced. Accordingly, an efficient increase in voltage from the voltage $V_{ORG}$ to the voltage $V_{POG}$ can be achieved.

Figure 22C:
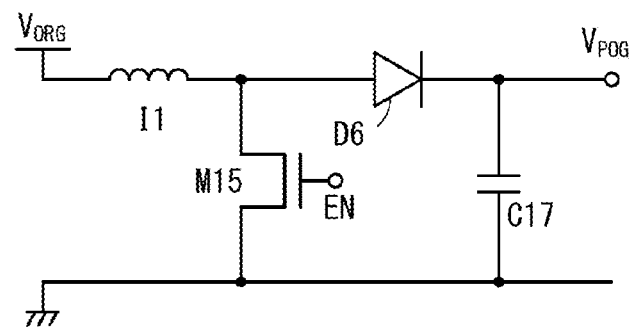

The voltage generation circuit 903C in FIG. 22C includes an inductor I1, a transistor M15, a diode D6, and a capacitor C17. The conduction state of the transistor M15 is controlled by a control signal EN. Owing to the control signal EN, the voltage $V_{POG}$, which has been increased from the voltage $V_{ORG}$, can be obtained. Since the voltage generation circuit 903C in FIG. 22C increases the voltage using the inductor I1, the voltage can be increased efficiently.

Figure 23A:
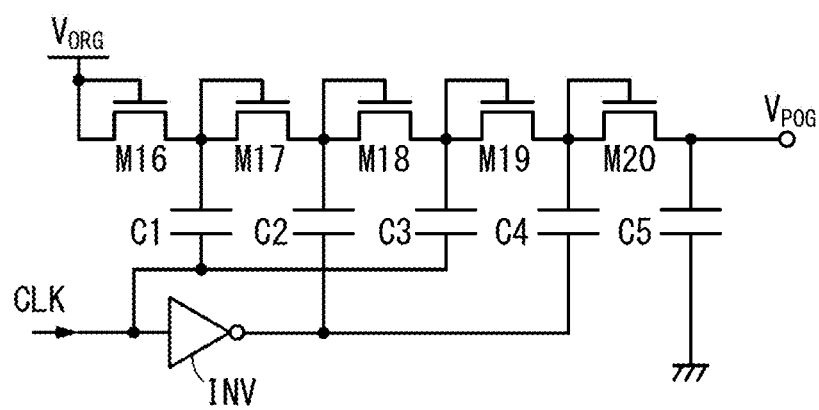
FIGS. 23A and 23B are circuit diagrams each illustrating a configuration example of a voltage generation circuit.

A voltage generation circuit 903D illustrated in FIG. 23A has a configuration in which the diodes D1 to D5 in the voltage generation circuit 903 illustrated in FIG. 21A are replaced by diode-connected transistors M16 to M20. In the voltage generation circuit 903D illustrated in FIG. 23A, OS transistors are used as the transistors M16 to M20, and thus the off-state current of the transistors M16 to M20 can be smaller and the leakage of charge held in the capacitors C1 to C5 can be reduced. Accordingly, an efficient increase in voltage from the voltage $V_{ORG}$ to the voltage $V_{POG}$ can be achieved.

Figure 23B:
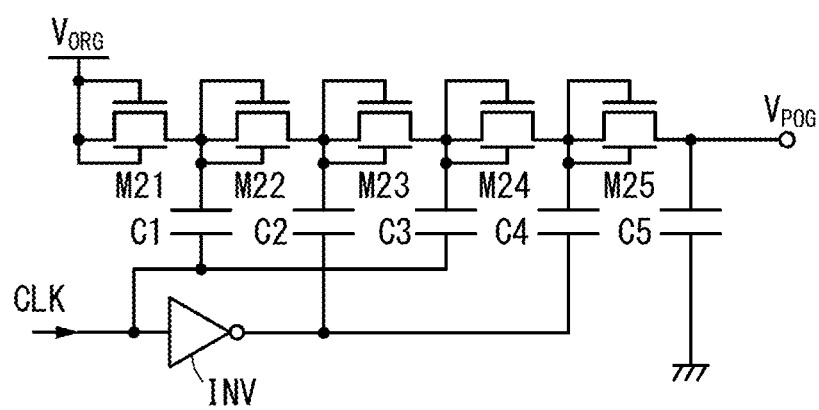

A voltage generation circuit 903E illustrated in FIG. 23B has a configuration in which the transistors M16 to M20 in the voltage generation circuit 903D illustrated in FIG. 23A are replaced by transistors M21 to M25 having back gates. In the voltage generation circuit 903E illustrated in FIG. 23B, the back gates can be supplied with the same voltages as the respective gates, and thus the amount of current flowing through the transistors can be increased. Accordingly, an efficient increase in voltage from the voltage $V_{ORG}$ to the voltage $V_{POG}$ can be achieved.

Figure 24A:
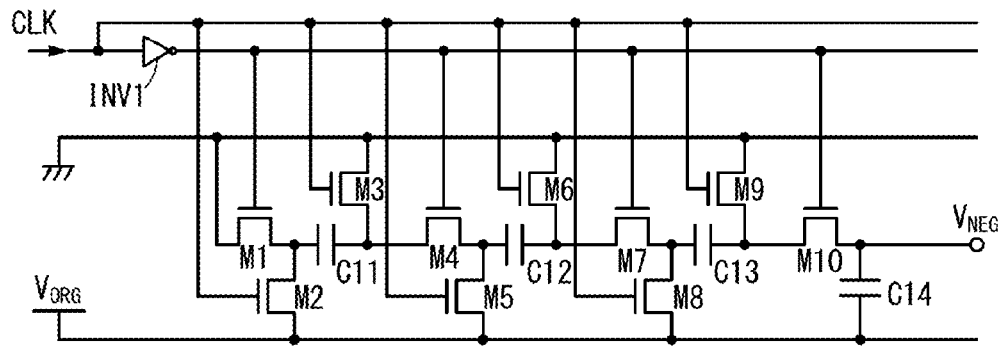
FIGS. 24A to 24C are circuit diagrams each illustrating a configuration example of a voltage generation circuit.
Figure 24B:
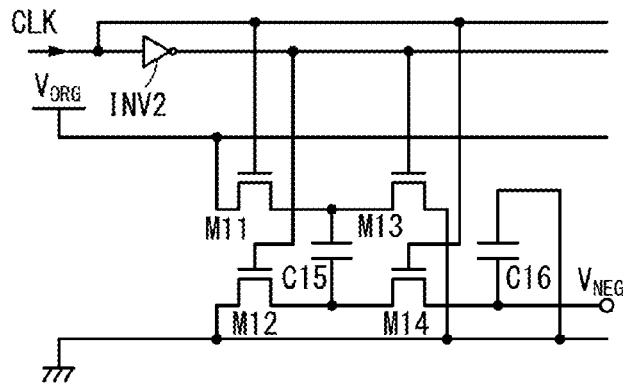
Figure 24C:
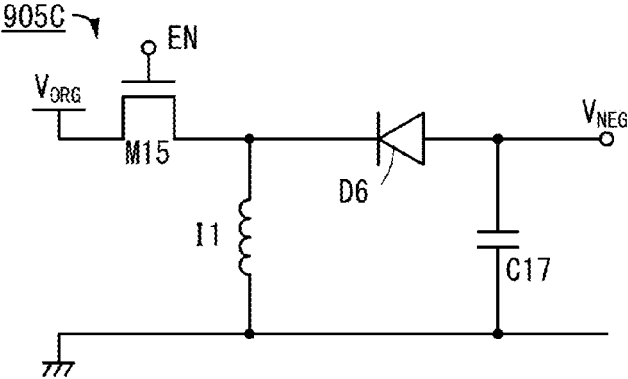
Figure 25A:
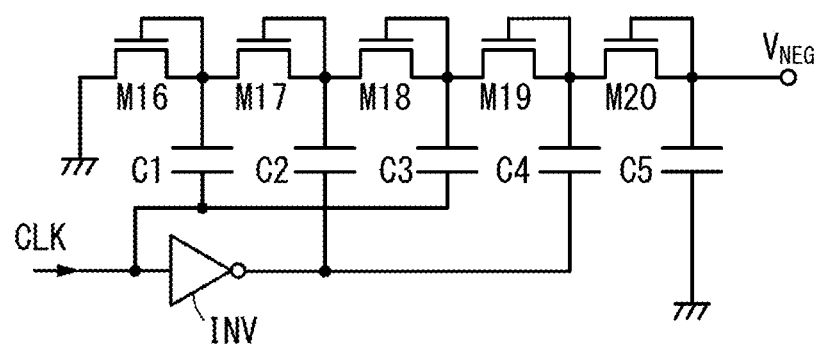
FIGS. 25A and 25B are circuit diagrams each illustrating a configuration example of a voltage generation circuit.
Figure 25B:
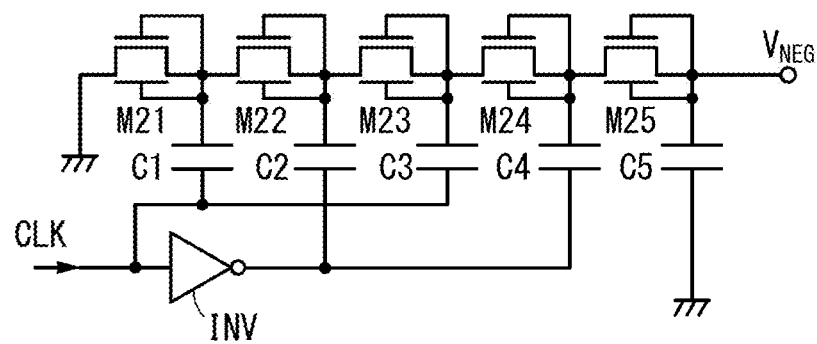

Note that a modification example of the voltage generation circuit 903 can be applied to the voltage generation circuit 905 illustrated in FIG. 21B. Configurations of a circuit diagram in this case are illustrated in FIGS. 24A to 24C and FIGS. 25A and 25B. When a voltage generation circuit 905A illustrated in FIG. 24A is supplied with the clock signal CLK, the voltage $V_{NEG}$, which has been reduced from the voltage $V_{SS}$ to a negative voltage having a negatively tripled value of the voltage $V_{ORG}$, can be obtained. When a voltage generation circuit 905B illustrated in FIG. 24B is supplied with the clock signal CLK, the voltage $V_{NEG}$, which has been reduced from the voltage $V_{SS}$ to a negative voltage having a negatively doubled value of the voltage $V_{ORG}$, can be obtained.

In the voltage generation circuits 905A and 905B and voltage generation circuits 905C to 905E illustrated in FIGS. 24A to 24C and FIGS. 25A and 25B, the voltages supplied to wirings and the positions of elements are different from those in the voltage generation circuits 903A to 903E illustrated in FIGS. 22A to 22C and FIGS. 23A and 23B. In the voltage generation circuits 905A to 905E, an efficient decrease in voltage from the voltage $V_{SS}$ to the voltage $V_{NEG}$ can be achieved.

As described above, in any of the structures of this embodiment, a voltage required for circuits included in a semiconductor device can be internally generated. Thus, in the semiconductor device, the kinds of power supply voltages supplied from the outside can be reduced.

Embodiment 4

In this embodiment, application examples of the semiconductor device or the memory circuit described in the foregoing embodiment to an electronic component will be described with reference to FIGS. 26A and 26B.

Figure 26A:
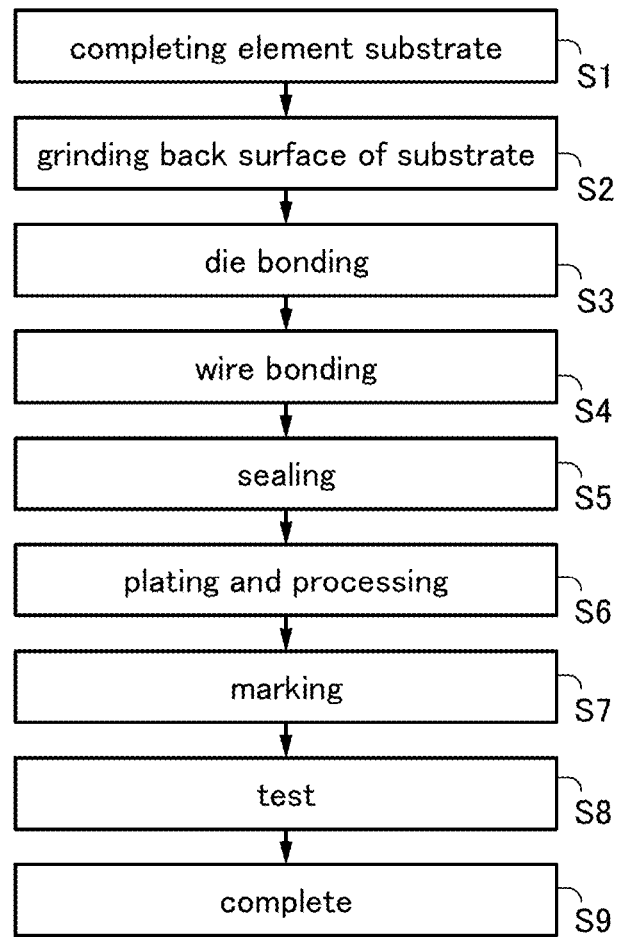
FIGS. 26A and 26B are a flowchart showing a manufacturing process of an electronic component and a schematic perspective view of the electronic component.

FIG. 26A shows an example where the semiconductor device or the memory circuit described in the foregoing embodiment is used to make an electronic component. Note that an electronic component is also referred to as semiconductor package or IC package. This electronic component has a plurality of standards and names depending on a terminal extraction direction and a terminal shape. Thus, examples of the electronic component are described in this embodiment.

A circuit portion including the transistors described in the foregoing embodiment is completed by integrating detachable components on a printed circuit board through an assembly process (post-process).

The post-process can be completed through steps shown in FIG. 26A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate and dividing the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, a chip may be mounted on and bonded to an interposer.

Next, wire bonding for electrically connecting a lead of the lead frame and an electrode on a chip through a metal wire is performed (Step S4). As the metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The aforementioned electronic component includes the semiconductor device or the memory circuit described in the above embodiments. Therefore, the electronic component has reduced power consumption.

Figure 26B:
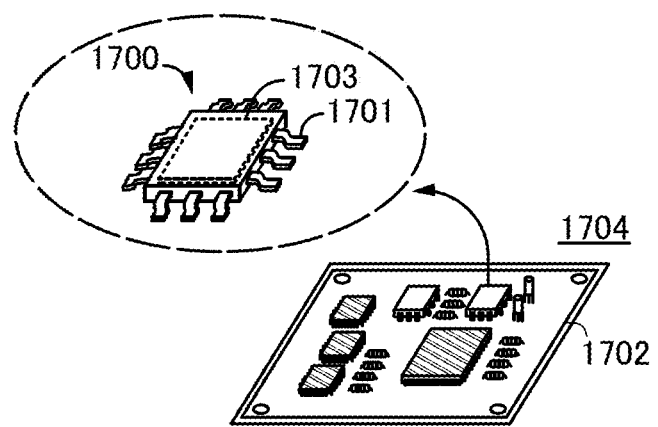

FIG. 26B is a perspective schematic diagram of a completed electronic component. FIG. 26B shows a perspective schematic diagram of a quad flat package (QFP) as an example of the electronic component. An electronic component 1700 shown in FIG. 26B includes a lead 1701 and a circuit portion 1703. The electronic component 1700 in FIG. 26B is, for example, mounted on a printed circuit board 1702. When a plurality of electronic components 1700 are used in combination and electrically connected to each other over the printed circuit board 1702, the electronic components 1700 can be mounted on an electronic device. The completed circuit board 1704 is provided in an electronic device or the like.

Embodiment 5

A semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Furthermore, as electronic devices that can include the semiconductor device of one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 27A to 27F illustrate specific examples of these electronic devices.

Figure 27A:
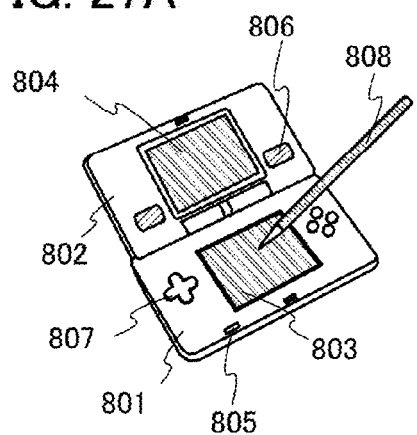
FIGS. 27A to 27F illustrate electronic devices.

FIG. 27A illustrates a portable game machine, which includes housings 801 and 802, display portions 803 and 804, a microphone 805, speakers 806, an operation key 807, a stylus 808, and the like. Although the portable game machine in FIG. 27A has the two display portions 803 and 804, the number of display portions included in the portable game machine is not limited to two.

Figure 27B:
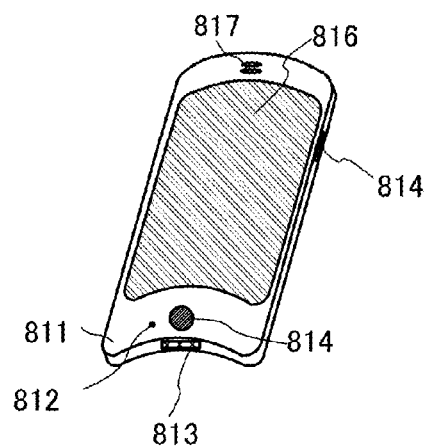

FIG. 27B illustrates a cellular phone, which includes a housing 811, a display portion 816, operation buttons 814, an external connection port 813, a speaker 817, a microphone 812, and the like. When the display portion 816 of the cellular phone illustrated in FIG. 27B is touched with a finger or the like, data can be input. Further, operations such as making a call and inputting a character can be performed by touch on the display portion 816 with a finger or the like. The power can be turned on or off with the operation button 814. In addition, types of images displayed on the display portion 816 can be switched; for example, switching images from a mail creation screen to a main menu screen is performed with the operation button 814.

Figure 27C:
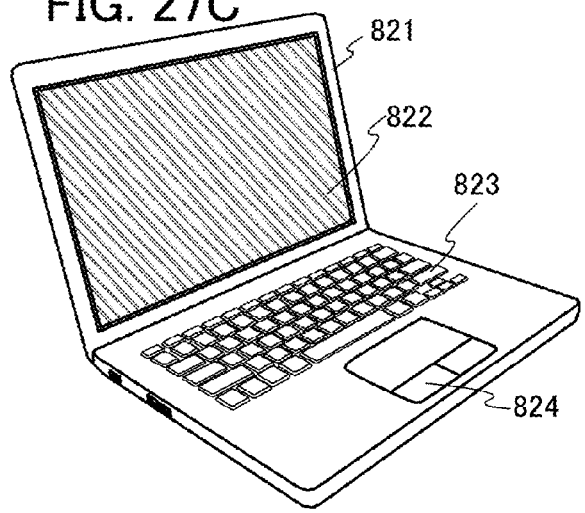

FIG. 27C illustrates a laptop personal computer, which includes a housing 821, a display portion 822, a keyboard 823, a pointing device 824, and the like.

Figure 27D:
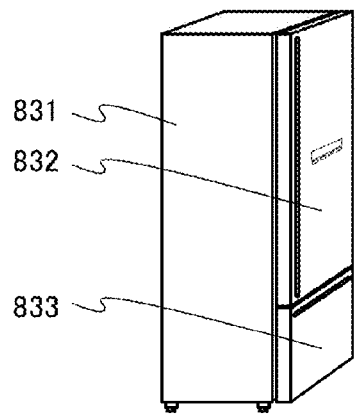

FIG. 27D illustrates an electric refrigerator-freezer, which includes a housing 831, a refrigerator door 832, a freezer door 833, and the like.

Figure 27E:
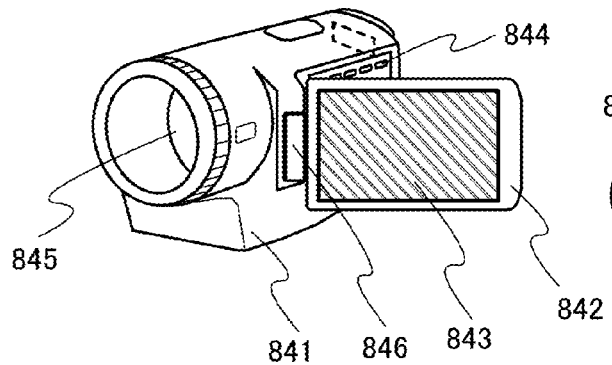

FIG. 27E illustrates a video camera, which includes a first housing 841, a second housing 842, a display portion 843, operation keys 844, a lens 845, a joint 846, and the like. The operation keys 844 and the lens 845 are provided for the first housing 841, and the display portion 843 is provided for the second housing 842. The first housing 841 and the second housing 842 are connected to each other with the joint 846, and the angle between the first housing 841 and the second housing 842 can be changed with the joint 846. Images displayed on the display portion 843 may be switched in accordance with the angle at the joint 846 between the first housing 841 and the second housing 842.

Figure 27F:
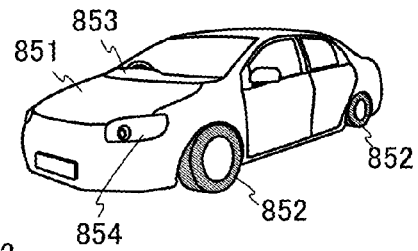

FIG. 27F illustrates a car, which includes a car body 851, wheels 852, a dashboard 853, lights 854, and the like.

Next, an example of use of a display device that can include the semiconductor device of one embodiment of the present invention will be described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be employed, for example.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on current), a plasma display panel (PDP), an electron emitter, a display element including a carbon nanotube, a liquid crystal element, electronic ink, an electrowetting element, an electrophoretic element, a display element using micro electro mechanical systems (MEMS) (e.g., a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), quantum dots, and the like. In addition to that, the display element, the display device, the light-emitting element, or the light-emitting device may include display media whose contrast, luminance, reflectivity, transmittance, or the like is changed by electrical or magnetic effect. Examples of display devices including EL elements include an EL display. Display devices including electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. Examples of display devices including quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the case of a display element including MEMS, a drying agent may be provided in a space where the display element is sealed (or between an element substrate over which the display element is placed and a counter substrate opposed to the element substrate, for example). Providing a drying agent can prevent MEMS and the like from becoming difficult to move or deteriorating easily because of moisture or the like.

Embodiment 6

In this embodiment, the structure of an oxide semiconductor that can be used for the OS transistor described in the above embodiment will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<<CAAC-OS>>

First, a CAAC-OS will be described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an InGaZnO$_4$ crystal that is classified into the space group R-3 m is analyzed by an out-of-plane method, a peak appears at a diffraction angle (2θ) of around 31° as shown in FIG. 28A. This peak is derived from the (009)

plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3 m; thus, this peak is preferably not exhibited in a CAAC-OS.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 28B, a peak is not clearly observed. In contrast, in the case where single crystal InGaZnO$_4$ is subjected to φ scan with 2θ fixed at around 56°, as shown in FIG. 28C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 28D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 28E shows a diffraction pattern obtained in such a manner that an electron beam with a probe diameter of 300 nm is incident on the same sample in a direction perpendicular to the sample surface. As shown in FIG. 28E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 28E is considered to be derived from the (010) plane, the (100) plane, and the like of the InGaZnO$_4$ crystal. The second ring in FIG. 28E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 29A:
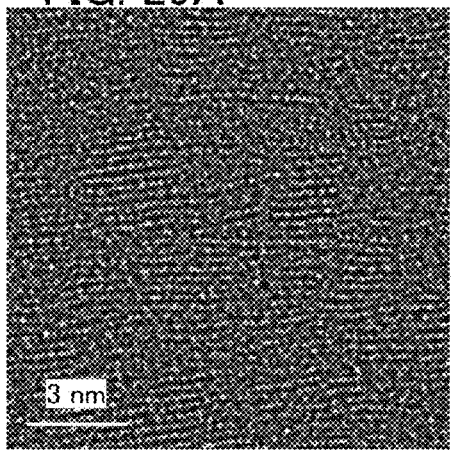
FIGS. 29A to 29E are a cross-sectional TEM image and plan-view TEM images of a CAAC-OS and images obtained through analysis thereof.

FIG. 29A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 29A shows pellets in which metal atoms are arranged in a layered manner. FIG. 29A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 29B:
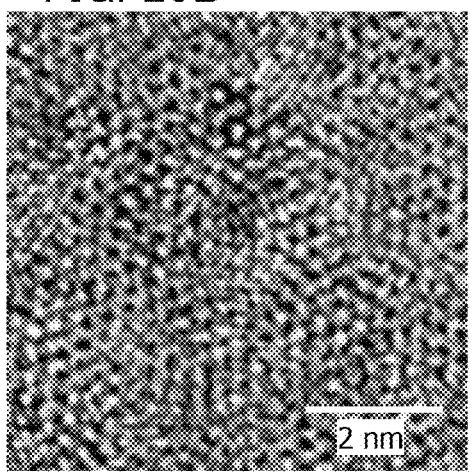
Figure 29C:
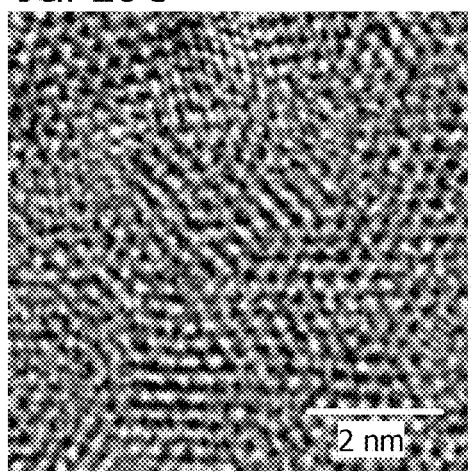
Figure 29D:
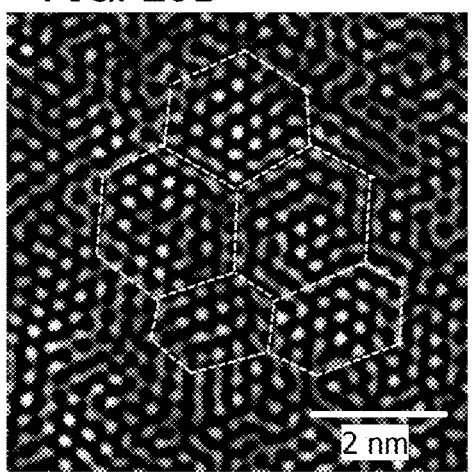
Figure 29E:
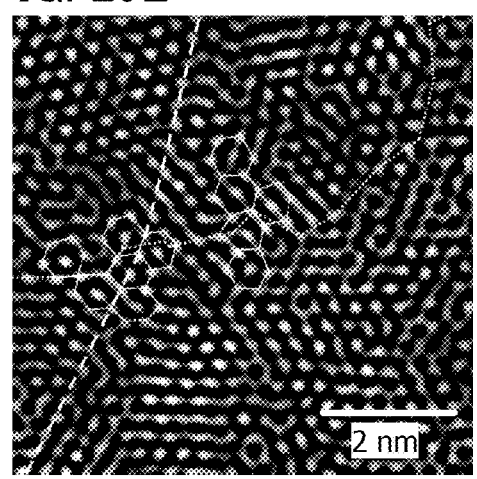

FIGS. 29B and 29C show Cs-corrected high-resolution TEM images of a plane of the CAAC-OS observed from a direction substantially perpendicular to the sample surface. FIGS. 29D and 29E are images obtained through image processing of FIGS. 29B and 29C. The method of image processing is as follows. The image in FIG. 29B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 29D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 29E, a dotted line denotes a portion between a region where a lattice arrangement is well aligned and another region where a lattice arrangement is well aligned, and a dashed line denotes the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in an oxide semiconductor might serve as carrier traps or carrier generation sources, for example. For example, oxygen vacancies in an oxide semiconductor might serve as carrier traps or serve as carrier generation sources when hydrogen is captured therein.

A CAAC-OS having small amounts of impurities and oxygen vacancies is an oxide semiconductor with a low carrier density (specifically, lower than $8 \times 10^{11}/cm^3$, preferably lower than $1 \times 10^{11}/cm^3$, more preferably lower than $1 \times 10^{10}/cm^3$, and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, a CAAC-OS can be referred to as an oxide semiconductor having stable characteristics.

<<nc-OS>>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 30A:
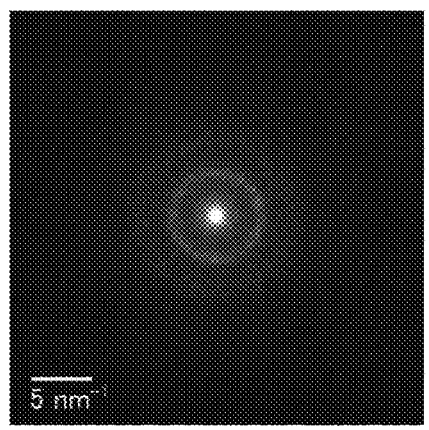
FIGS. 30A to 30D show electron diffraction patterns and a cross-sectional TEM image of an nc-OS.
Figure 30B:
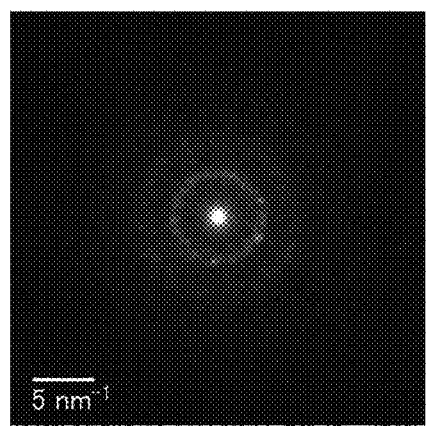

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 30A is observed. FIG. 30B shows a diffraction pattern obtained when an electron beam with a probe diameter of 1 nm is incident on the same sample. As shown in FIG. 30B, a plurality of spots are observed in a ring-like region. In other words, ordering in an nc-OS is not observed with an electron beam with a probe diameter of 50 nm but is observed with an electron beam with a probe diameter of 1 nm.

Figure 30C:
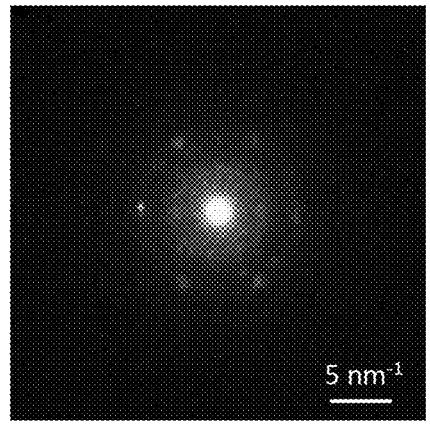

Furthermore, an electron diffraction pattern in which spots are arranged in an approximately hexagonal shape is observed in some cases as shown in FIG. 30C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 30D:
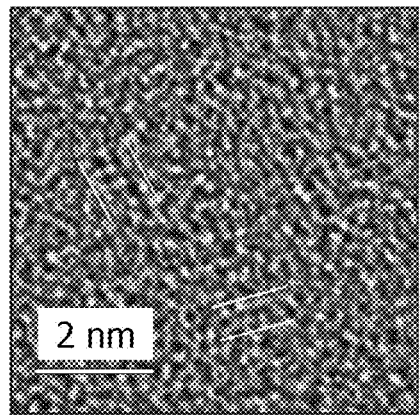

FIG. 30D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 30D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS has a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<<A-Like OS>>

An a-like OS has a structure between those of the nc-OS and the amorphous oxide semiconductor.

Figure 31A:
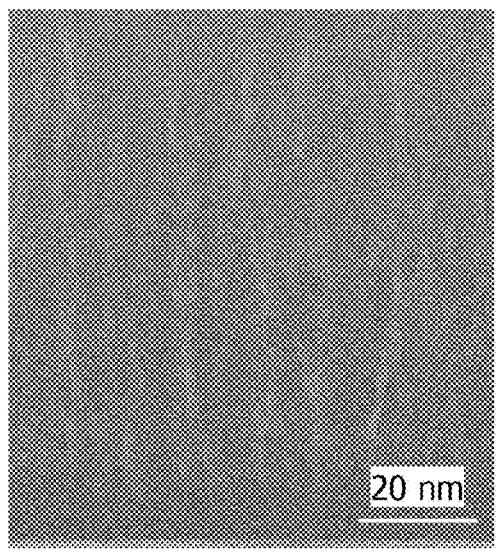
FIGS. 31A and 31B are cross-sectional TEM images of an a-like OS.
Figure 31B:
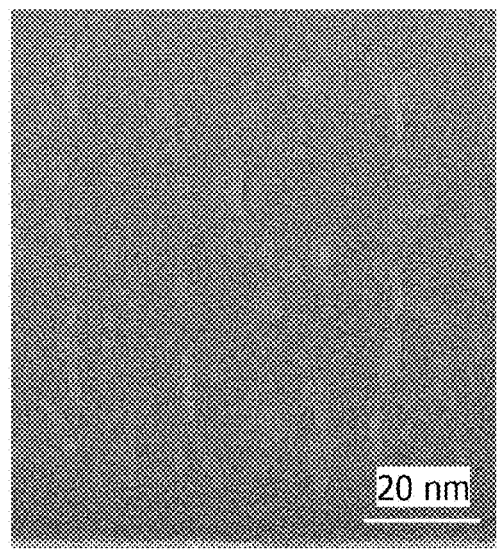

FIGS. 31A and 31B are high-resolution cross-sectional TEM images of an a-like OS. FIG. 31A is the high-resolution cross-sectional TEM image of the a-like OS at the start of the electron irradiation. FIG. 31B is the high-resolution cross-sectional TEM image of the a-like OS after the electron ($e^-$) irradiation at $4.3 \times 10^8$ $e^-/nm^2$. FIGS. 31A and 31B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 32:
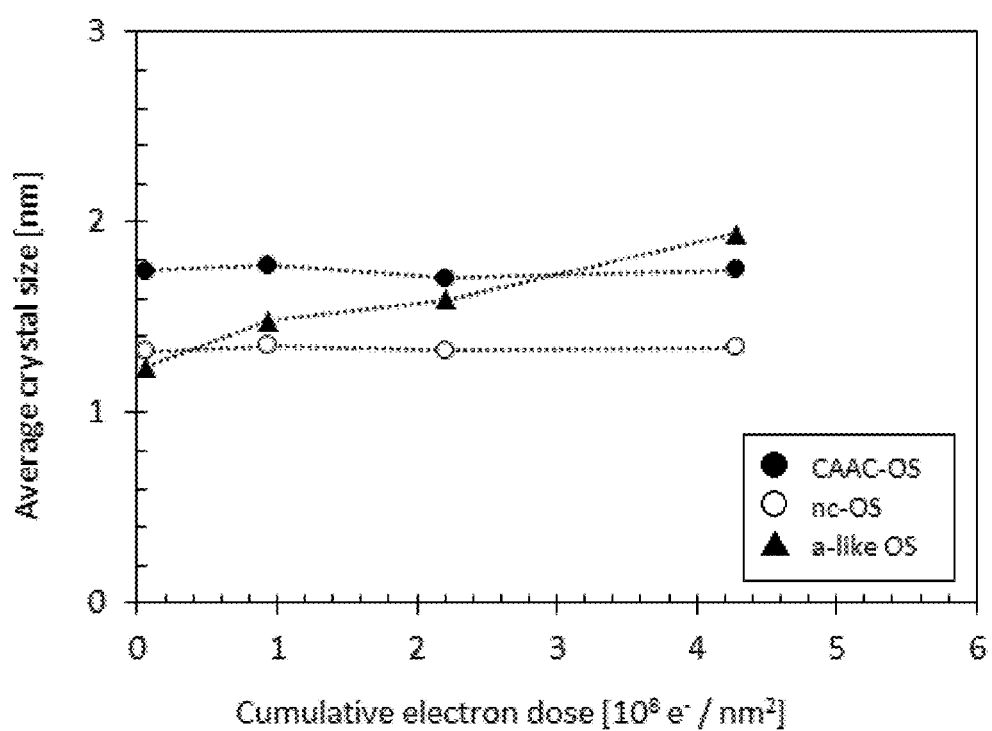
FIG. 32 shows changes in crystal parts of an In—Ga—Zn oxide induced by electron irradiation.

FIG. 32 shows change in the average size of crystal parts (at 22 points to 30 points) in each sample. Note that the crystal part size corresponds to the length of a lattice fringe. FIG. 32 indicates that the crystal part size in the a-like OS increases with an increase in the cumulative electron dose in obtaining TEM images, for example. As shown in FIG. 32, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 32, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

In this specification and the like, terms for describing arrangement, such as "over" and "under", are used for convenience to indicate a positional relation between components with reference to drawings. The positional relation between components is changed as appropriate in accordance with a direction in which the components are described. Therefore, the terms for explaining arrangement are not limited to those used in this specification and may be changed to other terms as appropriate depending on the situation.

Furthermore, in a block diagram in this specification and the like, components are functionally classified and shown by blocks that are independent of each other. However, in an actual circuit and the like, such components are sometimes hard to classify functionally, and there is a case where one circuit is associated with a plurality of functions or a case where a plurality of circuits are associated with one function. Therefore, the segmentation of blocks in a block diagram is not limited by any of the components described in the specification and can be differently determined as appropriate depending on the situation.

In this specification and the like, the terms "one of a source and a drain" (or first electrode or first terminal) and "the other of the source and the drain" (or second electrode or second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and a potential supplied to a wiring or the like is sometimes changed depending on the reference potential.

In this specification and the like, a switch is in a conductive state (on state) or in a non-conductive state (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial no. 2015-150339 filed with Japan Patent Office on Jul. 30, 2015, the entire contents of which are hereby incorporated by reference.

What is claimed is:

1. A semiconductor device comprising:
   a first circuit comprising a first transistor and a second transistor electrically connected to each other;
   a first insulating film over the first circuit; and
   a second circuit over the first insulating film, the second circuit comprising a capacitor and a third transistor electrically connected to each other, wherein the third transistor is positioned over the capacitor,
   wherein the first transistor is a p-channel type transistor,
   wherein the second transistor and the third transistor each comprise an oxide semiconductor in a channel formation region,
   wherein the second circuit is configured to hold a potential, and
   wherein the first circuit is configured to amplify the potential held in the second circuit.

2. The semiconductor device according to claim 1, wherein the oxide semiconductor comprises indium and oxygen.

3. The semiconductor device according to claim 1, wherein the oxide semiconductor comprises indium, zinc, and oxygen.

4. The semiconductor device according to claim 1, wherein the oxide semiconductor comprises indium, gallium, zinc, and oxygen.

5. The semiconductor device according to claim 1, comprising a second insulating film between the first transistor and the second transistor, wherein the second transistor is positioned over the first transistor.

6. The semiconductor device according to claim 1, wherein the first transistor comprises silicon in a channel formation region.

7. The semiconductor device according to claim 1, comprising a semiconductor substrate, wherein the first transistor comprises a channel formation region in the semiconductor substrate.

8. The semiconductor device according to claim 1, wherein the capacitor and the channel formation region of the third transistor overlap with each other.

9. A semiconductor device comprising:
   a first circuit comprising a first transistor and a second transistor electrically connected to each other;
   a first insulating film over the first circuit; and
   a second circuit over the first insulating film, the second circuit comprising a capacitor and a third transistor electrically connected to each other, wherein the third transistor is positioned over the capacitor,
   wherein the first transistor is a p-channel type transistor,
   wherein the second transistor and the third transistor each comprise an oxide semiconductor in a channel formation region,
   wherein the second circuit is configured to store data to function as a memory, and
   wherein the first circuit is configured to amplify a potential of the data stored in the second circuit to function as a sense amplifier of the memory.

10. The semiconductor device according to claim 9, wherein the oxide semiconductor comprises indium and oxygen.

11. The semiconductor device according to claim 9, wherein the oxide semiconductor comprises indium, zinc, and oxygen.

12. The semiconductor device according to claim 9, wherein the oxide semiconductor comprises indium, gallium, zinc, and oxygen.

13. The semiconductor device according to claim 9, comprising a second insulating film between the first transistor and the second transistor, wherein the second transistor is positioned over the first transistor.

14. The semiconductor device according to claim 9, wherein the first transistor comprises silicon in a channel formation region.

15. The semiconductor device according to claim 9, comprising a semiconductor substrate, wherein the first transistor comprises a channel formation region in the semiconductor substrate.

16. The semiconductor device according to claim 9, wherein the capacitor and the channel formation region of the third transistor overlap with each other.

17. A method for manufacturing a semiconductor device, the method comprising:
   forming a wiring electrically connected to a capacitor;
   forming a first insulating film over the wiring;
   forming a first oxide semiconductor film over the first insulating film;
   after forming the first oxide semiconductor film, forming an opening in the first insulating film to expose the wiring;
   after forming the opening, performing a high-density plasma treatment on the first oxide semiconductor film; and
   forming a conductive film in contact with the first oxide semiconductor film and in contact with the wiring via the opening.

18. The method according to claim 17, wherein a portion of the wiring exposed from the first insulating film is oxidized by the high-density plasma treatment.

19. The method according to claim 17, the method comprising:
   forming a second transistor over a second insulating film positioned over a first transistor;
   forming a third insulating film over the second transistor; and
   forming the capacitor over the third insulating film.

20. The method according to claim 19, wherein the second transistor comprises a second oxide semiconductor film.

* * * * *